(12) United States Patent
Kim et al.

(10) Patent No.: US 7,273,812 B2
(45) Date of Patent: Sep. 25, 2007

(54) MICROPROBE TIPS AND METHODS FOR MAKING

(75) Inventors: Kieun Kim, Pasadena, CA (US); Adam L. Cohen, Los Angeles, CA (US); Willa M. Larsen, Reseda, CA (US); Richard T. Chen, Burbank, CA (US); Ananda H. Kumar, Fremont, CA (US); Ezekiel J. J. Kruglick, San Diego, CA (US); Vacit Arat, La Canada Flintridge, CA (US); Gang Zhang, Monterey Park, CA (US); Michael S. Lockard, Lake Elizabeth, CA (US); Christopher A. Bang, San Diego, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 11/178,145

(22) Filed: Jul. 7, 2005

(65) Prior Publication Data

US 2006/0112550 A1 Jun. 1, 2006

Related U.S. Application Data

(63) Continuation-in-part of application No. 11/173,241, filed on Jun. 30, 2005, and a continuation-in-part of (Continued)

(60) Provisional application No. 60/609,719, filed on Sep. 13, 2004, provisional application No. 60/582,690, (Continued)

(51) Int. Cl.
*H01L 21/44* (2006.01)

(52) U.S. Cl. .............................. 438/670; 257/E21.159; 257/E23.108; 438/736

(58) Field of Classification Search ................ 438/689, 438/670, 678, 736; 257/E21.159, E21.523, 257/E23.108
See application file for complete search history.

(56) References Cited

U.S. PATENT DOCUMENTS 3,832,632 A 8/1974 Ardezzone .................. 324/756

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, p. 161.

(Continued)

*Primary Examiner*—Caridad Everhart
(74) *Attorney, Agent, or Firm*—Dennis R. Smalley

(57) ABSTRACT

Embodiments of the present invention are directed to the formation of microprobe tips elements having a variety of configurations. In some embodiments tips are formed from the same building material as the probes themselves, while in other embodiments the tips may be formed from a different material and/or may include a coating material. In some embodiments, the tips are formed before the main portions of the probes and the tips are formed in proximity to or in contact with a temporary substrate. Probe tip patterning may occur in a variety of different ways, including, for example, via molding in patterned holes that have been isotropically or anisotropically etched silicon, via molding in voids formed in exposed photoresist, via molding in voids in a sacrificial material that have formed as a result of the sacrificial material mushrooming over carefully sized and located regions of dielectric material, via isotropic etching of the tip material around carefully sized and placed etching shields, via hot pressing, and the like.

6 Claims, 64 Drawing Sheets

Related U.S. Application Data

(63) application No. 11/029,217, filed on Jan. 3, 2005, and a continuation-in-part of application No. 11/029,169, filed on Jan. 3, 2005, now Pat. No. 7,241,689, and a continuation-in-part of application No. 11/028,962, filed on Jan. 3, 2005, and a continuation-in-part of application No. 11/028,958, filed on Jan. 3, 2005, and a continuation-in-part of application No. 11/028,945, filed on Jan. 3, 2005, and a continuation-in-part of application No. 11/029,221, filed on Jan. 3, 2005, and a continuation-in-part of application No. 11/028,960, filed on Jan. 3, 2005, and a continuation-in-part of application No. 10/434,493, filed on May 7, 2003, said application No. 11/028,958 is a continuation-in-part of application No. 10/949,738, filed on Sep. 24, 2004, and a continuation-in-part of application No. 10/772,943, filed on Feb. 4, 2004, now abandoned, and a continuation-in-part of application No. 10/434,493, filed on May 7, 2003, said application No. 10/949,738 is a continuation-in-part of application No. 10/772,943, filed on Feb. 4, 2004, now abandoned, said application No. 11/029,217 is a continuation-in-part of application No. 10/949,738, filed on Sep. 24, 2004, said application No. 11/029,169 is a continuation-in-part of application No. 10/949,738, filed on Sep. 24, 2004, said application No. 11/028,962 is a continuation-in-part of application No. 10/949,738, filed on Sep. 24, 2004, said application No. 11/029,221 is a continuation-in-part of application No. 10/949,738, filed on Sep. 24, 2004, said application No. 11/028,960 is a continuation-in-part of application No. 10/949,738, filed on Sep. 24, 2004.

(60) filed on Jun. 23, 2004, provisional application No. 60/582,689, filed on Jun. 23, 2004, provisional application No. 60/574,737, filed on May 26, 2004, provisional application No. 60/540,511, filed on Jan. 29, 2004, provisional application No. 60/540,510, filed on Jan. 29, 2004, provisional application No. 60/536,865, filed on Jan. 15, 2004, provisional application No. 60/533,947, filed on Dec. 31, 2003, provisional application No. 60/533,933, filed on Dec. 31, 2003, provisional application No. 60/533,975, filed on Dec. 31, 2003, provisional application No. 60/533,948, filed on Dec. 31, 2003, provisional application No. 60/533,897, filed on Dec. 31, 2003, provisional application No. 60/506,015, filed on Sep. 24, 2003, provisional application No. 60/445,186, filed on Feb. 4, 2003, provisional application No. 60/442,656, filed on Jan. 23, 2003, provisional application No. 60/379,177, filed on May 7, 2002.

(56) References Cited

U.S. PATENT DOCUMENTS

| | | | |
|---|---|---|---|
| 4,955,523 A | 9/1990 | Carlommagno et al. | 228/180.5 |
| 4,961,052 A | 10/1990 | Tada et al. | 324/158 |
| 5,020,219 A | 6/1991 | Leedy | 29/846 |
| 5,070,297 A | 12/1991 | Kwon et al. | 324/158 |
| 5,177,438 A | 1/1993 | Littlebury et al. | 324/754 |
| 5,189,507 A | 2/1993 | Carlomagno et al. | 257/777 |
| 5,190,637 A | 3/1993 | Guckel | 205/118 |
| 5,354,712 A | 10/1994 | Ho et al. | 438/643 |
| 5,476,211 A | 12/1995 | Khandros | 228/180.5 |
| 5,476,818 A | 12/1995 | Yanof et al. | 29/832 |
| 5,513,430 A | 5/1996 | Yanof et al. | 29/846 |
| 5,772,451 A | 6/1998 | Dozier et al. | 439/70 |
| 5,806,181 A | 9/1998 | Khandros et al. | 29/874 |
| 5,820,014 A | 10/1998 | Dozier et al. | 228/56.3 |
| 5,829,128 A | 11/1998 | Eldridge et al. | 29/855 |
| 5,864,946 A | 2/1999 | Eldridge et al. | 29/843 |
| 5,917,707 A | 6/1999 | Khandros et al. | 361/776 |
| 5,974,662 A | 11/1999 | Eldridge et al. | 29/842 |
| 5,994,152 A | 11/1999 | Khandros et al. | 29/842 |
| 6,023,103 A | 2/2000 | Chang et al. | 257/781 |
| 6,027,630 A | 2/2000 | Cohen | 205/135 |
| 6,043,563 A | 3/2000 | Eldridge et al. | 257/784 |
| 6,044,548 A | 4/2000 | Distefano et al. | 29/840 |
| 6,064,213 A | 5/2000 | Khandros et al. | 324/754 |
| 6,184,053 B1 | 2/2001 | Eldridge et al. | 438/52 |
| 6,208,225 B1 | 3/2001 | Miller | 333/202 |
| 6,218,910 B1 | 4/2001 | Miller | 333/33 |
| 6,255,126 B1 | 7/2001 | Mathieu et al. | 438/15 |
| 6,264,477 B1 | 7/2001 | Smith et al. | 439/66 |
| 6,268,015 B1 | 7/2001 | Mathieu et al. | 427/96 |
| 6,336,269 B1 | 1/2002 | Eldridge et al. | 29/885 |
| 6,441,315 B1 | 8/2002 | Eldridge et al. | 174/260 |
| 6,456,099 B1 | 9/2002 | Eldridge et al. | 324/754 |
| 6,482,013 B2 | 11/2002 | Eldridge et al. | 439/66 |
| 6,483,328 B1 | 11/2002 | Eldridge et al. | 324/754 |
| 6,491,968 B1 | 12/2002 | Mathieu et al. | 29/842 |
| 6,499,216 B1 | 12/2002 | Fjelstad | 29/842 |
| 6,509,751 B1 | 1/2003 | Mathieu et al. | 324/754 |
| 6,520,778 B1 | 2/2003 | Eldridge et al. | 439/66 |
| 6,539,531 B2 | 3/2003 | Miller et al. | 716/15 |
| 6,624,648 B2 | 9/2003 | Eldridge et al. | 324/761 |
| 6,627,483 B2 | 9/2003 | Ondricek et al. | 438/117 |
| 6,640,415 B2 | 11/2003 | Eslamy et al. | 29/593 |
| 6,651,325 B2 | 11/2003 | Lee et al. | 29/846 |
| 6,672,875 B1 | 1/2004 | Mathieu et al. | 439/66 |
| 6,690,185 B1 | 2/2004 | Khandros et al. | 324/758 |
| 6,690,186 B2 | 2/2004 | Fjelstad | 324/762 |
| 6,705,876 B2 | 3/2004 | Eldridge | 439/66 |
| 6,713,374 B2 | 3/2004 | Eldridge et al. | 438/611 |
| 6,729,019 B2 | 5/2004 | Grube et al. | 29/830 |
| 6,817,052 B2 | 11/2004 | Grube | 15/3 |
| 6,838,893 B2 | 1/2005 | Khandros, Jr. et al. | 324/754 |
| 6,948,940 B2 | 9/2005 | Lindsey et al. | 439/66 |
| 7,086,149 B2 | 8/2006 | Eldridge et al. | 29/876 |
| 2002/0053734 A1 | 5/2002 | Eldridge et al. | 257/724 |
| 2003/0186405 A1* | 10/2003 | Lee et al. | 435/182 |
| 2004/0007470 A1 | 1/2004 | Smalley | 205/109 |
| 2004/0068869 A1* | 4/2004 | Eldridge et al. | 29/854 |
| 2004/0072452 A1* | 4/2004 | Eldridge et al. | 439/69 |
| 2004/0072456 A1* | 4/2004 | Dozier et al. | 439/83 |
| 2005/0029225 A1 | 2/2005 | Zhang | 216/40 |
| 2005/0045585 A1 | 3/2005 | Zhang et al. | 216/58 |
| 2005/0142846 A1 | 6/2005 | Frodis et al. | 438/622 |
| 2005/0148214 A1* | 7/2005 | Mathieu et al. | 439/67 |
| 2005/0179458 A1 | 8/2005 | Chen et al. | 324/762 |
| 2005/0184748 A1 | 8/2005 | Chen et al. | 324/761 |
| 2006/0006888 A1 | 1/2006 | Kruglick et al. | 324/754 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 1999, p. 244.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

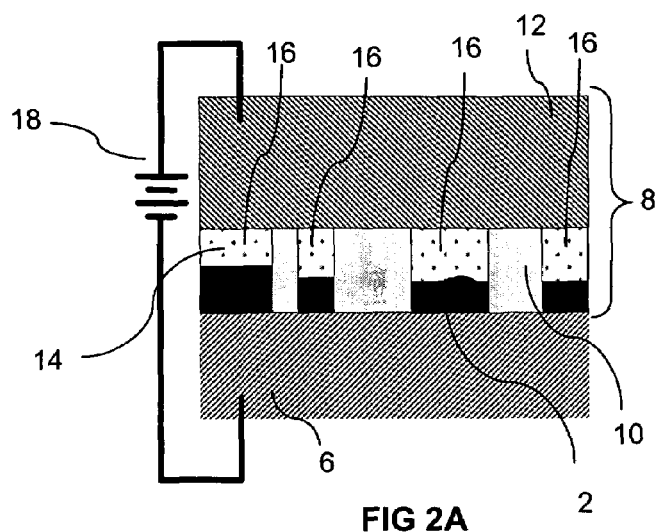
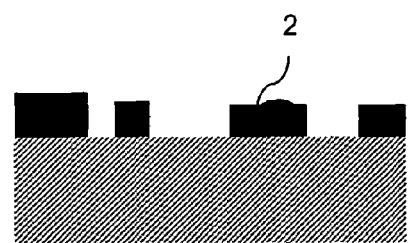
FIG 2A
FIG 2B
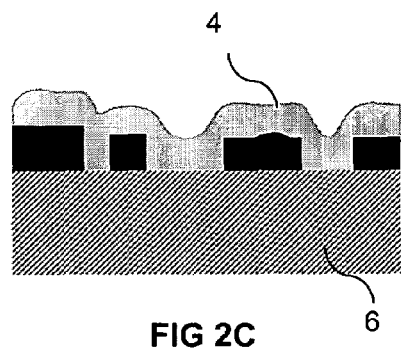
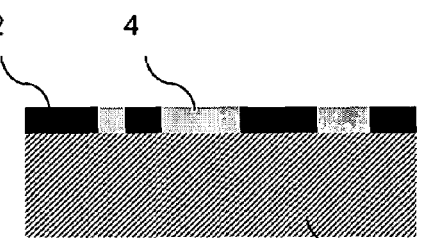
FIG 2C
FIG 2D
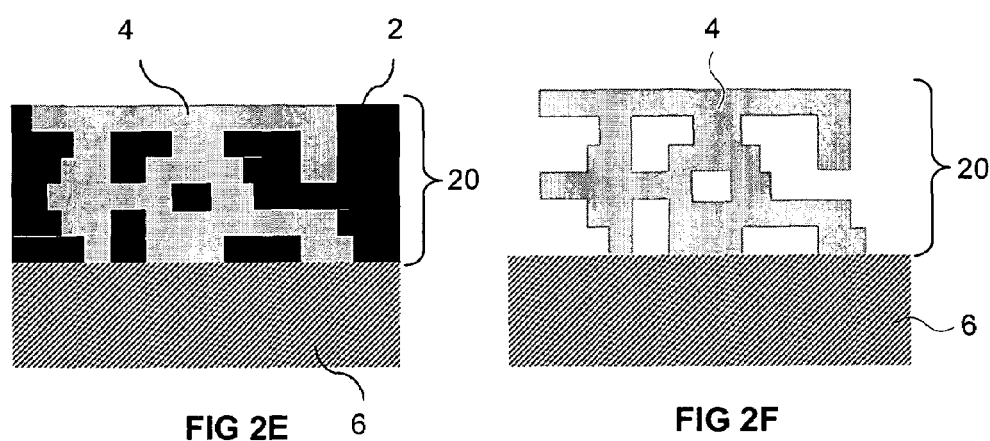
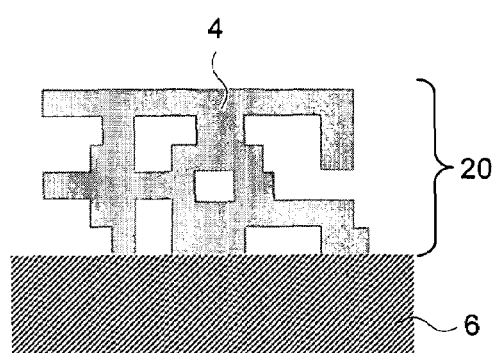
FIG 2E
FIG 2F

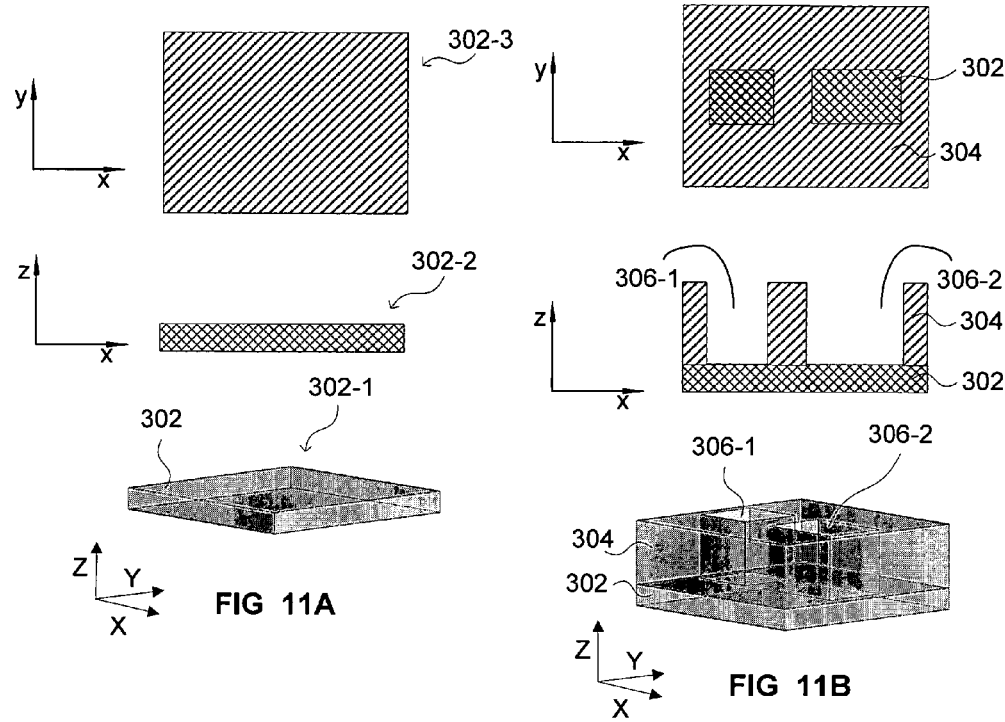
FIG 11A
FIG 11B
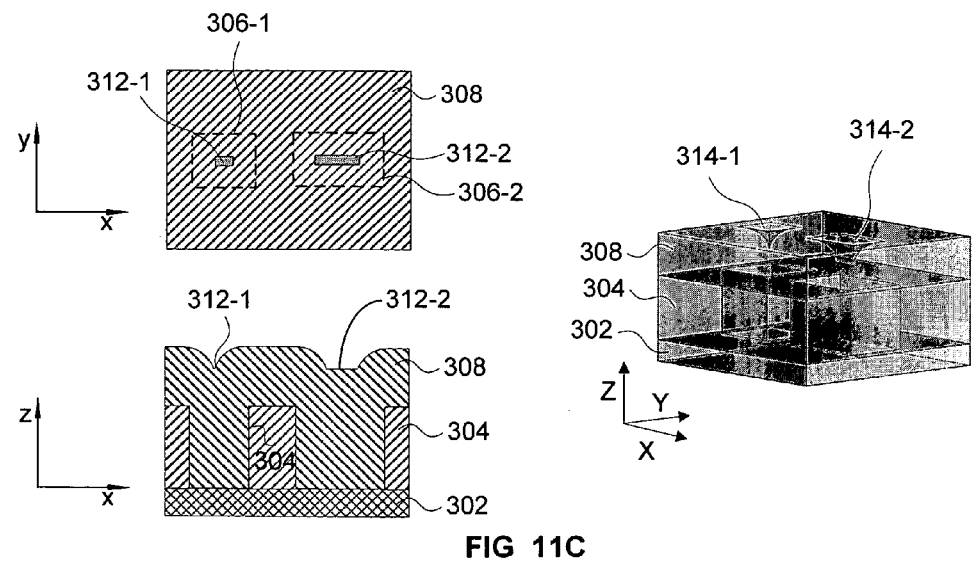
FIG 11C

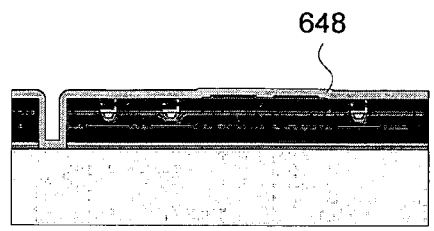
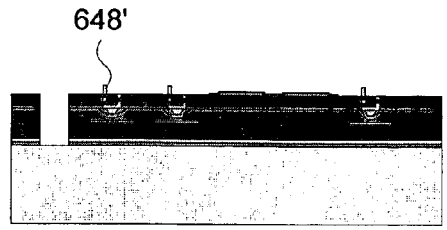
FIG 24M     FIG 24N
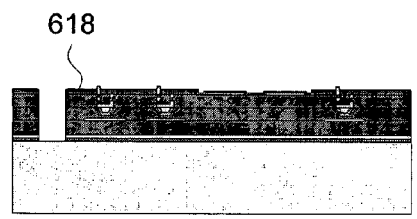
FIG 24O     FIG 24P
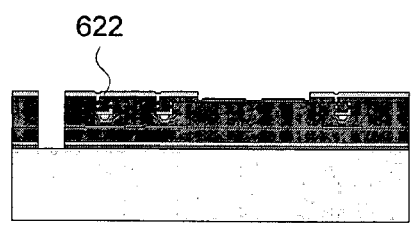
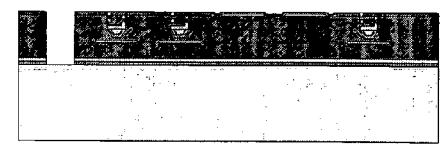
FIG 24Q     FIG 24R

MICROPROBE TIPS AND METHODS FOR MAKING

RELATED APPLICATIONS

This application is a continuation-in-part of U.S. patent application Ser. No. 11/173,241, filed Jun. 30, 2005; Ser. No. 11/029,217, filed Jan. 3, 2005; Ser. No. 11/029,169, filed Jan. 3, 2005 now U.S. Pat. No. 7,241,689; Ser. No. 11/028,962 filed Jan. 3, 2005; Ser. No. 11/028,958, filed Jan. 3, 2005; Ser. No. 10/434,493, filed May 7, 2003; Ser. No. 11/028,945, filed Jan. 3, 2005; Ser. No. 11/029,221, filed Jan. 3, 2005; and Ser. No. 11/028,960, filed Jan. 3, 2005. The '958 application in turn claims benefit of U.S. App. Nos. 60/533,947, filed Dec. 31, 2003; 60/533,933, filed Dec. 31, 2003; 60/536,865, filed Jan. 15, 2004; and 60/540,511, filed Jan. 29, 2004 and is a continuation in part of U.S. application Ser. No. 10/772,943, filed Feb. 4, 2004 now abandoned; Ser. No. 10/949,738, filed Sep. 24, 2004; and Ser. No. 10/434,493, filed May 7, 2003. The '738 application claims benefit of U.S. App. Nos.: 60/506,015, filed Sep. 24, 2003; 60/533,933, filed Dec. 31, 2003; and 60/536,865, filed Jan. 15, 2004. Furthermore the '738 application is a CIP of U.S. application Ser. No. 10/772,943, filed Feb. 4, 2004 now abandoned, which in turn claims benefit to U.S. App. Nos.: 60/445,186, filed Feb. 4, 2003; 60/506,015, filed Sep. 24, 2003; 60/533,933, filed Dec. 31, 2003; and 60/536,865, filed Jan. 15, 2004. The '493 application claims benefit of U.S. App. Nos. 60/379,177, filed May 7, 2002, and 60/442,656, filed Jan. 23, 2003. The '217, '169, and '962 applications claim benefit of U.S. App. Nos. 60/533,975, filed Dec. 31, 2003; 60/540,510, filed Jan. 29, 2004; 60/533,933, filed Dec. 31, 2003; 60/536,865, filed Jan. 15, 2004; and 60/540,511, filed Jan. 29, 2004, and is a continuation in part of U.S. application Ser. No. 10/949,738, filed Sep. 24, 2004. The '945 application claims benefit of U.S. Provisional Patent Application Nos. 60/533,948, filed Dec. 31, 2003; and 60/574,737, filed May 26, 2003. The '221 application claims benefit to U.S. App. Nos. 60/533,897, filed Dec. 31, 2003; 60/533,975, 60/533,947, filed Dec. 31, 2003; and 60/533,948, filed Dec. 31, 2003; and to 60/540,510, filed Jan. 29, 2004; and is a CIP of U.S. patent application Ser. No. 10/949,738, filed Sep. 24, 2004. The '960 application claims benefit of U.S. App. Nos. 60/582,689, filed Jun. 23, 2004; 60/582,690, filed Jun. 23, 2004; 60/609,719, filed Sep. 13, 2004; 60/611,789, filed Sep. 20, 2004; 60/540,511, filed Jan. 29, 2004; 60/533,933, filed Dec. 31, 2003; 60/536,865, filed Jan. 15, 2004 and 60/533,947, filed Dec. 31, 2003 and is a CIP of Ser. No. 10/949,738, filed Sep. 24, 2004. Each of the above applications is incorporated herein by reference as if set forth in full herein.

FIELD OF THE INVENTION

The present invention relates generally to microprobes (e.g. compliant contact elements) and EFAB™ type electrochemical fabrication processes for making them and more particularly to microprobe tips designs and process for making them

BACKGROUND

Electrochemical Fabrication:

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen®) Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, and/or more independence between geometric configuration and the selected fabrication process. A need also exists in the field of miniature (i.e. mesoscale and microscale) device fabrication for improved fabrication methods and apparatus.

A need also exists in the electrochemical fabrication field for enhanced techniques that supplement those already known in the field to allow even greater versatility in device design, improved selection of materials, improved material properties, more cost effective and less risky production of such devices, and the like.

Electrical Contact Element Designs, Assembly, and Fabrication:

Compliant electrical contact elements (e.g. probes) can be used to make permanent or temporary electrical contact between electronic components. For example such contacts may be used to convey electrical signals between printed circuit boards, between space transformers and semiconductor devices under test, from probe cards to space transformers via an interposer, between sockets and semiconductors or other electrical/electronic components mounted thereto, and the like.

Various techniques for forming electrical contact elements, various designs for such contact element, and various assemblies using such elements have been taught previously. Examples of such teachings may be found in U.S. Patent Nos. Examples of such teachings may be found in U.S. Pat. Nos. 5,476,211; 5,917,707; 6,336,269; 5,772,451; 5,974,662; 5,829,128; 5,820,014; 6,023,103; 6,064,213; 5,994,152; 5,806,181; 6,482,013; 6,184,053; 6,043,563; 6,520,778; 6,838,893; 6,705,876; 6,441,315; 6,690,185; 6,483,328; 6,268,015; 6,456,099; 6,208,225; 6,218,910; 6,627,483; 6,640,415; 6,713,374; 6,672,875; 6,509,751; 6,539,531; 6,729,019; and 6,817,052. Each of these patents is incorporated herein by reference as if set forth in full. Various teachings set forth explicitly in this application may be supplemented by teachings set forth in these incorporated applications to define enhanced embodiments and aspects of the invention.

SUMMARY OF THE INVENTION

It is an object of some aspects of the invention to provide an electrochemical fabrication technique capable of fabricating improved microprobe tips.

It is an object of some aspects of the invention to provide an electrochemical fabrication technique capable of fabricating improved microprobes and microprobe tips.

It is an object of some aspects of the invention to provide an improved electrochemical fabrication technique capable of fabricating microprobe tips.

It is an object of some aspects of the invention to provide an improved electrochemical fabrication technique capable of fabricating microprobes and microprobe tips.

Other objects and advantages of various aspects of the invention will be apparent to those of skill in the art upon review of the teachings herein. The various aspects of the invention, set forth explicitly herein or otherwise ascertained from the teachings herein, may address one or more of the above objects alone or in combination, or alternatively may address some other object of the invention ascertained from the teachings herein. It is not necessarily intended that all objects set forth above be addressed by any single aspect of the invention even though that may be the case with regard to some aspects.

In a first aspect of the invention, a method for creating a contact structure, comprising: forming a contact tip having a desired configuration; forming compliant probe structure electrochemically; and adhering the contact tip to the probe structure to form a contact structure.

In a second aspect of the invention, a method for creating a contact structure, comprising: forming a contact tip having a desired configuration; forming compliant probe structure from a plurality of adhered layers of electrodeposited material; and adhering the contact tip to the probe structure to form a contact structure.

In a third aspect of the invention, a method for creating a contact structure, comprising: forming a contact tip having a desired configuration; and forming compliant probe structure electrochemically, wherein the compliant probe structure is formed on the contact tip.

In a fourth aspect of the invention, a method for creating a contact structure, comprising: forming a contact tip having a desired configuration; and forming compliant probe structure from a plurality of adhered layers of electrodeposited material, wherein the compliant probe structure is formed on the contact tip.

In a fifth aspect of the invention, a method for creating a contact structure, comprising: forming compliant probe structure electrochemically; and forming a contact tip having a desired configuration, wherein the contact tip is formed on the compliant probe structure.

In a sixth aspect of the invention, a method for creating a contact structure, comprising: forming compliant probe structure from a plurality of adhered layers of electrodeposited material; and forming a contact tip having a desired configuration, wherein the contact tip is formed on the compliant probe structure.

Further aspects of the invention will be understood by those of skill in the art upon reviewing the teachings herein. Other aspects of the invention may involve combinations of the above noted aspects of the invention. Other aspects of the invention may involve apparatus that can be used in implementing one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 2A-2F schematically depict side views of various stages of an electrochemical fabrication process as applied to the formation of a particular structure where a sacrificial material is selectively deposited while a structural material is blanket deposited.

FIGS. 11A-11F schematically depict partially transparent, perspective views, side views (along a central cut plane), and top views at each of various stages in an example of a process for forming an array of probe tips according to a seventh embodiment of the invention where the probe tips are formed using a mold formed from a patterned deposition that forms multiple voids (one per tip) followed by a blanket deposition that narrows the voids and gives them a desired shape.

DETAILED DESCRIPTION OF PREFERRED EMBODIMENTS OF THE INVENTION

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
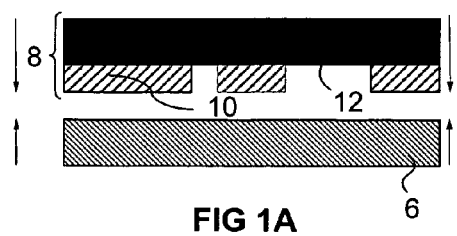
FIGS. 1A-1C schematically depict side views of various stages of a CC mask plating process, while FIGS. 1D-1G schematically depict a side views of various stages of a CC mask plating process using a different type of CC mask.
Figure 1B:
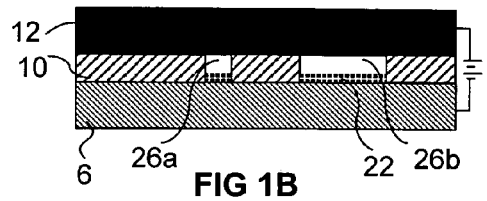
Figure 1C:
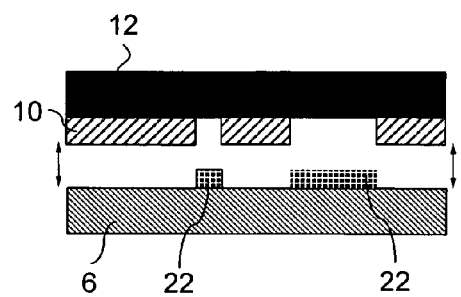
Figure 1D:
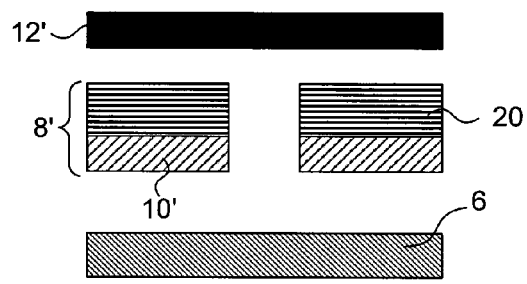
Figure 1E:
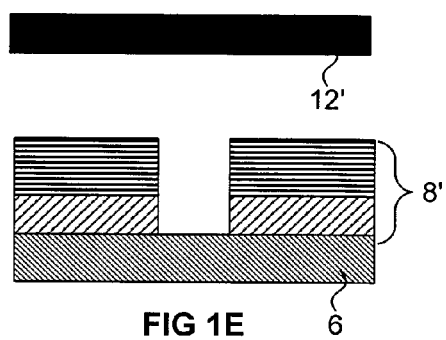
Figure 1F:
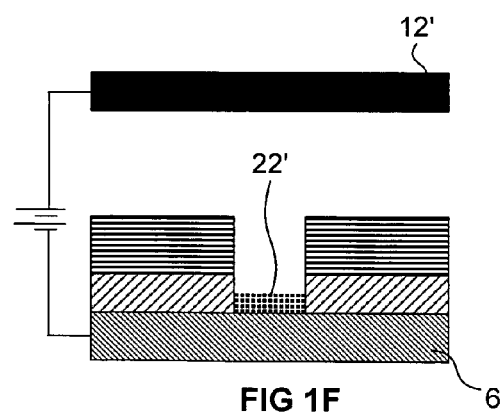
Figure 1G:
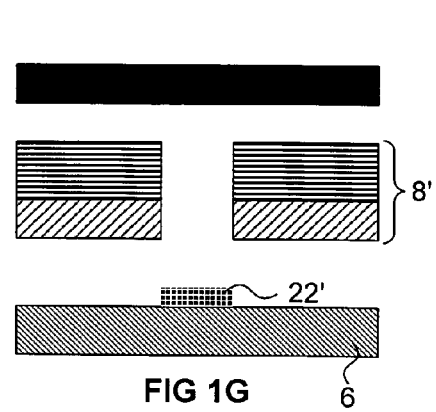
Figure 3A:
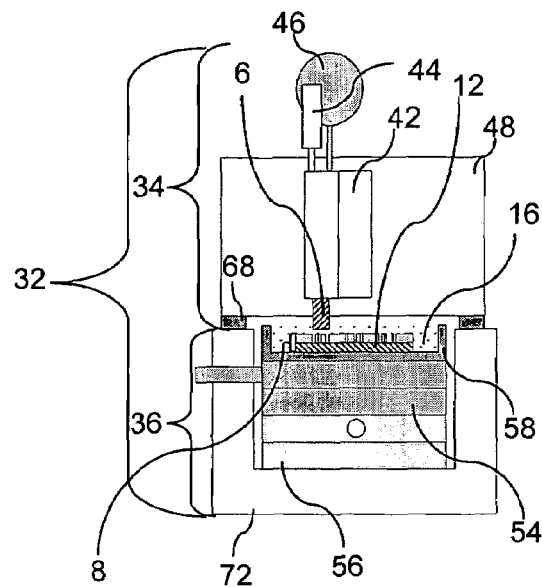
FIGS. 3A-3C schematically depict side views of various example subassemblies that may be used in manually implementing the electrochemical fabrication method depicted in FIGS. 2A-2F.
Figure 3B:
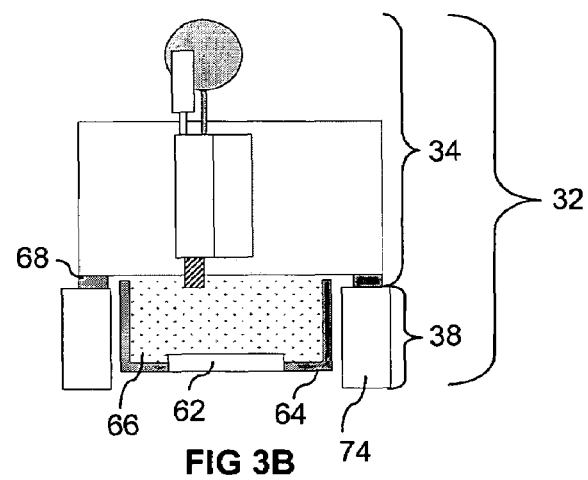
Figure 3C:
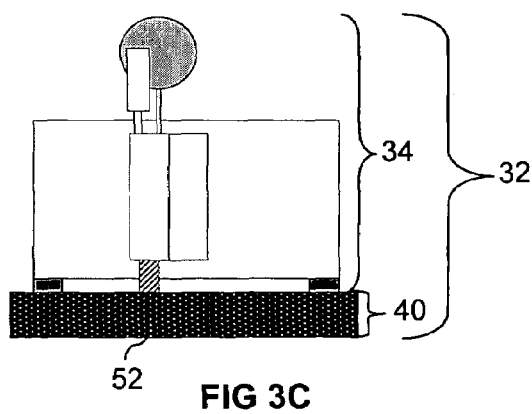
Figure 4A:
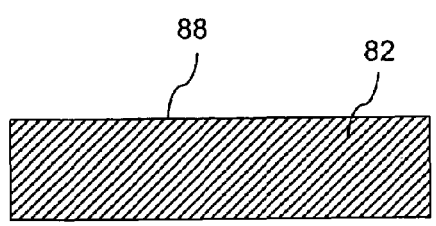
FIGS. 4A-4I schematically depict the formation of a first layer of a structure using adhered mask plating where the blanket deposition of a second material overlays both the openings between deposition locations of a first material and the first material itself.
Figure 4B:
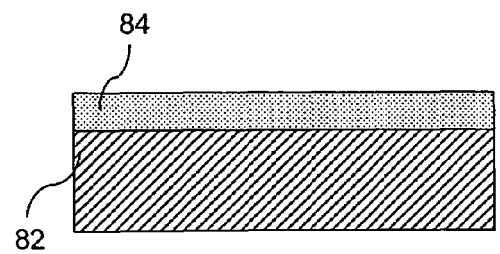
Figure 4C:
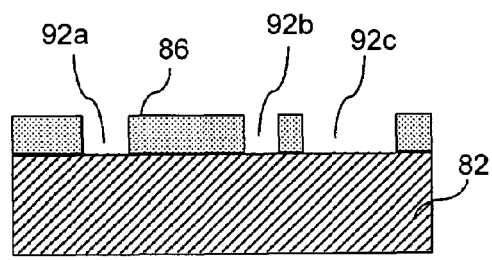
Figure 4D:
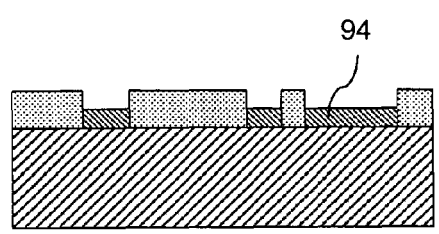
Figure 4E:
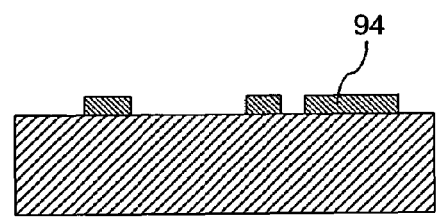
Figure 4F:
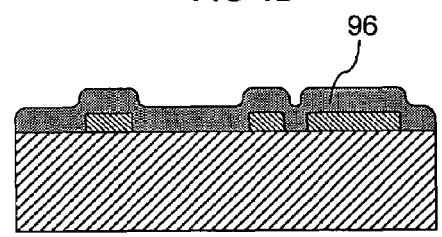
Figure 4G:
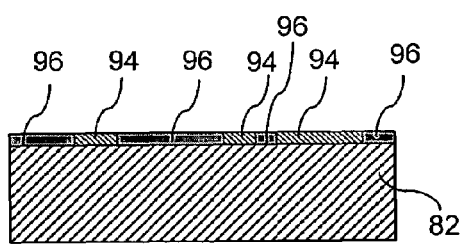
Figure 4H:
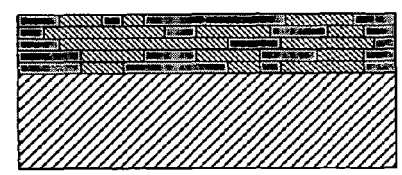
Figure 4I:
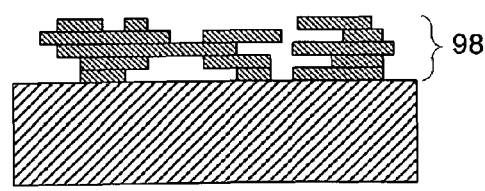

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(*a*)-92(*c*) extending from a surface 86 of the photoresist through the thickness of the photoresist to surface 88 of the substrate 82. In FIG. 4D, a metal 94 (e.g. nickel) is shown as having been electroplated into the openings 92(*a*)-92(*c*). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3D structure 98 (e.g. component or device).

Various embodiments of various aspects of the invention are directed to formation of three-dimensional structures from materials some of which may be electrodeposited or electroless deposited. Some of these structures may be formed form a single layer of one or more deposited materials while others are formed from a plurality of layers of deposited materials (e.g. 2 or more layers, more preferably five or more layers, and most preferably ten or more layers). In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable.

The various embodiments, alternatives, and techniques disclosed herein may form multi-layer structures using a single patterning technique on all layers or using different patterning techniques on different layers. For example, Various embodiments of the invention may perform selective patterning operations using conformable contact masks and masking operations, proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Adhered mask may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels. Such use of selective etching and interlaced material deposited in association with multiple layers is described in U.S. patent application Ser. No. 10/434,519, by Smalley, and entitled "Methods of and Apparatus for Electrochemically Fabricating Structures Via Interlaced Layers or Via Selective Etching and Filling of Voids" which is hereby incorporated herein by reference as if set forth in full.

FIGS. 5A-5J schematically depict side views at various stages in an example of the process for forming an array of probe elements according to a first embodiment of the invention where the probe element tips are formed via electroplating onto a seed layer coated epoxy template which was molded from a silicon wafer that underwent patterned anisotropic etching.

Figure 5A:
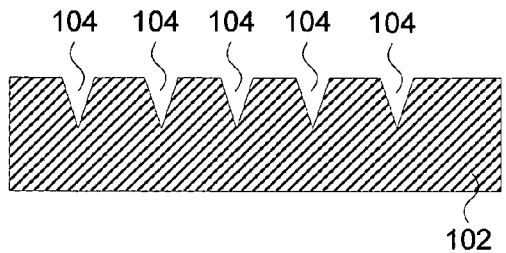
FIGS. 5A-5J schematically depict side views at various stages in an example of a process for forming an array of probe elements according to a first embodiment of the invention where the probe element tips are formed via electroplating onto a seed layer coated epoxy template which was molded from a silicon wafer that underwent patterned anisotropic etching.

FIG. 5A depicts the state of the process after a patterned silicon wafer 102 is supplied. The silicon wafer has been patterned by placing a mask over its surface and patterning the mask to have openings in regions that correspond to desired probe tip locations. While the mask is in place an isotropic etching is preformed to create V-shaped or conically shaped holes 104 in the silicon.

Figure 5B:
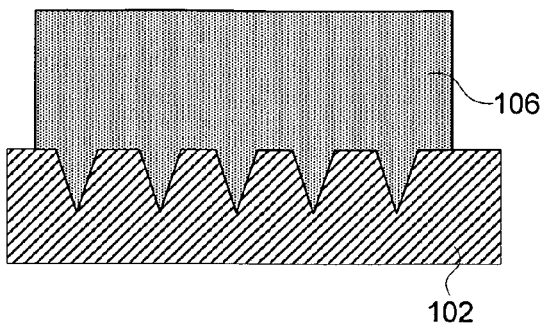

In alternative embodiments these openings may take the form of V-shaped trenches where it is desired that probe tips take such a form. The openings 104 in silicon 102 correspond to desired probe tip locations and represent the compliment of the probe tip shape. After the patterned silicon is obtained a casting material 106, such as an epoxy is molded over the patterned surface of the silicon as illustrated in FIG. 5B.

Figure 5C:
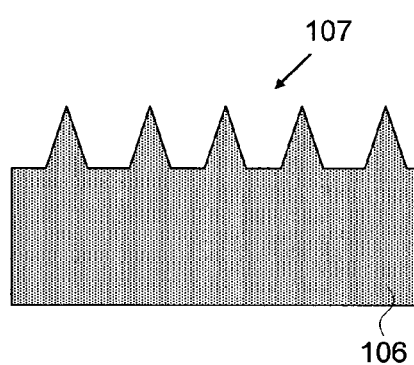

Next the molded inverted replica 107 formed of casting material 106 is separated from the silicon as shown in FIG. 5C.

Figure 5D:
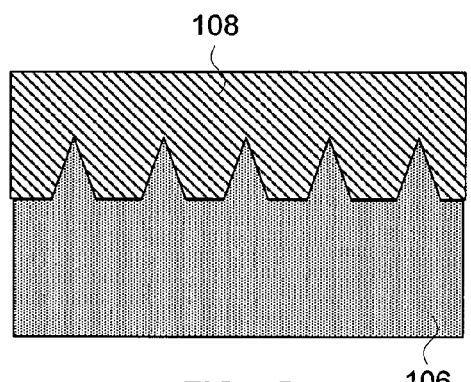

FIG. 5D depicts the state of the process after electrode-positing and planarizing of a sacrificial material 108 over the patterned surface of the replica. The sacrificial material 108 may be, for example, copper. Depending on the conductive or dielectric nature of the material forming replica 107, it may be necessary to form a seed layer or plating base on the surface of material 106 prior to electroplating. Such a seed layer may take the form of sputtered titanium or chromium over which a sputtered seed layer material may be located in preparation for electroplating.

Figure 5E:
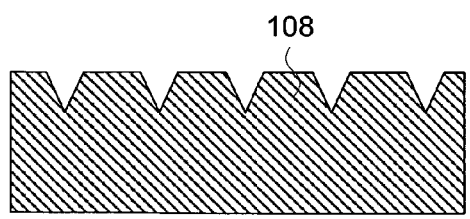

FIG. 5E depicts the state of the process after electroplated material 108 is separated from replica 107.

Figure 5F:
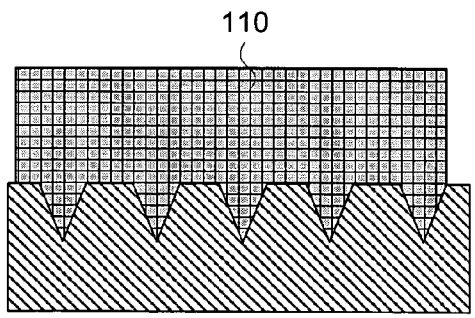

FIG. 5F depicts the state of the process after a desired tip material 110 is plated over the patterned surface of the sacrificial material 108.

Figure 5G:
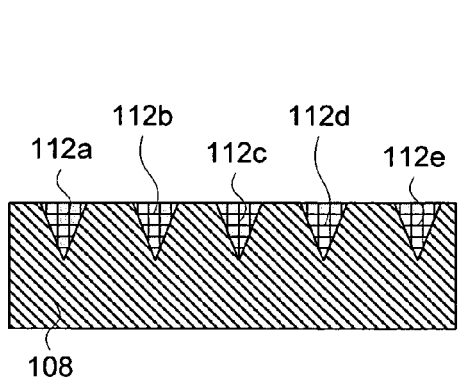

Next as indicated in FIG. 5G, the tip material 110 and sacrificial material 108 are planarized to a level that causes individual tips 112a-112e to become separated from one another.

Figure 5H:
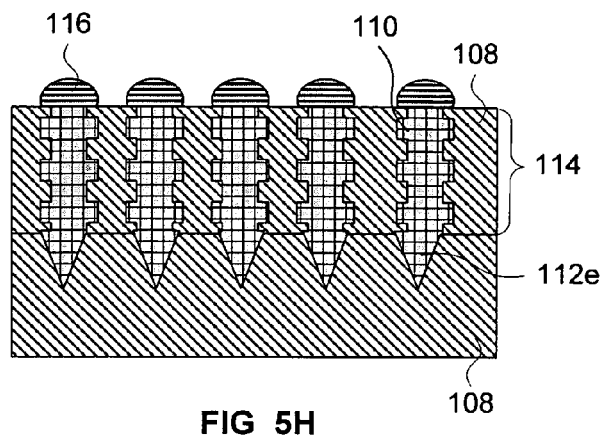

FIG. 5H depicts the state of the process after multiple layers of structure 114 have been formed where each layer consists of regions of sacrificial material 108 and regions of structural material 110. The structural material 110 is patterned so that upon separation from the sacrificial material 108 the probe structures that result will have desired properties (e.g. travel, elasticity, spring constant, and the like). Also as shown in FIG. 5H a bonding material 116 is shown as having been selectively applied to exposed regions of conductive material 110 associated with each probe element. Material 116 may be applied in a variety of manners such as, for example, electroplating via openings in a masking material. Material 116 may, for example, be a low melting point metal such as tin, lead, a tin lead alloy, or other solder-like material. After depositing the adhesion material it may be reflowed to give it a ball like configuration as shown in FIG. 5H. Before or after application of the adhesion or bump material dicing of probe elements into desired groups may occur where the groups represent discrete quantities and patterns of probes that may be used in a desired application.

Figure 5I:
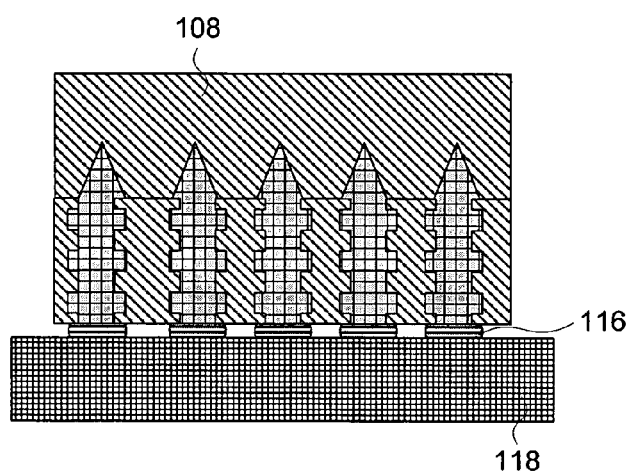

FIG. 5I depicts the state of the process after the probe structures have been flipped over and adhered to a substrate 118 via bumps or adhesion material 116. Substrate 118 may, for example, be a space transformer or intermediate structure containing a desired network of conductive leads.

Figure 5J:
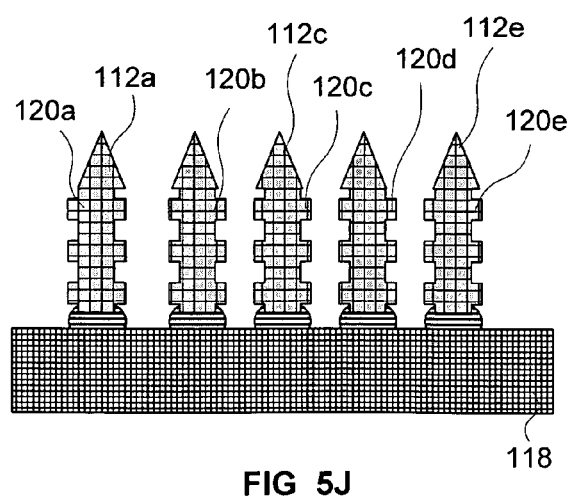

FIG. 5J depicts the state of the process after sacrificial material 108 has been removed resulting in probes 120a-120e being independently contacted and mounted to substrate 118. The layer-by-layer built up portions of probes 120a-120e as depicted are not intended to illustrate any particular probe features or design configurations but instead are intended to show the existence of an elongated structure extending from substrate 118 to tips 112a-112e.

The probes formed may take on a variety of configurations, some of which are described in U.S. patent application Ser. No. 60/533,933, which was filed Dec. 31, 2003 by Arat et al, and which is entitled "Electrochemically Fabricated Microprobes"; U.S. patent application Ser. No. 10/949,738, filed Sep. 24, 2004 by Kruglick et al., and which is entitled "Electrochemically Fabricated Microprobes"; U.S. Patent Application No. 60/641,341, filed Jan. 3, 2005 by Chen, et al., and which is entitled "Electrochemically Fabricated Microprobes"; and U.S. patent application Ser. No. 11/029,180, filed Jan. 3, 2005 by Chen, et al., and which is entitled "Pin-Type Probes for Contacting Electronic Circuits and Methods for Making Such Probes"; and U.S. patent application Ser. No. 11/028,960, filed Jan. 3, 2005 by Chen, et al., and which is entitled "Cantilever Microprobes For Contacting Electronic Components and Methods for Making Such Probes". Each of these applications is incorporated herein by reference as if set forth in full.

Further details about probe formation, formation of bonding material and transfer of probes to permanent substrates are supplied in U.S. patent application No. _____, filed Jun. 30, 2005, under Microfabrica Docket No. P-US137-A-MF, by Kumar et al., and entitled "Probe Arrays and Method for Making". This referenced application is hereby incorporated herein by reference as if set forth in full herein.

In summary, the primary elements of the first embodiment include: (1) An isotropic etching of desired probe tip configurations into silicon via a patterned mask. (2) Casting a complimentary replica of the openings that were formed in the silicon. The casting material may be, for example, an insulative or conductive epoxy material. Prior to casting the silicon surface may be treated with an appropriate release agent to aid in separating the wafer and the replicated pattern. (3) Separating the replica and the silicon wafer. (4) If the surface of the replica is not conductive or plate-able, applying a seed layer to the patterned surface of the replica. If necessary prior to applying a seed layer material, an adhesion layer material may be applied. The application of either or both of these materials may occur via a physical deposition process, such as sputtering, a chemical vapor deposition process, an electroless deposition process, and or a direct metallization process. The adhesion layer material may be, for example, titanium, chromium, a titanium-tungsten alloy, or the like. The seed layer material itself may be, for example, copper, nickel, or any other material that may be applied to the adhesion layer material onto which subsequent plating may occur. (5) Electroplating a sacrificial material to a desired height which may be as great as, and more preferably greater than, the height of the patterned protrusions on the replica. The sacrificial material may, for example, be copper or some other material that is readily separable from a structural material that the probe tips and rest of the probe elements will be made from. (6) Optionally planarizing a back surface of the sacrificial material so as to give the sacrificial material (i.e. the surface opposite the protrusions formed from the replica) to form a reference surface that will be useful in performing subsequent operations. Alternatively a casting operation or the like, alone or in combination with a planarization operation, may be used to give the sacrificial material a desired reference surface. (7) Separating the sacrificial material from the replica. (8) Blanket plating a desired tip metal onto the patterned surface of the sacrificial material to a desired height (e.g. sufficient to fill the voids in the surface or to form a coating of desired thickness which may retain a void which may be filled with a back fill material. (9) Planarizing the tip material and the sacrificial material so that the tip metal separately fills each void in the sacrificial material without bridging the individual tip regions. (10) Performing a multi-layer electrochemical fabrication process, or the like, so as to build up probe elements from a plurality of adhered layers of structural material, where each layer includes structural material in desired locations and sacrificial material in the remaining locations. (11) After formation of all layers, locating an adhesion material or bonding material on the structural material for each probe element. This adhesion or bonding material may take, for example, the form of a low temperature metal such as tin, tin-lead or other solder like material. In other embodiments, it may take the form of a gold pad that will eventually be used in a gold-gold bond. The selective application of the bonding material may occur in a variety of ways. For example, it may occur via a masking and selective plating operation, followed by removal of the masking material, and potentially followed by the reflowing of the deposited material to give it, a rounded configuration over each probe element. (12) Optionally, dicing the structure into smaller groupings of probe elements having desired configurations in preparation for locating them on desired locations of substrates such as space transformers or probe chip structures or the like. (13) Using a flip chip process, or the like, to bond the probe elements to the substrate using the bonding or adhesion material, e.g. group-by-group. (14) Removing the sacrificial material by etching to release and separate the individual probe elements that have been mounted to the substrate.

In some alternative embodiments the above outlined process may be used to produce single probe elements. In some variations of the above embodiment, master patterns may be made from other selective patterned materials and probe tip configurations may take on other shapes. In other alternative embodiments, deposition of sacrificial material, structural material, and/or bonding material may be performed by non-electroplating processes (e.g. electroless deposition, PVD, CVD, spray metal deposition, deposition via ink jet, or the like. In still other embodiments, the order of bonding to a permanent substrate, the removal of a temporary substrate (e.g. the substrate on which the tips and probes were formed), and the order of separation of structural and sacrificial material may be varied. In other embodiments, more than one sacrificial material may be used and/or more than one structural material may be used. In still other embodiments, other modifications may be made as will be apparent to those of skill in the art upon review of the teachings herein.

FIGS. 6A-6J schematically depict side views at various stages in an example of a process for forming an array of probe elements according to a second embodiment of the invention which is similar to the first embodiment of the invention with the exception that the probe element tips are formed from a different material than that used for the main body of the probe elements.

Figures 6A, 6B:
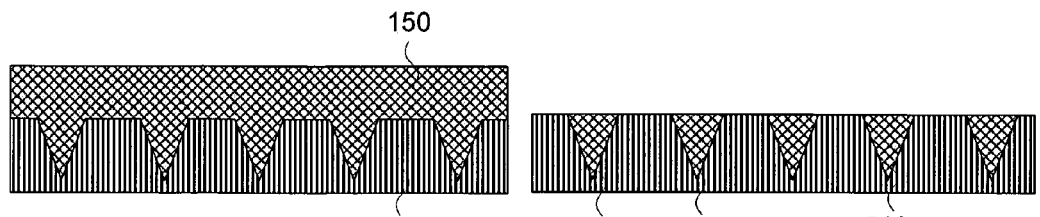
FIGS. 6A-6E schematically depict side views at various stages in an example of a process for forming an array of probe elements according to a second embodiment of the invention which is similar to the first embodiment of the invention with the exception that the probe element tips are formed from a different material than that used for the main body of the probe elements.

FIG. 6A depicts the state of the process after a tip material 150 is deposited into a sacrificial molding material 152. If sacrificial mold material 152 is not conductive or plate-able and if the tip material is to be electrodeposited, a seed layer and potentially an adhesion layer may be formed on mold surface prior to plating material 150. In variations of this embodiment, material 150 may be located on the patterned surface of material 152 using a process other then electroplating.

FIG. 6B depicts the state of the process after tip material 150 and mold material 152 have been planarized to make tip elements 150a-150e independent of one another by removing any bridging material 150 that connected them after the deposition operation.

Figure 6C:
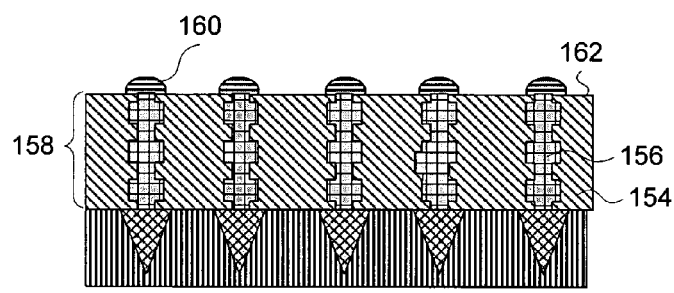

FIG. 6C depicts the state of the process after multiple layers 158 of the probe elements have been formed according to an electrochemical fabrication process where each layer includes regions of a sacrificial material 154 and regions of structural material 156. The regions of these materials on each successive layer are defined by a corresponding cross section of the array of probe elements. After formation of all layers 158 an adhesion or bonding material 160 is selectively located over the ends of structural material 156 (i.e. over the distal end of the probe elements or what might be termed bond pads on the probes). Material 160 may be selectively applied by masking surface 162 of layers 158 and then electrodepositing material 160, (e.g. tin, tin-lead, or other solder like materials) into the openings in the mask. After electrodeposition is completed the mask may be removed and if desired bonding material 160 may be heated so that it reflows to form rounded balls or bumps of material. In alternative embodiments, other methods of selectively patterning the adhesion material may be used, e.g. selective deposition via ink, blanket deposition followed by selective etching. In some alternative embodiments, prior to reflowing the bonding material, the bonding material may be planarized to help ensure uniform quantities of material at the foot of each probe which may in turn help in ensuring more uniform positioning during bonding.

Figure 6D:
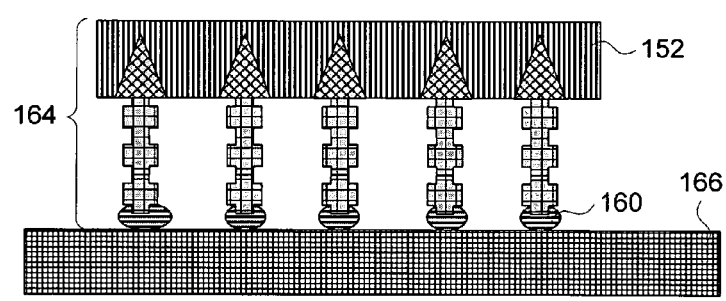

FIG. 6D depicts the state of the process after the array of probe elements 164 have been bonded via bonding material 160 to a substrate 166, and the sacrificial material 154 has been removed. The order of attachment and the order of removal may be performed in any desired manner. In other words, in some variations of this embodiment, the removal operation may occur prior to the attachment operation while in other variations of this embodiment the attachment operation may occur prior to the removal operation.

In still other variations of the present embodiment where removal of sacrificial material is to occur prior to attachment, the removal of sacrificial material may occur prior to formation of the bumps 160 of the adhesion material being attached to the distal ends of the structural material 156 forming the probe elements.

In still other variations of the present embodiment the last layer, or layers, of the probe elements may be formed using a different material than sacrificial material 154. This different material may be a conductive or dielectric sacrificial material or it may be a dielectric structural material. This different material may be put in place as part of the formation process for the last layer or layers or alternatively it may be put in place after layer formation is completed and an etching of the sacrificial material from surface 162 (as shown in FIG. 6C) removes one or more layers of the material. After the different material is put in place, surface 162 may be re-planarized and then bumps 160 formed. In still further variations of the present embodiment, bumps 160 may not be directly formed on structural material 156 but instead may be formed in desired locations on a substrate 166 and then made to contact and bond to probe elements 164 during the adhesion operation. In still other alternative embodiments, bumps or other bonding material (e.g. gold) may be formed on both structural material 156 and substrate 166.

Figure 6E:
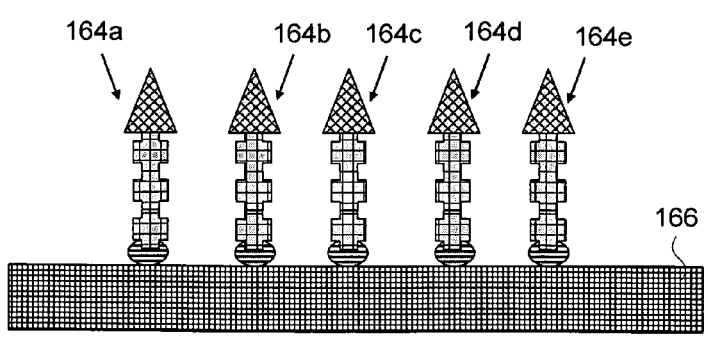

FIG. 6E shows the state of the process after the original sacrificial material 152 holding tips 150a-150e is removed thereby forming independent probe elements 164a-164e on substrate 166. If the different material described in one of the above variations is used, that different material may be removed before or after the adhesion process occurs or may remain as a part of the final structure and may actually be used to enhance adhesion between the probe elements 164a-164e and substrate 166. In other alternative embodiments, sacrificial material may be removed before bonding and/or before removal of sacrificial material 156.

FIGS. 7A-7F schematically depict side views at various stages in an example of a process for forming a probe element according to a third embodiment of the invention where the probe element tip is formed using a protrusion of patterned photoresist that is made to have an undercut.

Figure 7A:
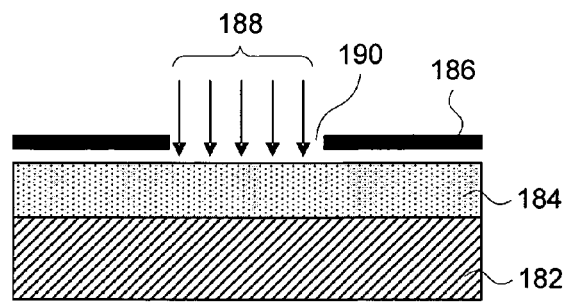
FIGS. 7A-7F schematically depict side views at various stages in an example of a process for forming a probe element according to a third embodiment of the invention where the probe element tip is formed using a protrusion of patterned photoresist that is made to have an undercut.

FIG. 7A depicts the state of the process where a temporary substrate 182 is coated with a negative photoresist material 184, e.g. Futurrex NR9-8000 (Futurrex, Inc. of Franklin, N.J.). Located above the photoresist material is a photomask 186 which has one or more openings 190 through which radiation 188 may be directed to expose the photoresist material. Openings 190 correspond to locations where probe element tip material 192 will eventually be located on substrate 182.

Figure 7B:
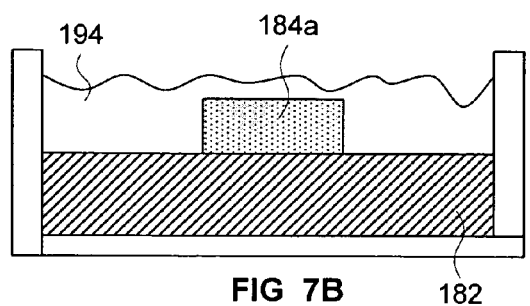

FIG. 7B depicts the state of the process after substrate 182 and photoresist 184 have been immersed in a developing solution 194 such that unexposed portions of photoresist 184 are removed and such that exposed region 184a remains.

Figure 7C:
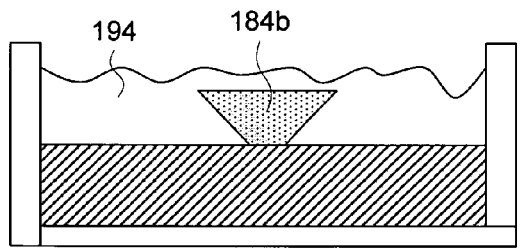

FIG. 7C depicts the state of the process after continuing to expose photoresist element 184a to developing solution so that it becomes overdeveloped which causes undercutting of the photoresist to occur leading to the trapezoidal shaped element 184b.

Figure 7D:
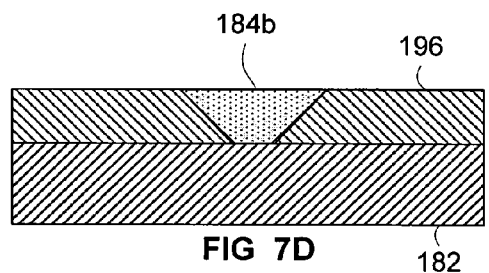

FIG. 7D depicts the state of the process after photoresist element 184b has been used as a mask in a plating operation which results in the deposition of a sacrificial material 196 which may be the same or different from substrate material 182. If the deposition of sacrificial material 196 is not sufficiently uniform, a planarization operation may be used to achieve the configuration depicted in FIG. 7D.

Figure 7E:
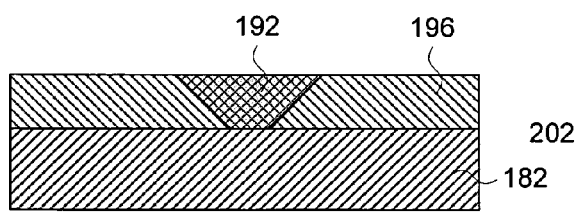

FIG. 7E depicts the state of the process after probe tip material 192 has been deposited into the void created by the removal of photoresist material 184b. If necessary to give probe tip material 192 and sacrificial material 196 a desired surface configuration the upper surface of these two materials may be planarized to yield the configuration shown in FIG. 7E. Also if necessary, prior to depositing sacrificial material 196 and/or tip material 192, one or more seed layers or adhesion layers may be applied.

Figure 7F:
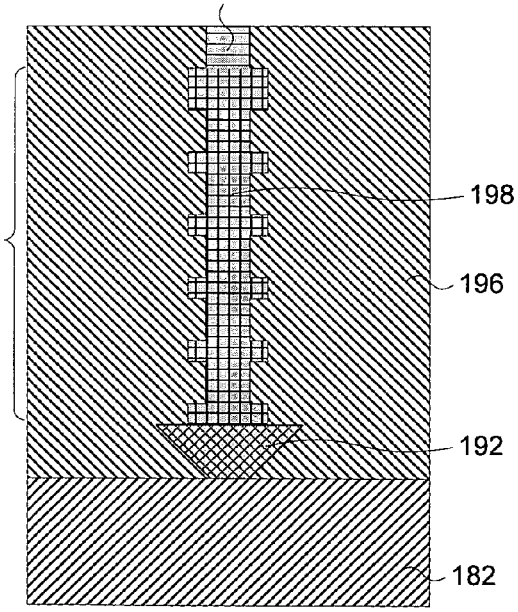

FIG. 7F depicts the state of the process after electro chemical fabrication of a plurality of layers produces the main body 202 of a probe element bounded on one end by probe tip material 192 and bounded on the other end by an adhesion material 200. After formation of the completed probe element (as shown) or probe array elements (not shown) the sacrificial material 196 may be removed, the probe element or elements may be bonded to a substrate, and the temporary substrate 182 may be removed. The order of these operations may be varied in alternative embodiments.

In variations of this embodiment adhesion material 200 need not be surrounded by sacrificial material 196 as it may be directly pattern deposited. In such cases, or in cases where removal of the upper most portion of the sacrificial material occurs it may be possible to bond probe elements 202 to a desired substrate via bonding material 200 prior to removal of all of the sacrificial material. In such cases temporary substrate material 182 maybe removed before or after adhesion has taken place.

The features and variations of this embodiment may have application in variations of the previously discussed embodiments or embodiments to be discussed hereinafter just as variations and features of the previous embodiments may have application to creation of further variations of the present embodiment or variations of embodiments to be described hereinafter just as features of the various embodiments to be discussed hereinafter and their variations may have applications to create further variations of the present embodiment or previously discussed embodiments.

FIGS. 8A-8F schematically depict side views at various stages in an example of a process for forming a probe element according to a fourth embodiment of the invention where the probe element tip is formed using an indentation in a patterned photoresist that is made to have sidewalls that taper outward.

Figure 8A:
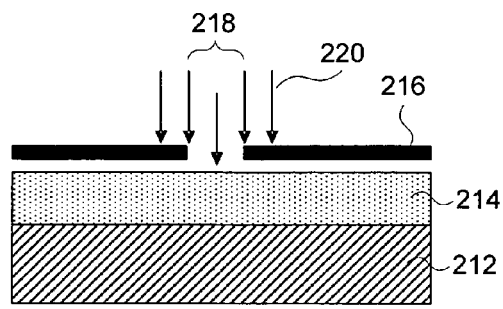
FIGS. 8A-8F schematically depict side views at various stages in an example of a process for forming a probe element according to a fourth embodiment of the invention where the probe element tip is formed using an indentation in a patterned photoresist that is made to have sidewalls that taper outward.

FIG. 8A depicts the state of the process after a temporary substrate 212 is coated with a positive photoresist 214 and a mask 216 with one or more openings 218 (one is shown) positioned above the photoresist. Radiation 220 is allowed to expose the photoresist in hole regions 218.

Figure 8B:
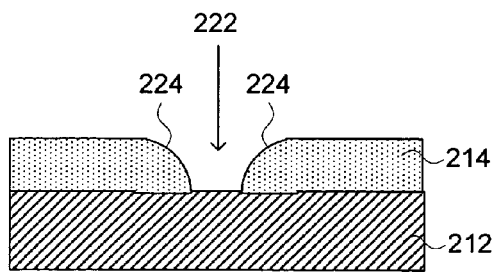

FIG. 8B depicts the state of the process after exposed photoresist 214 is developed and then overdeveloped to yield opening or openings 222 (one is shown) having tapered side walls 224.

Figure 8C:
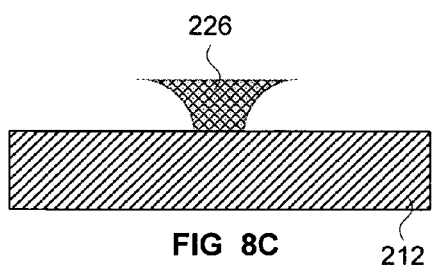

FIG. 8C depicts the state of the process after a probe element tip material 226 is deposited into opening 222 of photoresist 214 and then photoresist 214 is removed.

Figure 8D:
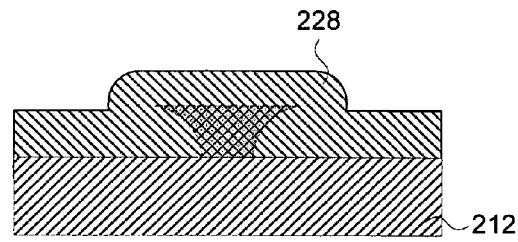

FIG. 8D depicts the state of the process after a sacrificial material 228 is electrodeposited over substrate 212 and over probe tip material 226.

Figure 8E:
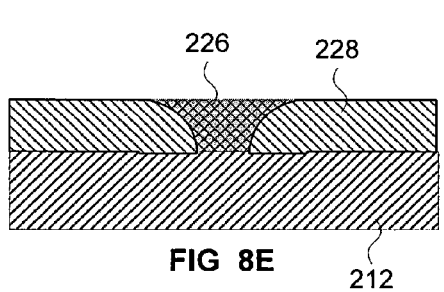

FIG. 8E depicts the state of the process after the sacrificial material 228 and probe tip material 226 have been planarized.

Figure 8F:
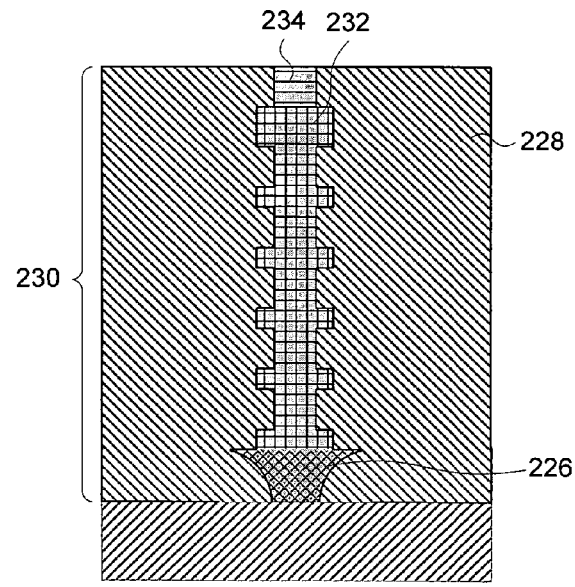

FIG. 8F depicts the state of the process after a plurality of layers of probe element 230 have been formed from a structural material 232 and sacrificial material 228. On one end probe element 230 includes the probe tip made from material 226 and on the other end an adhesion or bonding material 234.

Next (not shown) as described in association with the previous embodiments, probe element 230 or an array of probe elements (not shown) may be released from the sacrificial material and from the temporary substrate and bonded to a desired substrate via adhesion material 234.

In variations of the above embodiment enhanced sloping or tapering of the photoresist material may occur not just as a result of overdevelopment but also as a result of underexposure and/or tailored baking operations.

FIGS. 9A-9G schematically depict side views at various stages in an example of a process for forming an array of probe elements according to a fifth embodiment of the invention where the probe element tips are formed using protrusions of a patterned photoresist material over which an electroplated material is made to mushroom and through which openings are etched.

Figure 9A:
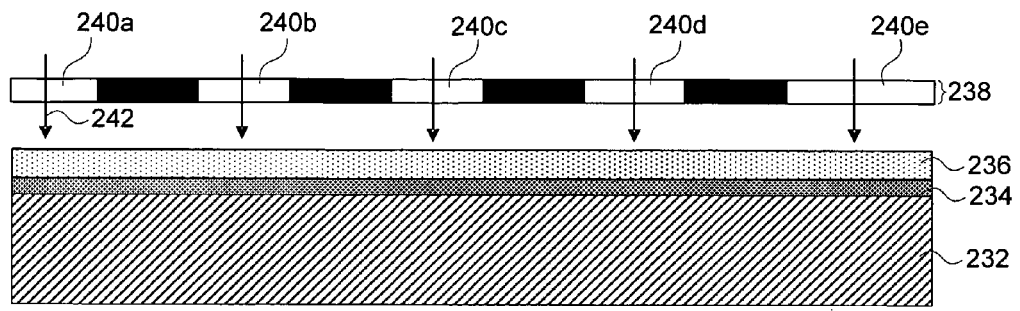
FIGS. 9A-9G schematically depict side views at various stages in an example of a process for forming an array of probe elements according to a fifth embodiment of the invention where the probe element tips are formed using protrusions of a patterned photoresist material over which an electroplated material is made to mushroom and through which openings are etched.

FIG. 9A depicts the state of the process after a temporary substrate 232 is coated with a seed layer material or seed layer stack (e.g. combination of a seed layer, an adhesion layer and possibly a barrier layer) 234 and that is in turn coated with a photoresist material 236. Located above the photoresist material is a photomask 238 which contains openings 240a-240e through which radiation 242 may expose and latently pattern photoresist material 236.

Figure 9B:
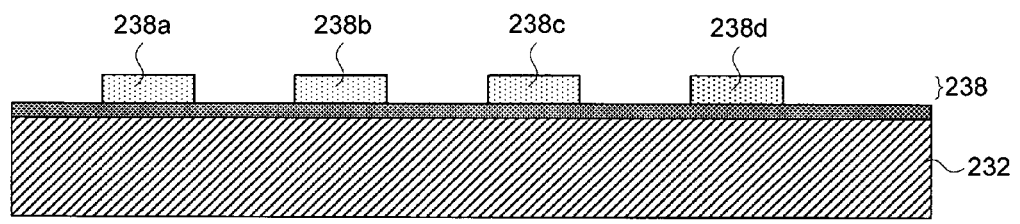

FIG. 9B depicts the state of the process after development of the exposed and latently patterned photoresist 238 yields small plugs of photoresist material 238a-238d which mark locations where probe tip elements will be formed.

Figure 9C:
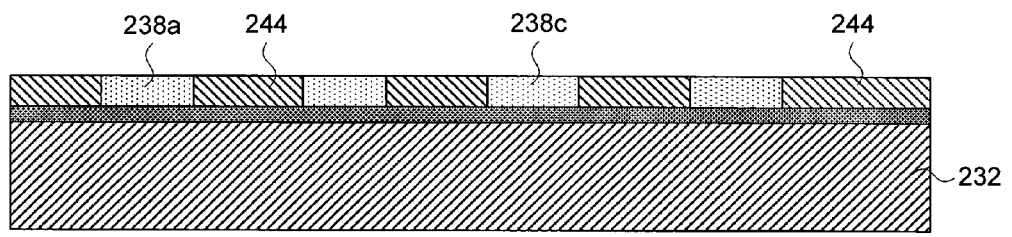

FIG. 9C depicts the state of the process after a sacrificial material 244 is deposited into the openings between and adjacent to photoresist plugs 238a-238d. If necessary the photoresist plugs and deposited sacrificial material 244 may be planarized to yield the structural configuration shown in FIG. 9C.

In variations of the embodiment such planarization may not be necessary while in other embodiments such planarization may be useful in enhancing the uniformity of mold patterns that will be created.

Figure 9D:
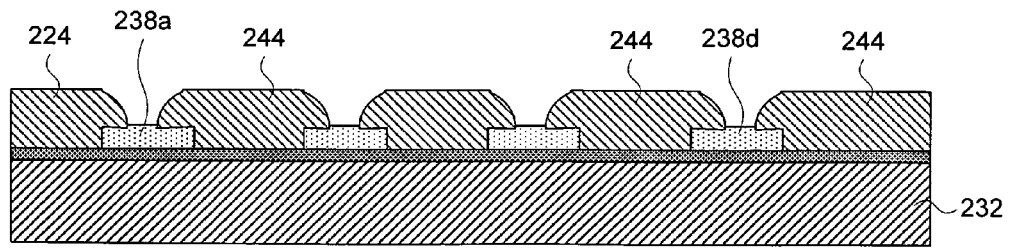

FIG. 9D depicts the state of the process after additional deposition or continued deposition causes outward mushrooming of sacrificial material over the photoresist plugs. In the context of the present application mushrooming refers to the in plane spreading (i.e. in the plane of the surface of the substrate as opposed to growth in the height direction which is perpendicular to the surface) of the electrodeposited material occurring over dielectric material as the height of the deposition grows.

Figure 9E:
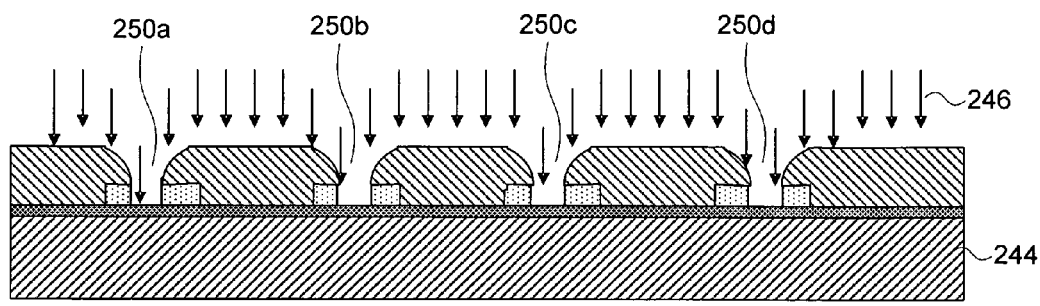
Figure 9F:
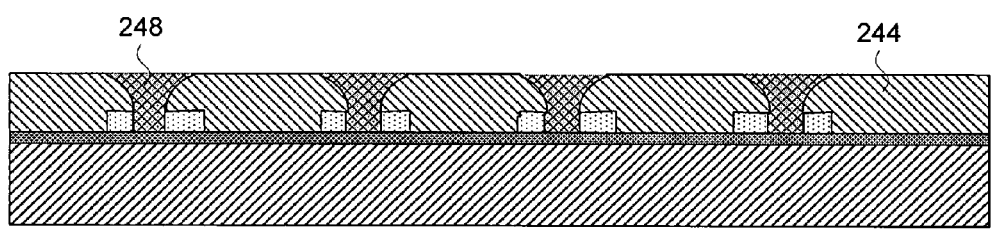

FIG. 9E depicts the state of the process after a desired amount of mushrooming has occurred (i.e. spillover of deposited conductive sacrificial material onto the dielectric photoresist plugs) and as RIE exposure 246 has isotropically etched through the photoresist plugs to vertically create an opening extending from plating base 232 through the dielectric and sacrificial materials. These openings and surrounding conductive and sacrificial materials form molds in which probe element tip material may be deposited. The probe tip material may consist of a single material 248 (see FIG. 9F) that fills openings 250a-250d, or alternatively may be a relatively thin coating of a desired material that is backed by a secondary tip material (not shown). If necessary, after deposition of probe tip material 248 the surface of the sacrificial and probe tip materials may be planarized to yield the configuration shown in FIG. 9F. In some alternative embodiments, a seed layer (e.g. a then layer of sacrificial material) may be applied prior to depositing tip material.

Figure 9G:
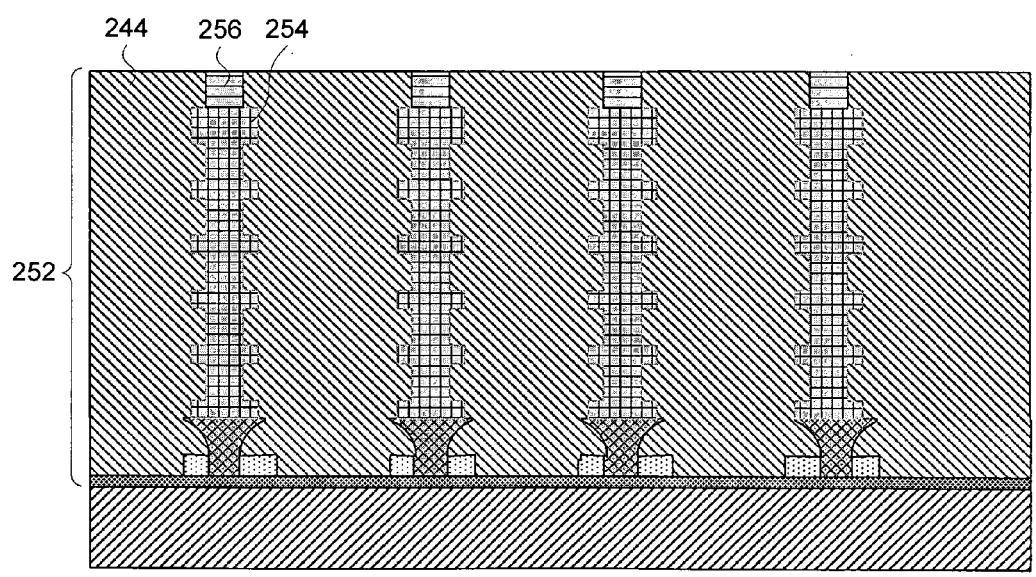

FIG. 9G depicts the state of the process after a plurality of electrochemically fabricated layers complete formation of probe elements 252 out of a structural material 254 and sacrificial material 244 and after deposition of an adhesion or bonding material 256 has occurred.

As with the previously discussed embodiments probe elements may individually, or in desired array patterns, be diced from one another, temporary substrate material may be removed, seed layer material may be removed, remaining photoresist material may be removed, temporary substrate 244 may be removed, and probe elements 252 may be bonded to a desired substrate via bonding or adhesion material 256.

Figure 10A:
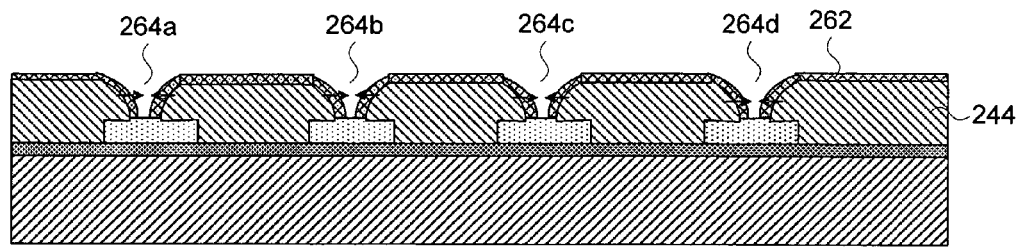
FIGS. 10A-10C schematically depict side views at various stages in an example of a process for forming an array of probe elements according to a sixth embodiment of the invention where the probe element tips are formed using protrusions of a patterned photoresist material over which an electroplated material is made to mushroom.
Figure 10B:
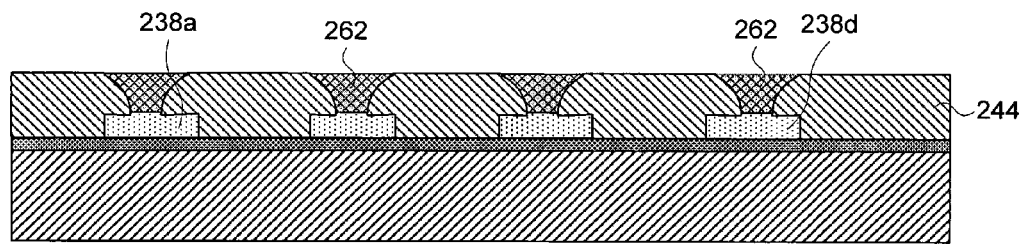
Figure 10C:
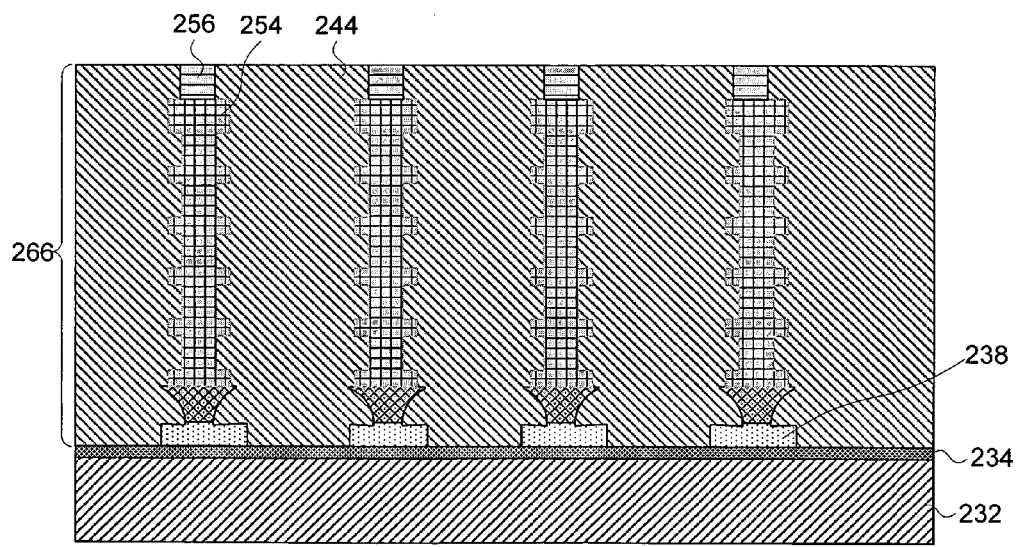

FIGS. 10A-10C schematically depict side views at various stages in an example of a process for forming an array of probe elements according to a sixth embodiment of the invention where the probe element tips are formed using protrusions of a patterned photoresist material over which an electroplated material is made to mushroom.

The embodiment of FIGS. 10A-10C is similar to that of FIGS. 9A-9G with the exception that the photoresist material over which mushrooming of sacrificial material occurs is not etched though.

FIG. 10A depicts the state of the process after a probe tip material 262 begins to fill voids 264a to 264d by horizontal growth of the deposits from the sides of sacrificial material 244.

FIG. 10B depicts the state of the process after openings 264a-264d have been filled with tip probe material 262 and after planarization has removed portions of material 262 that bridged over sacrificial material 244 and connected individual probe tip elements together.

FIG. 10C depicts the state of the process after probe elements 266 have been completed by the electrochemical fabrication of a plurality of layers of structural material 254 and sacrificial material 244 and after a bonding or adhesion material 256 has been deposited. As with the embodiment of FIGS. 9A-9G probe elements 266 may be adhered to a desired substrate via bonding material 256 and sacrificial material 244 may be removed along with photoresist material 238, seed layer material 234, and temporary substrate 232 to yield a plurality of independent probe elements connected to a substrate having desired conductive interconnects and the like.

FIGS. 11A-11F schematically depict partially transparent, perspective views, side views (along a central cut plane), and top views at each of various stages in an example of a process for forming an array of probe tips according to a seventh embodiment of the invention where the probe tips are formed using a mold formed from a patterned deposition that forms multiple voids (one per tip) followed by a blanket deposition that narrows the voids and gives them a desired shape.

FIG. 11A depicts three views of the state of the process after a substrate is supplied. View 302-1 provides a perspective view of the substrate. View 302-2 provides a side view of the substrate along the X-axis while view 302-3 provides a top view of the substrate in the X-Y plane. Substrate 302 is a temporary substrate and may be made from a conductive material or a dielectric material having a seed layer formed thereon.

FIG. 11B depicts three views of the substrate after a patterned deposition of a sacrificial material 304 (e.g. copper) has been patterned thereon. Sacrificial material 304 is patterned to contain two voids 306-1 and 306-2. These voids represent locations where probe tips will be located and in this illustration, only two probe tips will be formed. Of course, this process may be used to form a single probe tip or used to form arrays of probe tips including tens, hundreds, or even thousands of elements. As with FIG. 11A, the various views of FIG. 11B are shown in conjunction with coordinate axis symbols which indicate the perspectives from which the views are taken.

FIG. 11C depicts three views of the state of the process after a blanket deposition of a sacrificial material 308 occurs. Material 308 may or may not be the same material as sacrificial material 304. The blanket deposition of material 306 results in a filling in and a closing up of the voids 306-1 and 306-2 from the initial deposition of material 304. The closing up of the voids results in sloped walls of material 308 surrounding unfilled portions of voids 306-1 and 306-2. Filling in of void 306-1 occurs up to a position indicated by 312-1 while the filling in of void 306-2 occurs up to a line element 312-2. The shape of the unfilled portion of the voids depends on the initial depth and configuration of original voids 306-1 and 306-2.

FIG. 11D provides three views of the state of the process after structural material (e.g. nickel) deposition occurs and after a planarization operation occurs and after removal of any masking material associated with the patterned deposition occurs. The blanket deposition of material 308 as indicated in FIG. 11C provided desired void configurations 314-1 and 314-2 which possessed shapes complimentary to the desired shapes of probe tip elements to be formed. The operations leading to FIG. 11D result in creation of probe tip elements 316-1 and 316-2 out of structural material 318.

FIG. 11E depicts three views of the state of the process after deposition of another sacrificial material 320 occurs and after planarization of the resulting deposit occurs. Sacrificial material 320 may be identical to sacrificial materials 308 and 304 or may be different from one or both of them. The performance of the deposition and planarization operation of FIG. 11E is based on the assumption that layers of structural material forming probe elements will be added to the tips as was indicated in the various previous embodiments set forth herein. If no such addition was to occur, the operations leading to FIG. 11E need not have occurred.

Figure 11F:
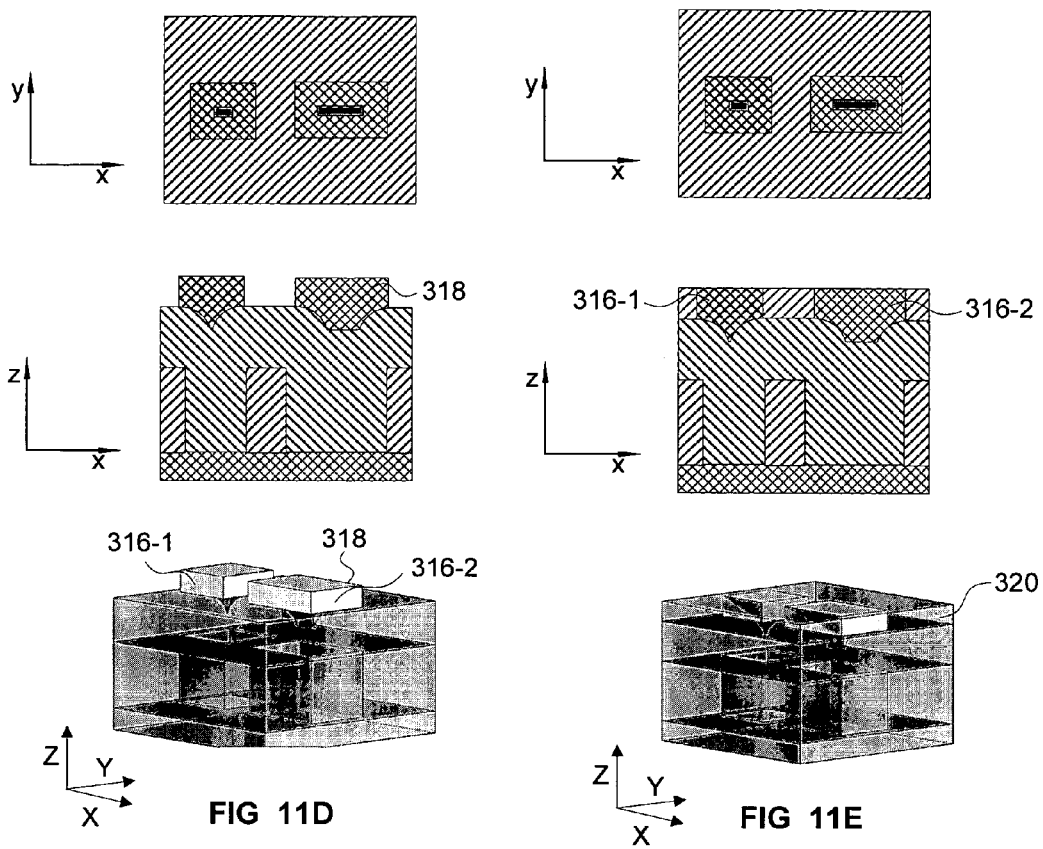
Figure 11F:
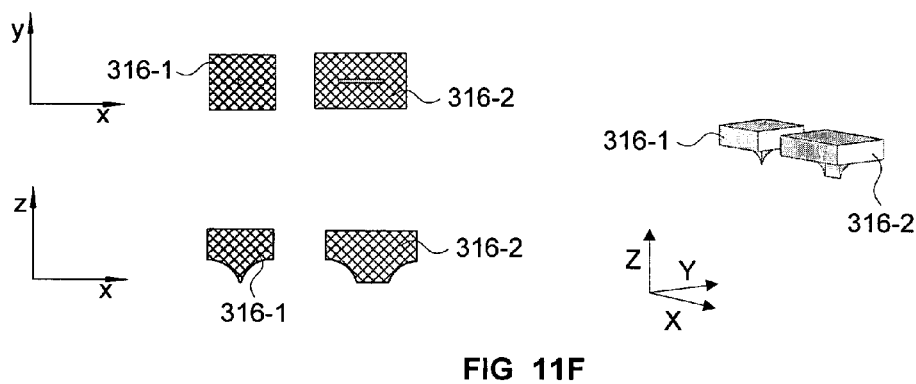

FIG. 11F depicts three views of the state of the process after each of the sacrificial materials and the substrate have been removed (under the assumption that no additional layers of structure have been formed (e.g. no main bodies of probe elements have been formed).

The seventh embodiment of the invention as illustrated in FIGS. 11A-11F may be considered to include the following major operations: (1) Supplying a substrate. (2) Pattern depositing a first sacrificial material onto the substrate leaving openings or voids in the sacrificial material in locations which will give rise to probe tip elements. The patterning of the sacrificial material may occur in a variety of ways, for example, it may occur by first locating and patterning a masking material onto the surface of the substrate and thereafter plating the sacrificial material onto exposed regions of the substrate. Alternatively, a blanket deposition of a sacrificial material may occur followed by patterned masking and selective etching. In a further alternative, direct deposition of the sacrificial material may occur, for example, by ink jet printing or the like. (3) Blanket depositing a second sacrificial material which may be identical to the first sacrificial material to build up the second sacrificial material over regions of the first sacrificial material and to partially fill in voids in the first sacrificial material such that voids of desired configuration occur in the second sacrificial material which take on a shape complimentary to that of the probe tip elements to be formed. (4) Pattern depositing a structural material into the voids formed in the second sacrificial material and potentially to form structures of desired configuration above the second sacrificial material. The patterned deposition of the structural material may occur in a variety of ways, for example, it may occur by locating and patterning a mask material over those portions of the second sacrificial material not to receive structural material. (5) Optionally planarizing the surface of the structural material and the masking material to a desired height. If it is not possible to planarize a combination of structural material and masking material, planarization may be delayed until after deposition of a sacrificial material. (6) Assuming that additional layers of material are to be added, depositing a third sacrificial material may occur. The third sacrificial material may be the same as or different from either one or both of the first and second sacrificial materials. The deposition of the third sacrificial material may occur in a blanket or patterned manner. (7) Planarizing the surface of the deposited materials if needed so that both sacrificial and structural materials are exposed and ready for accepting additional material depositions associated with build up of probe elements or the like. (9) Using, for example, electrofabrication techniques for building up layers of the structure as desired for example using techniques as disclosed elsewhere herein. (10) Removing the sacrificial material to release the probe tips and other elements of the probe structures. Such release may occur before or after bonding of the probe elements to a new substrate and before or after releasing the probes from a temporary substrate.

Various alternatives to this seventh embodiment are possible. For example, after the patterned deposition operation of the first sacrificial material and prior to any removal of associated masking material the surface of the sacrificial material may be planarized so as to produce a controlled surface for use as a starting point for subsequent operations.

In another variation of the embodiment, after the blanket deposition operation of the second sacrificial material a flash or quick etching operation or series of etching and deposition operations may occur to smooth out any irregularities in the surface of the second sacrificial material and particularly any irregularities in the void regions of the second sacrificial material which will be used for molding probe tip elements.

In addition or alternatively, after deposition of the second sacrificial material, the voids therein may be filled with a temporary conductive or dielectric material and the surface of the second sacrificial material planarized and thereafter the temporary material removed. This planarization operation may improve the quality of the probe tip elements in regions slightly displaced from tip regions.

In another variation of the present embodiment the deposition of the sacrificial material and the deposition of the structural material may be reversed such that the deposition of the sacrificial material is a patterned deposition while the deposition of the structural material may be a blanket deposition or it may continue to be a selective deposition.

FIGS. 12A-12E schematically depicts partially transparent, perspective views at various stages in an example of a process for forming an array of probe tips according to an eighth embodiment of the invention where the probe tips are formed using a partially masked area of structural material or tip material surrounded by a sacrificial material and then etching the structural or tip material relative to the sacrificial material to achieved desired tip configurations.

Figure 12A:
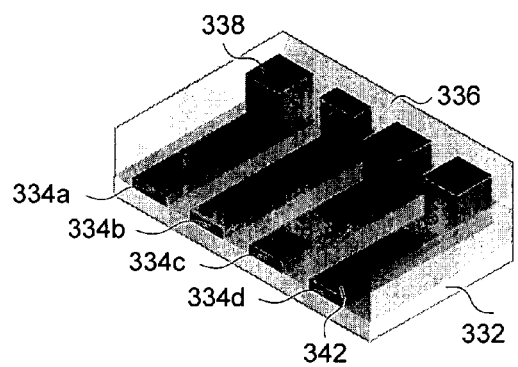
FIGS. 12A-12E schematically depicts partially transparent, perspective views at various stages in an example a process for forming an array of probe tips according to an eighth embodiment of the invention where the probe tips are formed using a partially masked area of structural material or tip material surrounded by a sacrificial material and then etching the structural or tip material relative to the sacrificial material to achieved desired tip configurations.

FIG. 12A depicts an initiation point for the process where an array of probe elements 334a-334d whose main bodies have been formed from a structural material 342 and whose distal ends (i.e. tip regions) are formed from a second structural material 338 on a substrate 332 and are encapsulated (with the exception of an upper surface of the probes where material 338 is located) with a sacrificial material 336. In some variations of this embodiment the substrate may be a temporary substrate while in other variations it may be a permanent substrate.

Figure 12B:
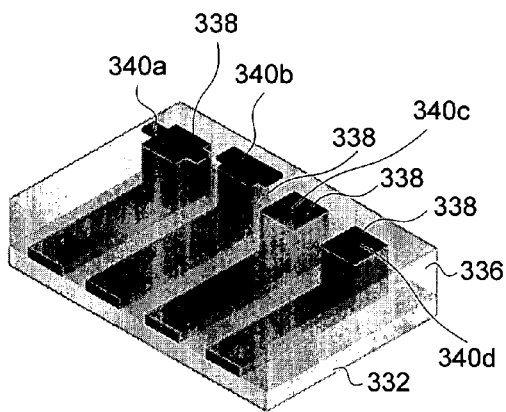

FIG. 12B depicts the state of the process after a masking material 340 of desired configurations 340a-340d has been located over regions of the structural material 338 (i.e. tip material) from which at least the tips of elements 334a-334d will be formed. The masking may take on a variety of patterns. For example, as indicated by element 340a, the masking material may be centered relative to the last layer of material 338 of one of the probes (e.g. 334a as shown), it may be offset toward one side or the front or back of one of the probe elements (e.g. 334b as shown) as indicated by 340b, it may be a circular patch centered over the tip material as indicated by 340c, or it may be a square patch located over the tip material as indicated by 340d.

Figure 12C:
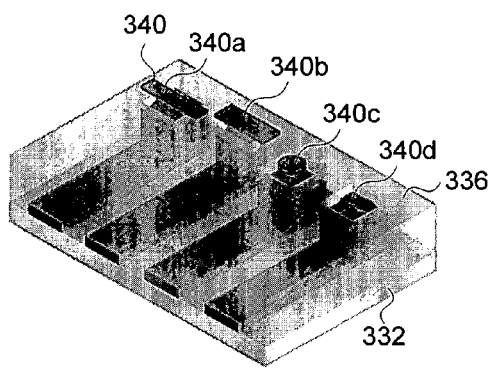

FIG. 12C depicts the state of the process after a selective etching operation (e.g. a wet etch of nickel) is allowed to operate on the structural material in the unmasked regions.

Figure 12D:
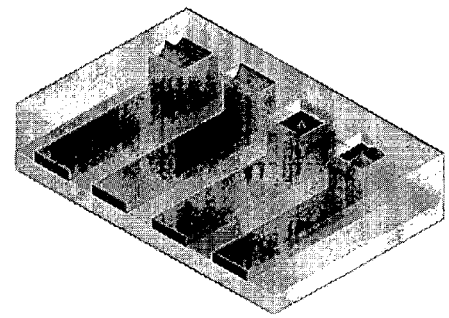

FIG. 12D depicts the state of the process after mask material overlaying the etched structural material has been removed.

Figure 12E:
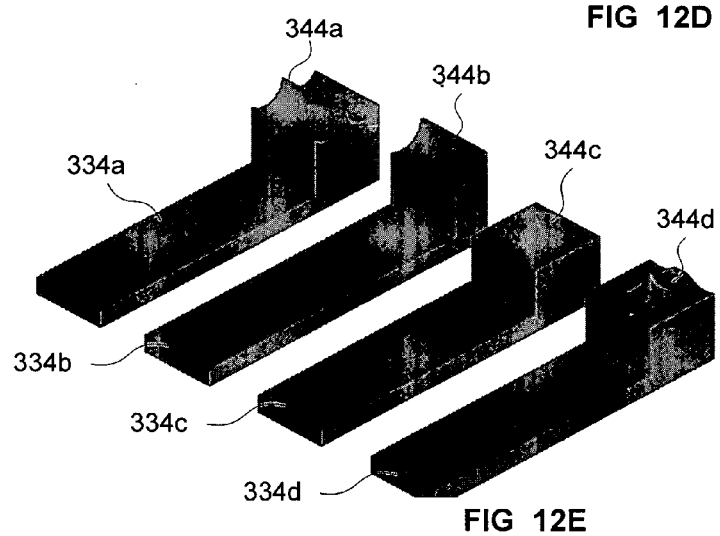

FIG. 12E depicts the state of the process after the substrate and sacrificial material have been removed thereby releasing probe elements 334a-334d with tip structures 344a-344d which resulted form the relationship between the mask size, its location, the size of the structural material exposed to the etchant, the reactivity of the etchant (e.g. based on its chemical properties, temperature and the like), time the etchant was allowed to operate, and any other physical attributes of the etching operation (e.g. agitation, rinsing, and the like).

In this embodiment the probe elements took the form of lever arm or cantilever structures as opposed to the form of vertically elongated structures as presented in some of the previous embodiments. It will be understood by those of skill in the art that a variety of probe structure designs (i.e. designs of the main bodies of probe structure, i.e. the portion between the tips and bonding material) may be utilized in conjunction with the probe tip creation techniques set forth in the present application. It will be understood by those of skill in the art that probe tip materials may be different from the materials used to form the main bodies of the probe elements or they may be of the same materials. It will also be understood by those of skill in the art that contact materials associated with probe elements may be different form the probe tip materials themselves. Such contact materials may be applied after tip formation, for example, by a selected electrochemical deposition process or sputtering process or the like. Alternatively contact materials may be deposited during operations for forming the tip structures themselves. It will also be understood by those of skill in the art that according to the present embodiment different probe tips in a probe tip array may have similar tip configurations or alternatively they may have different configurations (e.g. depending on how they are formed and how they will be used).

Figure 13A:
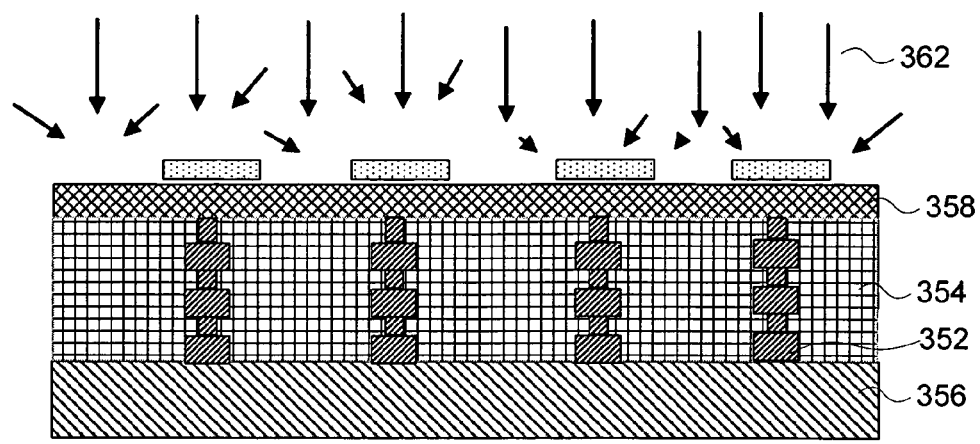
FIGS. 13A-13C schematically depict side views at various stages in an example of a process for forming an array of probe elements according to a ninth embodiment of the invention where the probe tips are formed after forming the other portions of elements by placing patterned masking material over a tip material and etching away the tip material in the exposed regions leaving behind tip elements located on previously formed portions of the elements.
Figure 13B:
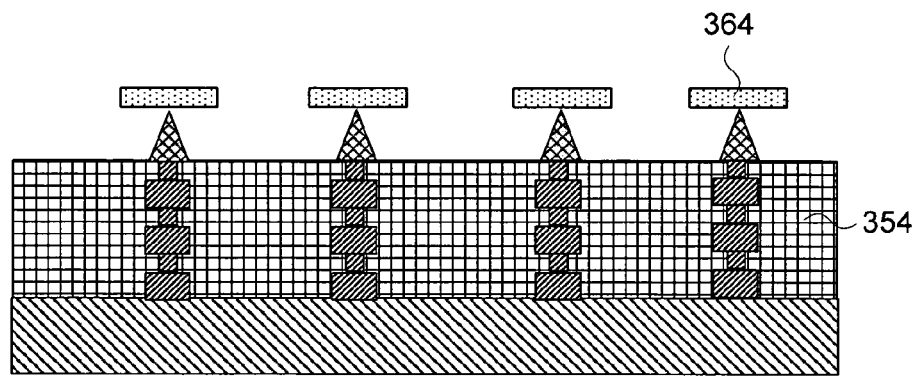
Figure 13C:
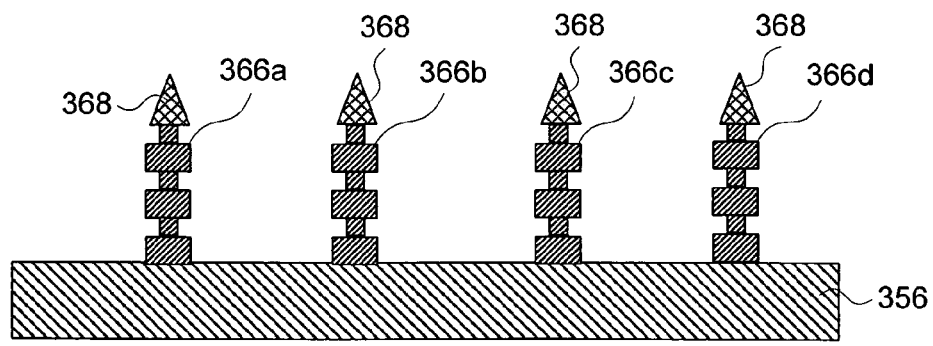

FIGS. 13A-13C schematically depict side views at various stages in an example of a process for forming an array of probe elements according to a ninth embodiment of the invention, which has some similarities to the eighth embodiment of the invention, where the probe tips are formed after forming the other portions of elements by placing patterned masking material over a tip material and etching away the tip material in the exposed regions leaving behind tip elements located on previously formed portions of the elements.

FIG. 13A depicts the state of the process after a plurality of probe elements have been formed from a plurality of stacked and adhered layers of structural material 352 and sacrificial material 354. These layers were formed on a substrate 356 which may be a temporary substrate or a permanent substrate. The final layer of the built up probe elements are covered with a layer of probe tip material 358 which is in turn overlaid with a masking material which has been patterned to locate plugs of the masking material over locations where probe tip elements are to exist. The size and shape of the plugs of masking material will dictate the resulting tip configuration after an etchant 362 isotropically etches the probe tip material.

FIG. 13B depicts the state of the process after etching has been completed and probe tip material is etched and the sacrificial material is exposed. The shadowing from the masking material provides for a tapered etching of the covered tip material and thus results in probe tips of a desired configuration. In variations to the present embodiment, multiple masking operations and etching operations may be used to further tailor the final shape of the probe tips. In other variation of the present embodiment, the final layer or layers of sacrificial material may be replaced by a different sacrificial material (e.g. one which can better withstand attack from the etchant that will be used to remove the tip material).

FIG. 13C depicts the state of the process after sacrificial material 354 has been removed which yields the array of probe elements 366a-366d adhered to substrate 356 and including tips 368 of desired configuration.

FIGS. 14A-14D schematically depict side views at various stages in an example of a process for forming an embossing tool for forming probe tips with all array elements present and having a first tip configuration.

Figure 14A:
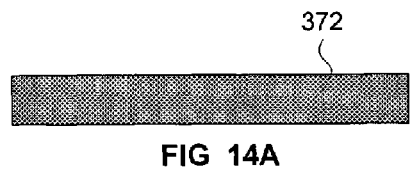
FIGS. 14A-14D schematically depict side views at various stages in an example of a process for forming an embossing tool for forming probe tips with all array elements present and having a first tip configuration.
Figure 14B:
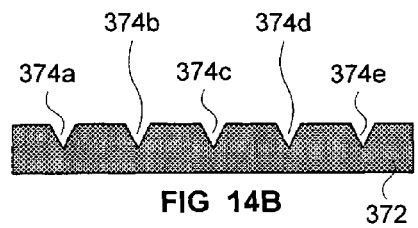

FIG. 14A depicts the state of the process after a desired substrate material 372 is supplied while FIG. 14B depicts the state of the process after selective etching of substrate material 372 results in voids 374a-374e being formed. The etching that occurred to yield the voids of 374a-374e may have been implemented via the location and patterning of a mask material relative to the surface of substrate 372. Substrate 372 may for example be silicon and the etchant may be, for example, be KOH.

Figure 14C:
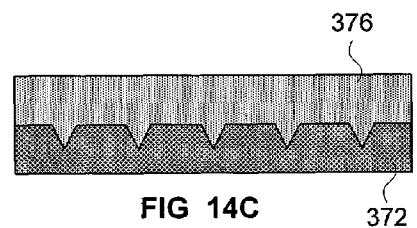

FIG. 14C depicts the state of the process after a mold material (e.g. epoxy material) 376 has been cast over the patterned surface of substrate 372.

Figure 14D:
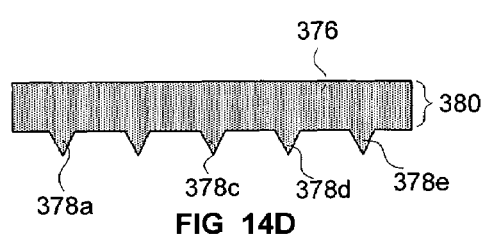

FIG. 14D depicts the state of the process after mold material 376 has solidified and has been separated from the patterned substrate 372. The spacing of protrusions 378a-378e on tool 380 corresponds to locations where probe tip elements are to be formed, for example, as will be described in the embodiment of FIG. 16.

FIGS. 15A-15D schematically depict side views at various stages in an example of a process for forming an embossing tool for forming probe tips with only a portion of the array elements present and having a second tip configuration.

FIGS. 15A-15D illustrate states of the process which are analogous to those illustrated in FIGS. 14A-14D with the exception that voids 384c and 384d are etched so as to have a different configuration than voids 374c and 374d, and where no voids in substrate 382 are formed which correspond to locations of voids 374a, 374b and 374e of FIG. 14B. As such, after completion of tool 390 from solidified molding material 386 the tool only contains protrusions 378c and 378d.

Figure 15A:
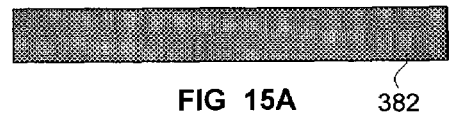
FIGS. 15A-15D schematically depict side views at various stages in an example of a process for forming an embossing tool for forming probe tips with only a portion of the array elements present and having a second tip configuration.
Figure 15B:
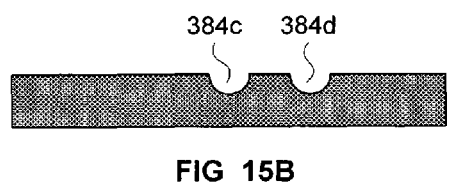
Figure 15C:
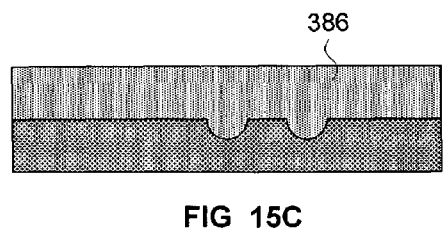
Figure 15D:
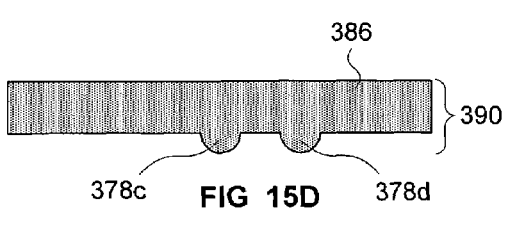

In comparing the tools of FIG.15D and FIG.14D it may be considered that the tool of FIG. 15B includes only a portion of the possible protruding elements necessary to form a complete array of probe tips whereas the protrusions of FIG. 14D may be used to form a complete array. Each of these tools may have use in forming probe element arrays with tips of desired configuration.

FIGS. 16A-16M schematically depict side views at various stages in an example of a process for forming an array of probe elements according to a tenth embodiment of the invention where the probe element tips are formed using the embossing tool produced according to FIGS. 14A-14D.

Figure 16A:
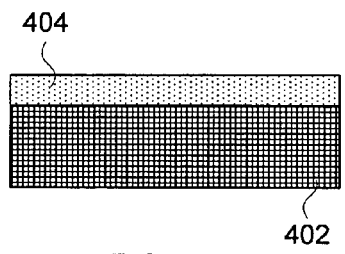
FIGS. 16A-16M schematically depict side views at various stages of a process for forming an array of probe elements according to a tenth embodiment of the invention where the probe element tips are formed using the embossing tool produced according to FIGS. 14A-14D.

FIG. 16A depicts the state of the process after a substrate 402 is coated with a photoresist or other polymeric material 404.

Figure 16B:
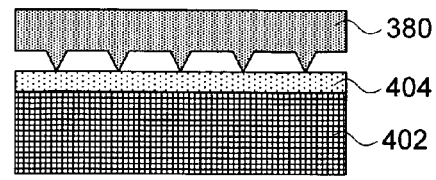
Figure 16C:
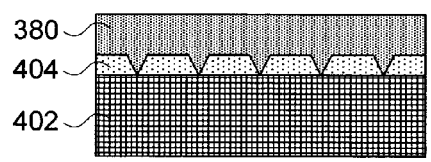

FIG. 16B depicts the state of the process after embossing tool 380 has been placed against polymeric material 404 while FIG. 16C depicts the state of the process after embossing tool 380 is made to emboss polymeric material 404.

Figure 16D:
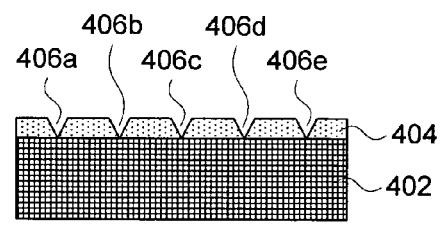

FIG. 16D depicts the state of the process after tool 380 has been removed leaving behind substrate 402 with polymeric material 404 located thereon and with voids 406a-406e located in the polymeric material.

Figure 16E:
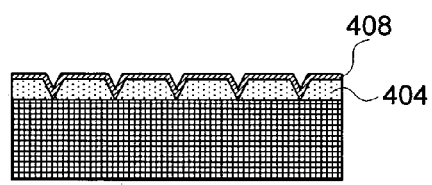

FIG. 16E depicts the state of the process after a seed layer material 408 is coated over the patterned polymeric material 404. The seed layer material may be of any appropriate sacrificial material that may be separated from a probe tip material without damaging it. For example, the seed layer material may be sputtered copper, tin, gold or the like. Prior to formation of the seed layer, if necessary, an adhesion layer may be located onto the surface of the patterned polymeric material. In some alternative embodiments, probe tip material may be deposited by other than an electrodeposition process and in such alternative embodiments, the deposition of the seed layer may not be necessary.

Figure 16F:
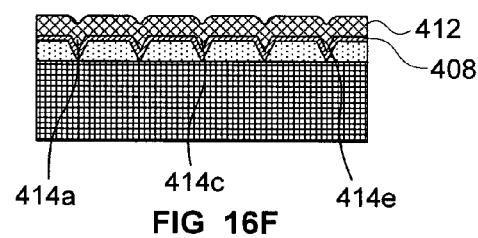

FIG. 16F depicts the state of the process after a probe tip material 412 has been plated over plating base 408. As indicated in FIG. 16F the deposition of probe tip material 412 occurs in a blanket fashion. In variations of this embodiment, probe tip material may be deposited in a selected manner such that regions between probe tip locations 414a-414e would not receive probe tip material. In other variations the probe tip material may be deposited via a non-electrodeposition process (e.g. via electrodeposition, PVD, CVD, spray metal deposition, and the like).

In such variations masking material associated with the selective deposition may be removed and a sacrificial material deposited (which may be the same as the seed layer material) and then the sacrificial material and probe tip material planarized to a desired level on which layers of structure may be formed.

Alternatively, prior to removal of the masking material, planarization of the combined masking material and probe tip material may occur. The masking material may then be removed and then sacrificial material added and another planarization operation implemented if desired.

Figure 16G:
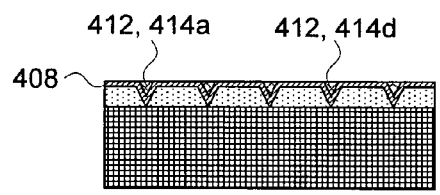

FIG. 16G depicts the state of the process after a planarization operation trims the height of probe tip material and sacrificial material (e.g. seed layer material) to a common level such that probe tip material is removed from regions between desired probe tip locations. In achieving the result depicted in FIG. 16G it is assumed that the initial seed layer thickness was sufficient to allow the planarization operation to occur. If this was not the case one of the alternative embodiments mentioned above in association with FIG. 16F could be implemented.

Figure 16H:
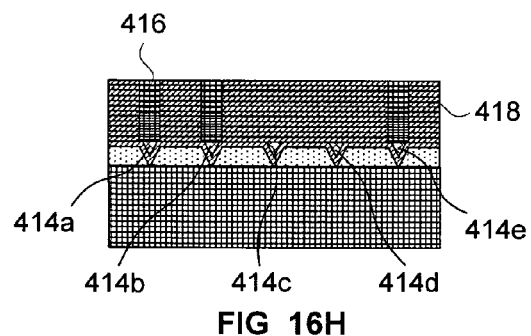

FIG. 16H depicts the state of the process after a plurality of layers of structural material 416 and sacrificial material 418 have been deposited to build up the main bodies of the probe elements. The structural material may, for example, be nickel, nickel-cobalt, nickel phosphor, or the like and the probe tip material may be, for example, rhodium or rhenium, while the sacrificial material may, for example, be copper or tin. As indicated in FIG. 16H though all probe element tips in the array were formed not all associated probe element structures were formed. In particular probe tips 414a, 414b and 414e have associated main bodies of probe elements while probe tips 414c and 414d do not. During a subsequent operation of the process probe tips 414c and 414d will be removed from the probe array.

In an alternative embodiment instead of forming probe tip elements 414c and 414d those probe tip locations may simply have been masked prior to deposit of probe tip material.

Figure 16I:
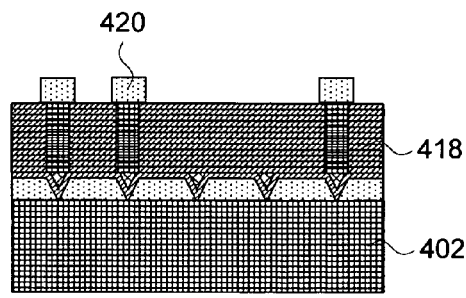

FIG. 16I depicts the state of the process after an adhesion or bonding material 420 has been selectively deposited onto the distal end of the probe structures.

Figure 16J:
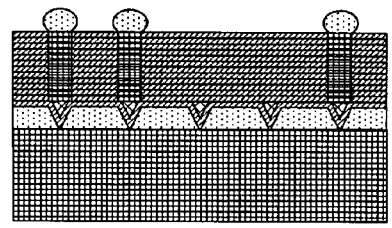

FIG. 16J depicts the state of the process after adhesion material has been reflowed to give it a rounded or ball like configuration.

Figure 16K:
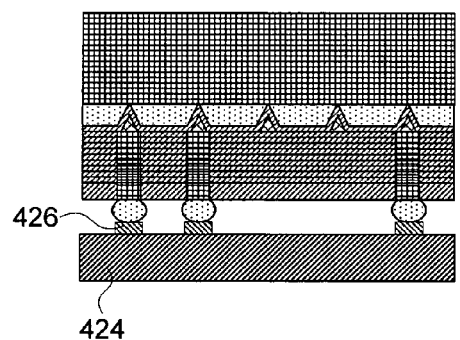

FIG. 16K shows the state of the process after unreleased probe structures have been inverted and contacted to a permanent substrate 424 which includes regions of a second adhesion material 426 (or simply bonding pad regions) that correspond to locations of adhesion material 420.

Figure 16L:
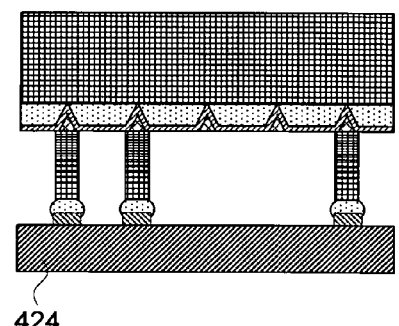

FIG. 16L depicts the state of the process after bonding of the probe structures and the permanent substrate occur and sacrificial material 418 is removed.

Figure 16M:
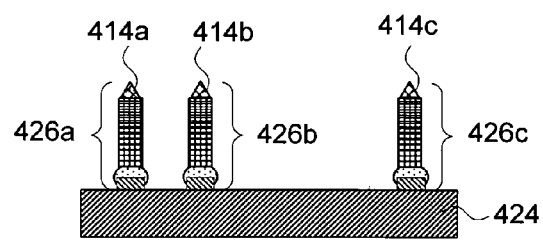

FIG. 16M depicts the state of the process after probe tips 414a, 414b and 414d have been released from the seed layer material, polymeric material and substrate 402 to yield completed probes 426a, 426b and 426e on the permanent substrate 424. As in some of the previously discussed embodiments, the order of bonding, of separating the probes from the temporary substrate, and separating the probes from the sacrificial material may be varied.

FIGS. 17A-17L schematically depict side views at various stages in an example of a process for forming an array of probe elements according to an eleventh embodiment of the invention where the probe-element tips are formed using the embossing tool produced according to FIGS. 14A-14D, where the embossed material is conductive, and where selected probe elements are not formed.

The process of FIGS. 17A-17L is similar to that of FIGS. 16A-16M with the exception that the seed layer of FIG. 16E is not necessary (as the material to be embossed is a conductor such as tin in).

Figure 17A:
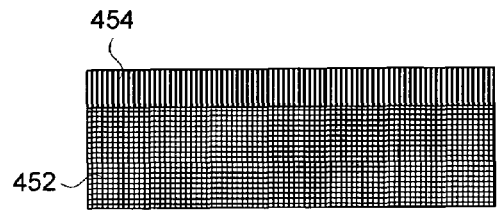
FIGS. 17A-17L schematically depict side views at various stages in an example of a process for forming an array of probe elements according to an eleventh embodiment of the invention where the probe element tips are formed using the embossing tool produced according to FIGS. 14A-14D, where the embossed material is conductive, and where selected probe elements are not formed.

FIG. 17A depicts the state of the process after a temporary substrate 452 is provided with a planarized coating of a conductive sacrificial material 454 located thereon. Sacrificial material 454 may be any appropriate material that may be removed from a probe tip material without damaging the tips and possibly removed from a material of substrate 452.

In some variations of this embodiment the sacrificial material 454 and the material substrate 452 may be one and the same material.

Figure 17B:
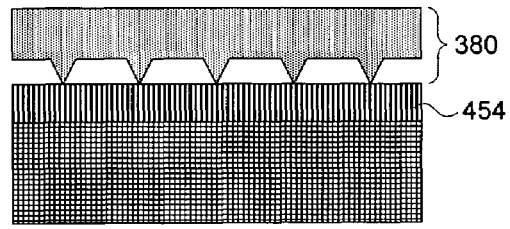

FIG. 17B depicts the state of the process after embossing tool 380 is brought into initial contact with sacrificial material 454.

Figure 17C:
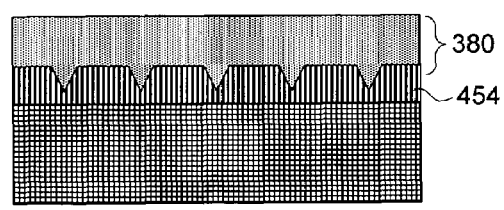

FIG. 17C depicts the state of the process after embossing tool 380 has been made to penetrate into sacrificial material 454. This may be done, for example, by heating the embossing tool and/or the sacrificial material such that in locations where contact is made the sacrificial material is flowable and can be flowed or otherwise reshaped to take the form dictated by the patterning on tool 380.

Figure 17D:
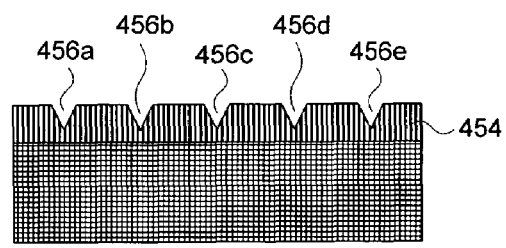

FIG. 17D depicts the state of the process after embossing tool 380 has been removed from embossed sacrificial material 454 leaving behind voids 456a-456e corresponding to locations where probe tips may exist in a probe tip array that is to be formed.

Figure 17E:
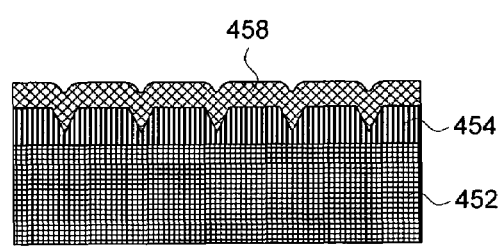

FIG. 17E depicts the state of the process after a probe tip material 458 is deposited over the patterned surface of sacrificial material 454.

Figure 17F:
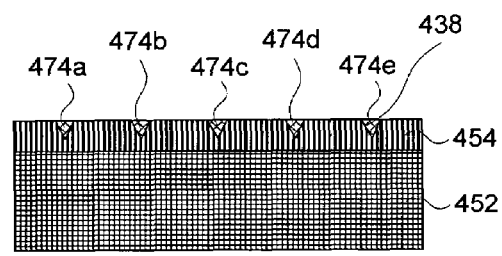

FIG. 17F depicts the state of the process after the sacrificial material and probe tip material have been planarized to a common level.

Figure 17G:
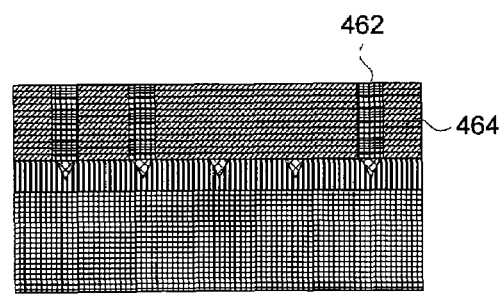

FIG. 17G depicts the state of the process after formation of the main body of probe elements has been completed as the result of the electrodeposition of a plurality of layers where each layer contains regions of structural material 462, corresponding to locations of probe elements, and sacrificial material 464. Sacrificial material 464 may be the same or different from sacrificial material 454. In some alternative embodiments, other methods may be used for depositing one or both the structural and sacrificial materials. In still other embodiments, more than one structural material may be used and/or more than one sacrificial material may be used.

Figure 17H:
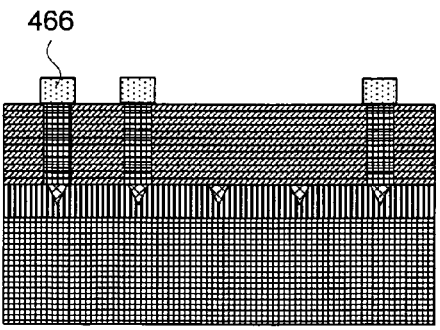

FIG. 17H depicts the state of the process after an adhesion material or bonding material 466 has been pattern deposited onto the uppermost surface of the probe structures.

Figure 17I:
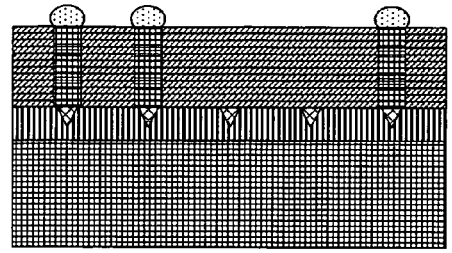

FIG. 17I depicts the state of the process after adhesion material 466 has been reflowed to give it a rounded or bubbled up shape as shown in FIG. 17I. In some embodiments, this operation need not be performed.

Figure 17J:
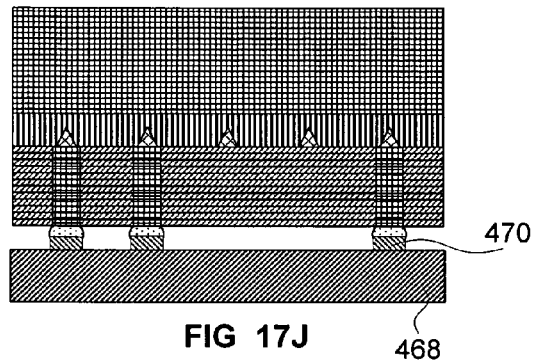

FIG. 17J depicts the state of the process after unreleased probe structures have been inverted and bonded to a permanent substrate 468 which includes regions of a second adhesion material 470 which correspond to regions of the first adhesion material 466 located on the electrochemically fabricated layers of structure making up the probe elements.

Figure 17K:
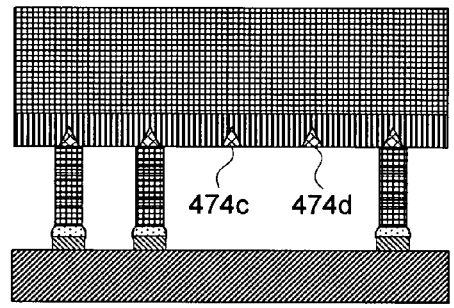

FIG. 17K depicts the state of the process after sacrificial material 464 has been removed.

Figure 17L:
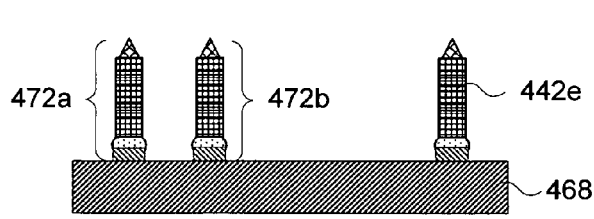

FIG. 17L depicts the state of the process after the original substrate 452 and sacrificial material 454 have been removed thereby yielding released probe structures 472a, 472b and 472e which are bonded to permanent substrate 468. As indicated in FIG. 17G probe tip regions 474a, 474b and 474e had structural material corresponding to probe elements adhered thereto whereas probe tip elements 474c and 474d did not.

As such, after the final separation of sacrificial material 454 and substrate 452 from the probe elements bonded to substrate 468, tip elements 474c and 474d were removed.

FIGS. 18A-18J schematically depict side views at various stages of a process for forming an array of probe elements according to a twelfth embodiment of the invention where the probe element tips are formed using the embossing tool produced according to FIGS. 14A-14D and where selected probe elements and probe tips are not formed.

Figure 18A:
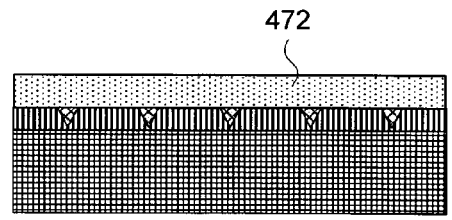
FIGS. 18A-18J schematically depict side views at various stages in an example of a process for forming an array of probe elements according to a twelfth embodiment of the invention where the probe element tips are formed using the embossing tool produced according to FIGS. 14A-14D and where selected probe elements and probe tips are not formed.

FIG. 18A begins with a structure similar to that shown in FIG. 17F along with a masking material 472 located above the probe tip elements.

Figure 18B:
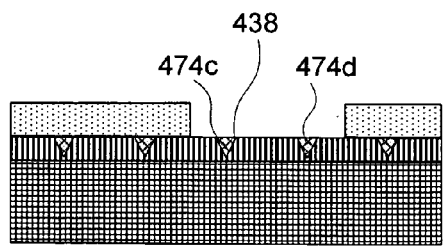

FIG. 18B depicts the state of the process after patterning of the masking material results in an opening or openings above probe elements 474c and 474d that are to be removed.

Figure 18C:
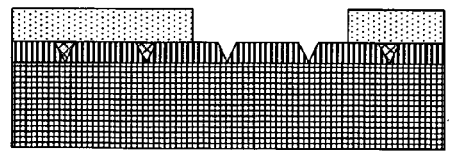

FIG. 18C depicts the state of the process after a selective etching operation removes probe tip material 438 from probe tip locations 474c and 474d. In some alternative embodiments, instead of selectively etching to removed unwanted tip material, prior to deposition of tip material, the embossed surface of sacrificial material may have been masked with openings located above undesired openings, additional sacrificial material deposited, and then the surface planarized, and masking material removed, leaving openings in locations where tip material is to form tip structures.

Figure 18D:
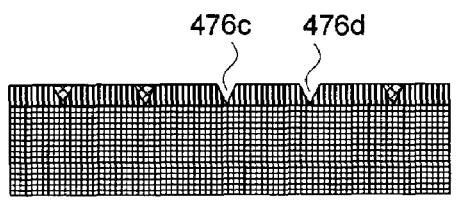

FIG. 18D depicts the state of the process after masking material 472 has been removed.

Figure 18E:
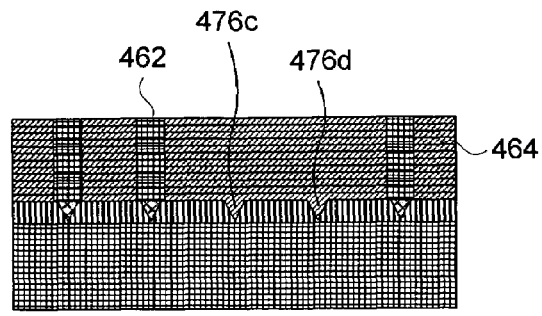
Figure 18F:
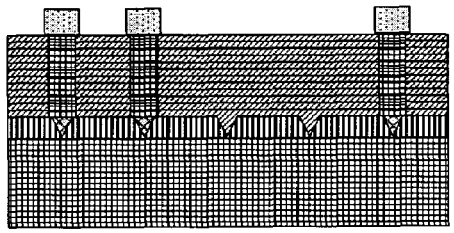
Figure 18G:
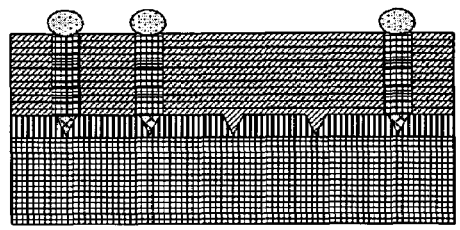
Figure 18H:
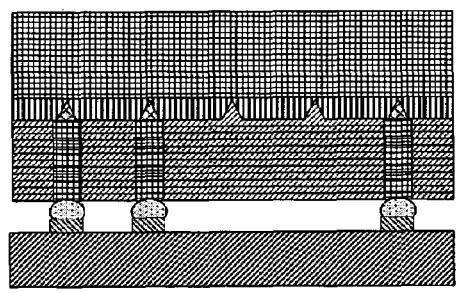
Figure 18I:
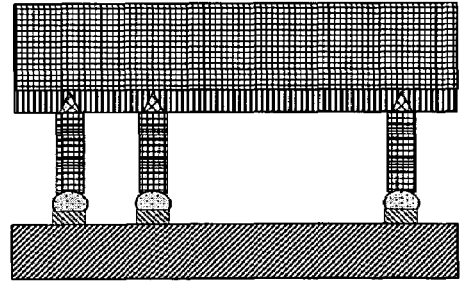
Figure 18J:
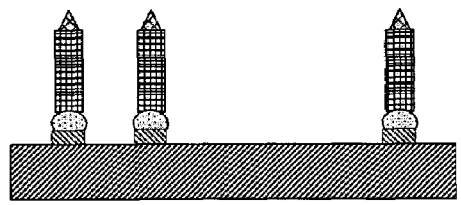

FIG. 18E depicts the state of the process after electrochemical fabrication of a plurality of layers occurs above the probe tip elements. In particular a structural material 462 is deposited along with a sacrificial material 464. In the process of forming the first electrochemically fabricated layer sacrificial material 464 is made to fill in voids 476c and 476d.

FIGS. 18F-18J are similar to FIGS. 17H-17L and thus will not be discussed in detail at this time with the exception of noting that upon final release there are no probe tip elements 474c or 474d that need to be removed.

Figure 19A:
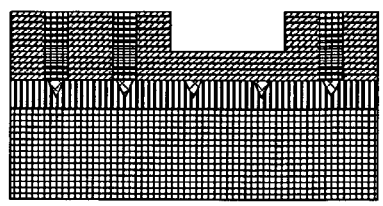
FIGS. 19A-19N schematically depict side views at various stages in an example of a process for forming an array of probe elements according to a thirteenth embodiment of the invention where some probe elements have different heights and different tip configurations and where the probe tip elements are formed using the embossing tools produced according to FIGS. 14A-14D and FIGS. 15A-15D.
Figure 19B:
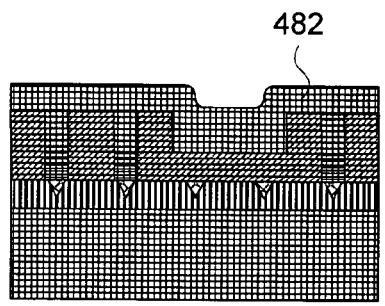
Figure 19C:
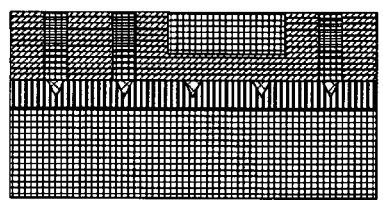
Figure 19D:
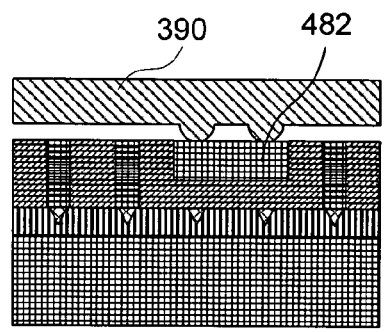
Figure 19E:
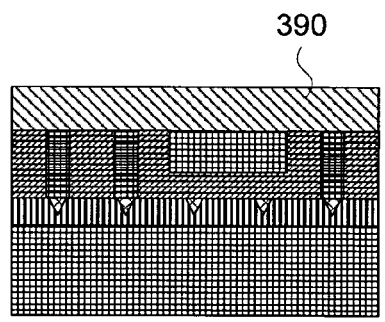
Figure 19F:
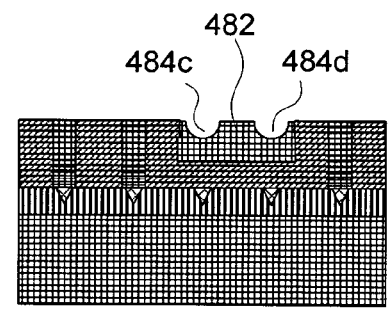
Figure 19G:
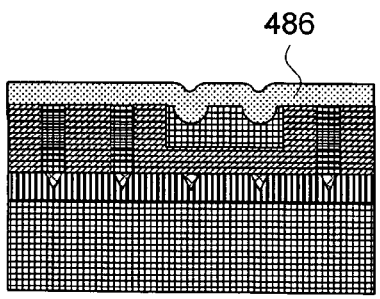
Figure 19H:
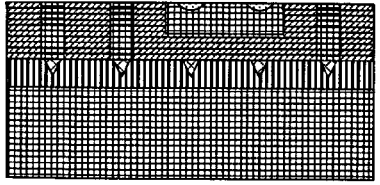
Figure 19I:
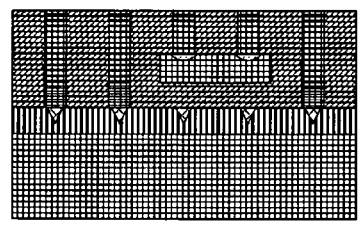
Figure 19J:
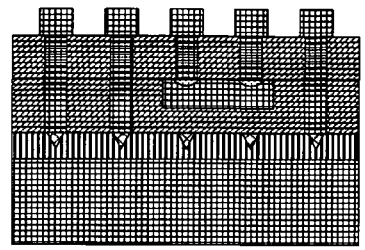
Figure 19K:
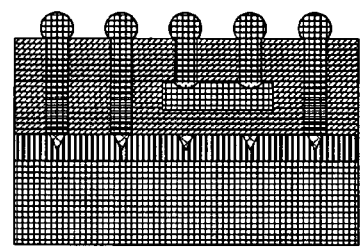
Figure 19L:
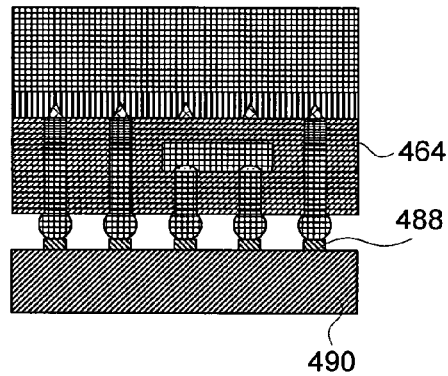
Figure 19M:
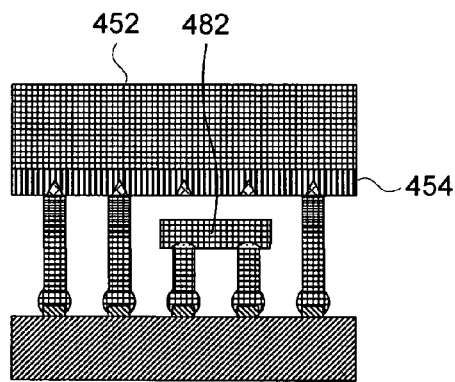
Figure 19N:
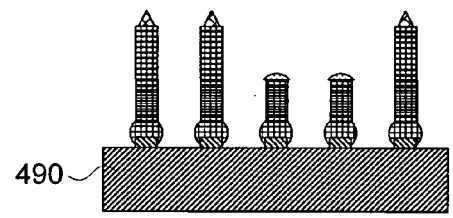

FIGS. 19A-19N schematically depict side views at various stages in an example of a process for forming an array of probe elements according to a thirteenth embodiment of the invention where some probe elements have different heights and different tip configurations and where the probe tip elements are formed using the embossing tools produced according to FIGS. 14A-14D and FIGS. 15A-15D.

The process of FIGS. 19A-19N begins with the state of the process shown in FIG. 17G where an array of microstructures has already been formed.

FIG. 19A depicts the state of the process after an opening has been etched through a number of layers of deposited sacrificial material in the region overlying probe tips 474c and 474d. This etching operation may occur by masking the upper surface of the last formed layer of the structure with a masking material patterning the mask material to have opening located therein above the regions of probes 474c and 474d and then etching into the sacrificial material and thereafter removing the mask.

FIG. 19B depicts the state of the process after an embossable sacrificial material is located in at least the opening etched through the layers of sacrificial material. As shown in FIG. 19B the embossable material 482 is blanket deposited over the previously deposited materials. The embossable material may be tin or indium or the like. In some alternative embodiments the embossable material may be selectively deposited (e.g. via a patterned masking material).

FIG. 19C depicts the state of the process after the deposited embossable material has been planarized to remove it from all locations except where it is filling the opening etched through the sacrificial material.

FIG. 19D depicts the state of the process after embossing tool 390 is located in initial contact with embossable material 482 while FIG. 19E depicts the state of the process after tool 390 has been inserted into an embossable material 482.

FIG. 19F depicts the state of the process after embossing tool 390 has been removed and holes 484c and 484d in embossable material 482 revealed.

FIG. 19G depicts the state of the process after deposition of a desired probe tip material fills holes 484c and 484d in embossed material 482. The probe tip material may be rhenium or rhodium, for example.

FIG. 19H depicts the state of the process after a planarization operation has trimmed the deposited materials back to a level corresponding to that of the last layer of the structure formed. In variations of this embodiment the last layer of structure formed may have been formed with excess height initially, such that the various planarization operations performed could incrementally trim it down until a desired height is achieved as a result of the processing that led to the state depicted in FIG. 19H.

FIG. 19I depicts the state of the process after a number of additional layers of structure have been formed where these additional layers of structure include regions of structural material corresponding to probe elements and regions of sacrificial material located there between.

FIG. 19J depicts the state of the process after all layers of the structures have been formed and after an adhesion or bonding material (for example, tin, tin lead, or other solder-like material) has been selectively deposited over regions of structural material.

FIG. 19K depicts the state of the process after the adhesion material has been reflowed to give it a rounded shape.

FIG. 19L depicts the state of the process after the probe structures have been inverted and located adjacent to bonding pads 488 located on a permanent substrate 490 (e.g. a space transformer).

FIG. 19M depicts the state of the process after adhesion of the probe elements to the permanent substrate 490 has occurred and after sacrificial material 464 has been removed.

FIG. 19N shows the state of the process after sacrificial material 454, substrate 452, and embossing material 482 have been removed thereby yielding a released probe array attached to permanent substrate 490. As can be seen, three of the probe elements have pointed tips while the other probe elements have rounded tip configurations. Similarly three of the elements are more elongated in nature then the other two elements.

Those of skill in the art will understand that use of the processes associated with this thirteenth embodiment of the invention can produce probe element arrays with any combination of numbers of probe elements, different tip configurations (whether as a single height or at multiple heights) single or multiple or variable height probe elements and/or probe elements of different structural configurations (e.g. vertical extending spring like elements), and substantially horizontally extending cantilever type elements).

FIGS. 20A-20E schematically depict side views at various stages in an example of a process for forming a probe element according to a fourteenth embodiment of the invention where the probe tip or tips (only one is shown) are coated with a desired contact material which is protected from a sacrificial material used in forming the probe element.

The process of FIGS. 20A-20E may be used to form a desired coating material on a probe tip while protecting that probe tip material from attack by a sacrificial material etchant or the like that it may not be compatible with.

Figure 20A:
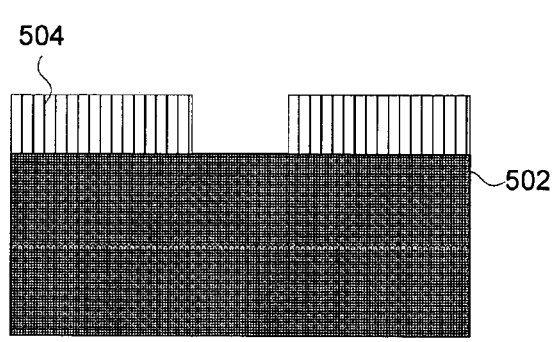
FIGS. 20A-20E schematically depict side views at various stages in an example of a process for forming a probe element according to a fourteenth embodiment of the invention where the probe tip is coated with a desired contact material which is protected from a sacrificial material used in forming the probe element.

FIG. 20A depicts the state of the process after a sacrificial substrate 502 has received a patterned coating of a sacrificial material 504 (for example, copper). Substrate 502 may be of the same sacrificial material as 504 or may be some other sacrificial material or potentially even a structural material that can eventually be separated from a probe tip and possibly reused. The openings over substrate 502 through the sacrificial material 504 correspond to locations where probe tip elements are to be formed.

Figure 20B:
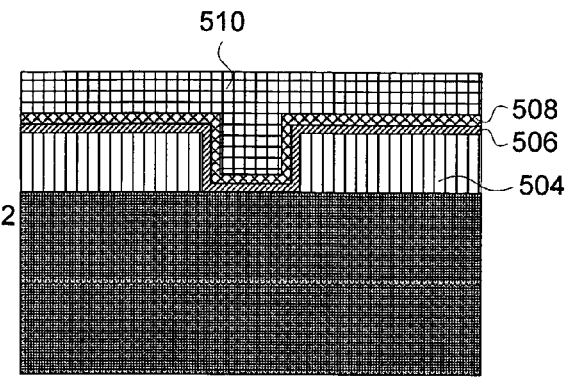

FIG. 20B depicts the state of the process after a blanket deposition of a protective material 506 is made to overcoat both the substrate and the sacrificial material. Next a probe tip coating material 508 is blanket deposited over the protective material 506 and thereafter a structural material 510 is blanket deposited.

Figure 20C:
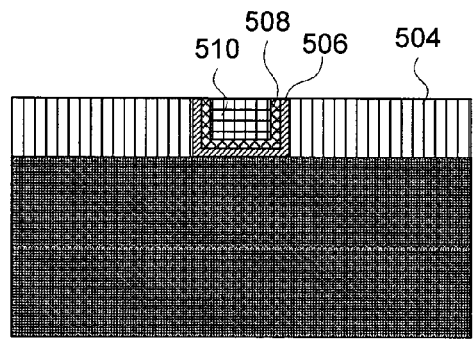

FIG. 20C depicts the state of the process after a planarization operation trims off those portions of the protective material 506, the probe tip coating material 508 and the structural material 510 that overlay regions of sacrificial material 504. As can be seen in FIG. 20C, probe tip coating material 508 is separated from sacrificial material 504 by a coating of the protective material 506.

Figure 20D:
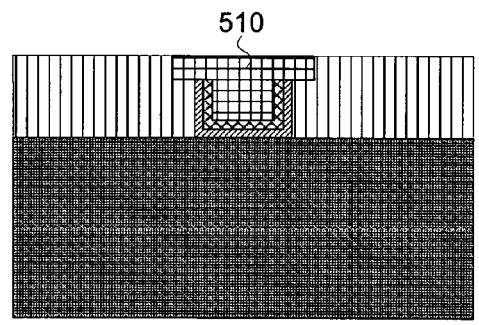

FIG. 20D depicts the state of the process after an additional layer of structural 510 and sacrificial material 504 is added. In particular the structural material forming part of a probe element is provided with an extended width that completely covers the probe tip coating material and the protective material as well. As a result of the selecting of the size and configuration of the second layer to completely overlay the probe tip coating material the probe tip coating material is sandwiched between structural material 510 and protective material 506 and thus any subsequent etching operations that are intended to remove sacrificial material 504 will not cause damage to probe tip coating material 508.

Figure 20E:
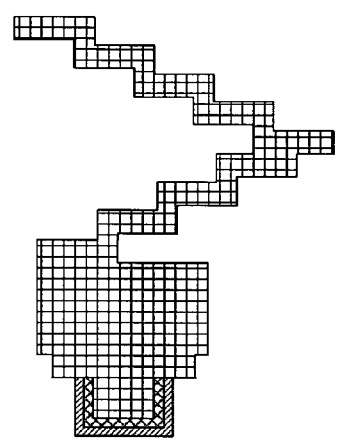

FIG. 20E depicts the state of the process after a spring like probe element has been formed wherein the contact area of the probe element is shown as still being over-coated with the protective material and with the probe tip coating material. In a subsequent operation not shown protective material 506 may be removed to yield a probe element with a desired probe tip coating material.

It will be understood by those of skill in the art that though a single probe tip and probe element have been illustrated in this embodiment the principles set forth in the process of this embodiment may be extended to the simultaneous creation of an array of probe tip elements or a plurality of arrays of probe tip elements.

FIGS. 21A-21F schematically depict side views at various stages in an example of a process for forming a probe element according to a fifteenth embodiment of the invention where the probe tip is given a tapered configuration and a coating of desired contact material is protected from a sacrificial material used in forming the probe element or sacrificial material etchant used in releasing the probe element.

Figure 21A:
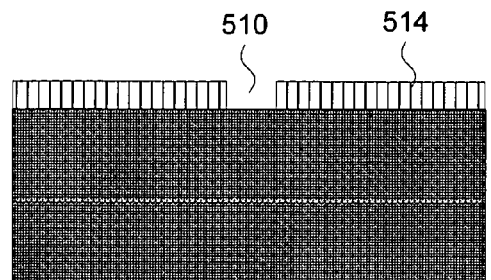
FIGS. 21A-21F schematically depict side views at various stages in an example of a process for forming a probe element according to a fifteenth embodiment of the invention where the probe tip is given a tapered configuration and a coating of desired contact material is protected from a sacrificial material used in forming the probe element or sacrificial material etchant used in releasing the probe element.

FIG. 21A depicts the state of the process after a substrate 512 receives a patterned deposit of a sacrificial material 514. The substrate may be, for example, a structural material that can later be separated from the probe tip or tips that are to be formed or alternatively it may be a sacrificial material that may be destructively removed from the probe tip or probe tip elements that are formed.

In some variations of the embodiment it may be of the same material as sacrificial material 514. In some embodiments of the invention sacrificial material 514 may be copper, tin, gold, or the like.

Figure 21B:
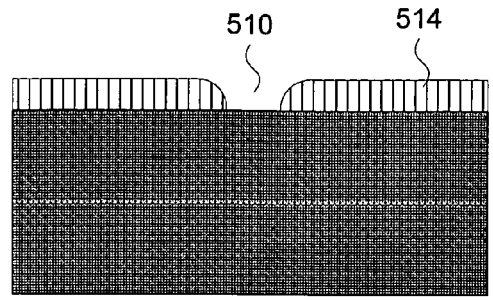

FIG. 21B depicts the state of the process after electrochemical polishing or etching is used to round the corners of the sacrificial material 514 that bound the opening 510 that extends to the substrate 512.

Figure 21C:
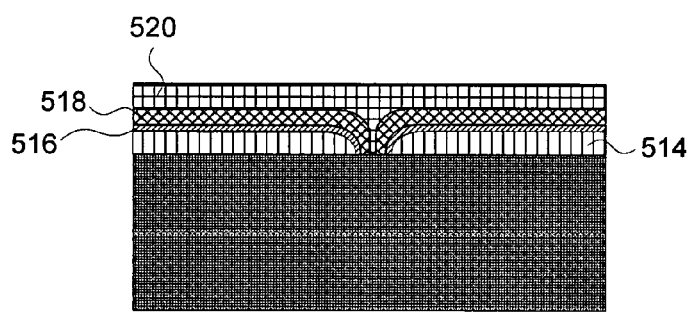

FIG. 21C depicts the state of the process after deposition of a protective material 516, deposition of a probe tip coating material 518 and deposition of a probe tip structural material 520 occurs. In some variations of this embodiment, additional sacrificial material 514 or other releasable material may be deposited to overcoat the sacrificial material and exposed portion of the substrate as seen in FIG. 21B and if desired one or more etching operations may be used to smooth this extra deposited material. This extra release material may be of use when releasing the probe or probes from the temporary substrate 512. If this extra material is deposited, it may be possible to skip the etching step leading to the state shown in FIG. 21B in favor of a subsequent etching operation.

Figure 21D:
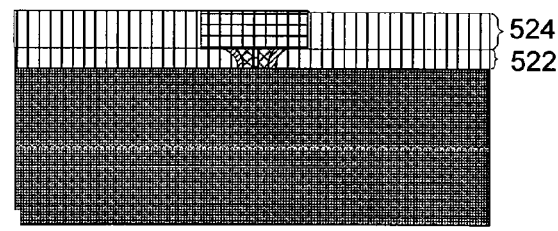

FIG. 21D depicts the state of the process after two additional steps have been performed, the first step is a planarization operation which trims down materials 516, 518 and 520 so that they no longer significant overlay material 514. The second step involves the formation of a next layer 524 over planed layer 522 (e.g. via a selective deposition operation, a blanket deposition operation, and a planarization operation).

Figure 21E:
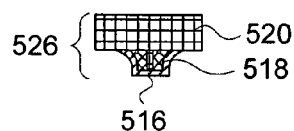

FIG. 21E depicts the probe tip element 526 which has been released from the substrate 512 and sacrificial material 514 where the probe tip element still includes protective material 516 surrounding probe tip coating material 518 and where probe tip coating material 518 was sealed from attack by sacrificial material etchant via both protective material 516 and structural material 520.

Figure 21F:
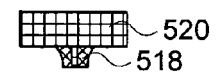

FIG. 21F depicts the state of the process after protective coating 516 is removed leaving probe tip coating material 518 surrounding probe tip structural material 520. The removal of protective coating 516 may occur, for example, by use of a selective etchant or process that attacks the coating material but not the tip material.

FIGS. 22A-22H schematically depict partially transparent, perspective views of an example structure at various stages of a process for forming an array of probe tips and elements according to a sixteenth embodiment of the invention where the probe tips are formed using a silicon mold and the tips are protected from sacrificial material etchants by sealing them between structural material and silicon prior removing sacrificial material.

Figure 22A:
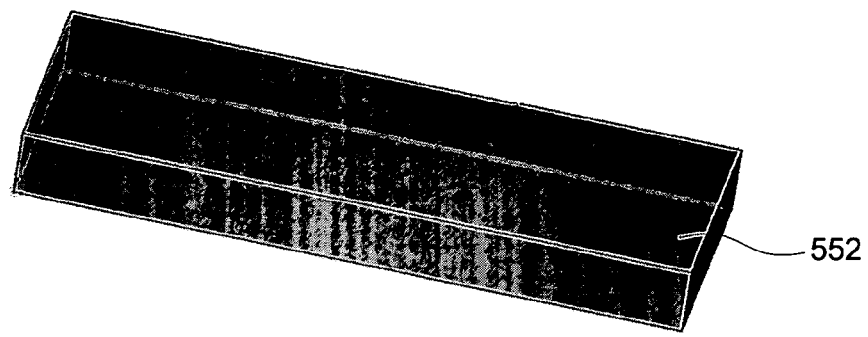
FIGS. 22A-22H schematically depict partially transparent, perspective views of an example structure at various stages of a process for forming an array of probe tips and elements according to a sixteenth embodiment of the invention where the probe tips are formed using a silicon mold and the tips are protected from sacrificial material etchants by sealing them between structural material and silicon prior to removing sacrificial material.

FIG. 22A depicts the starting point of the embodiment which illustrates that a silicon substrate 552 (e.g. having a 100 orientation) is supplied. In embodiments where other tip configurations are desired different substrates could be selected. In the present embodiment the silicon substrate is selected to have low resistance.

Figure 22B:
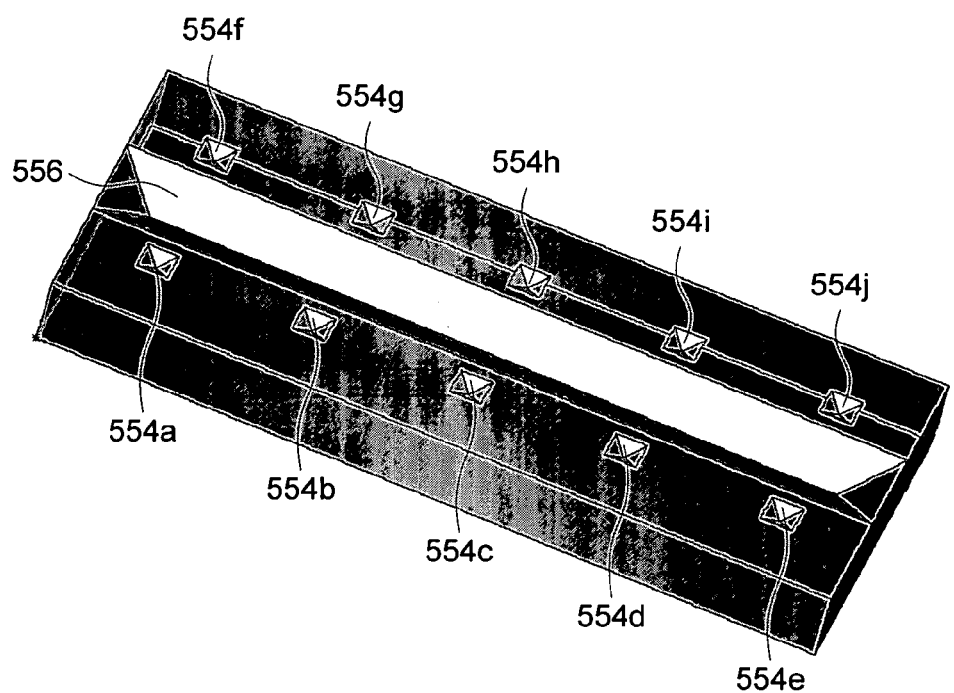

FIG. 22B depicts the state of the process after a number of voids 554a-554j have been etched in the substrate each one corresponding to a probe tip shape and relative position. As illustrated a trench 556 is also etched into the silicon. The formation of such a trench is optional as its use is strictly as an etching aid when it comes time to separate the tip structures from the silicon. The tip configurations may be that of pyramids or wedges formed by use of an anisotropic etchant such as KOH or TMAH and the like. Spherical or semi-spherical configurations may be obtained by using other etchants such as HCN or $XeF_2$. Rounded pyramids or wedges may be obtained by using a combination of etchants.

In variations of the embodiment etching of all openings may be simultaneously performed using a single mask or alternatively multiple masks could be used and etching could be performed at different times.

Figure 22C:
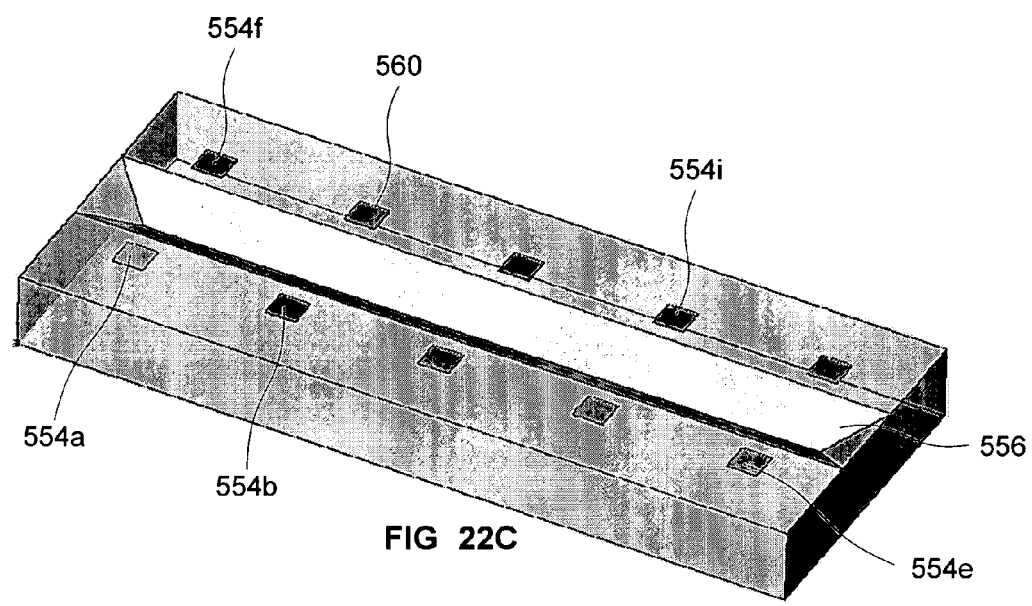

FIG. 22C depicts the state of the process after voids 554a-554j have been filled in with a desired tip material 560. The filling in of voids 554a-554j may occur by an electroplating operation, a sputtering operation or in some other manner. The filling in of the voids may occur with trench 556 masked or with trench 556 open as any deposition tip material in the trench 556 will simply fall away in a later operation. The filling of voids 554a-554j may involve the use of not only a probe tip material but also a probe tip coating material.

Figure 22D:
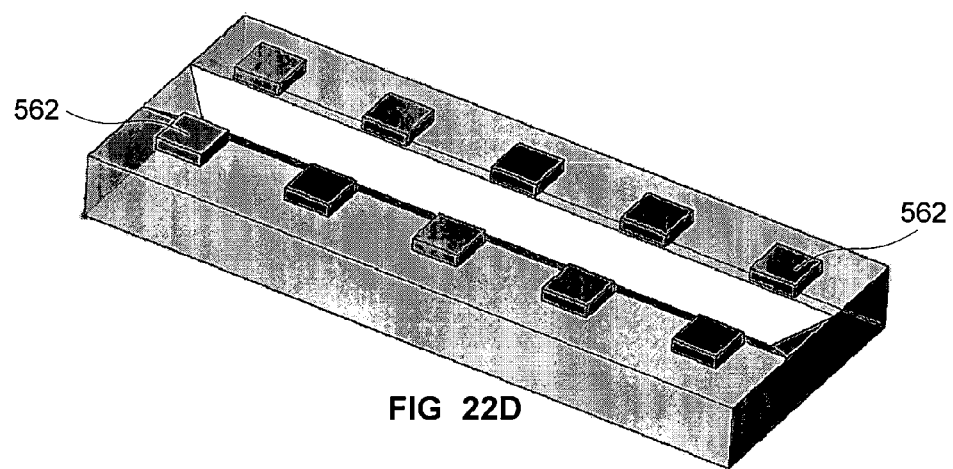

FIG. 22D depicts the state of the process after selective deposition of a structural material 562 forms sealing caps over the probe tip material. The sealing caps preferably cover the region of the probe tip material and more preferably extend beyond the region of the probe tip material to completely enclose the tip material between the silicon substrate and the structural material. If the probe tip material was not deposited in a selective manner, or in a manner otherwise lacking a desired amount of deposition control, then prior to the deposition of the structural material as indicated in FIG. 22D a planarization operation may optionally be used to ensure that the structural material may bond directly to the silicon material.

After deposition of the structural material a sacrificial material may be blanket deposited and the surface planarized leaving an exposed region of structural material over the tip locations and sacrificial material elsewhere (not shown).

Figure 22E:
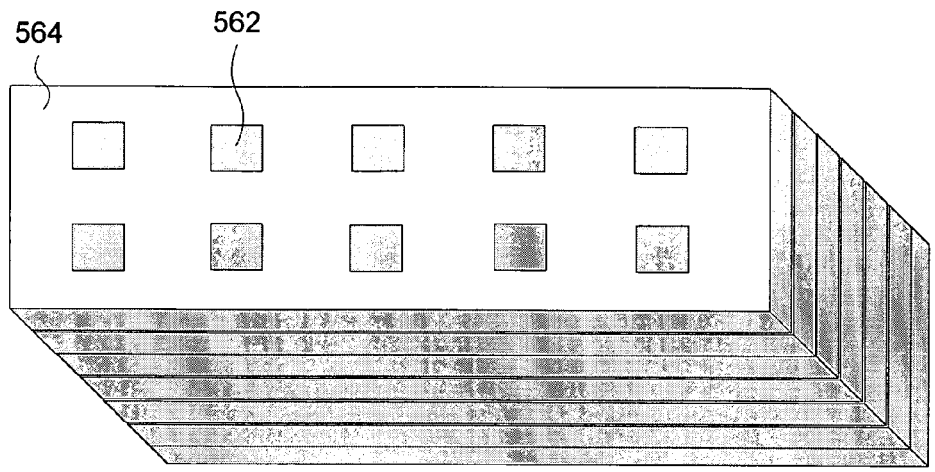

FIG. 22E depicts the state of the process after multiple layers of the main bodies of the probe elements have been formed an adhered to previously formed layer (e.g. via an electrochemical fabrication process, or the like) where the last layer leaves exposed regions of structural material 562, corresponding to the last layer of the probe elements, whose sides are surrounded by sacrificial material 564.

Figure 22F:
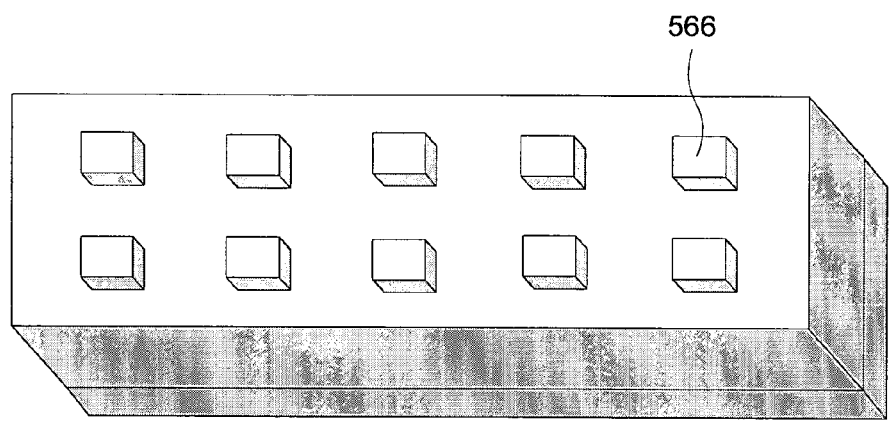
Figure 22G:
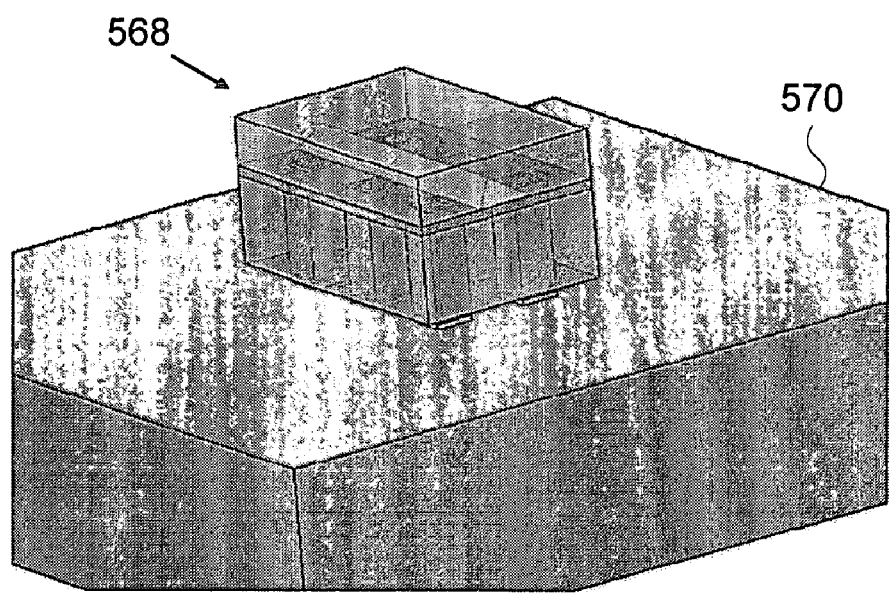

FIG. 22F depicts the state of the process after an adhesion or bonding material 566 is formed over the regions of structural material 562. In variations of the embodiment, the adhesion material 566 may or may not be surrounded by sacrificial material 564. The un-released probe elements may be diced into appropriate sized arrays (e.g. 3×2 array as shown in FIG. 22G) and the probe die 568 flip chip bonded to a desired permanent substrate 570 (e.g. a space transformer) as shown in FIG. 22G. In variations of this embodiment, multiple die may be transferred and bonded either simultaneously or in series to build up larger or more complex array configurations.

Next the sacrificial material is removed via an etching operation that may proceed from the sides of the array towards the center or alternatively the silicon substrate may be ground back to expose the trench area which may be filled with sacrificial material and then etching may proceed from the sides as well as from the central region of the array.

Figure 22H:
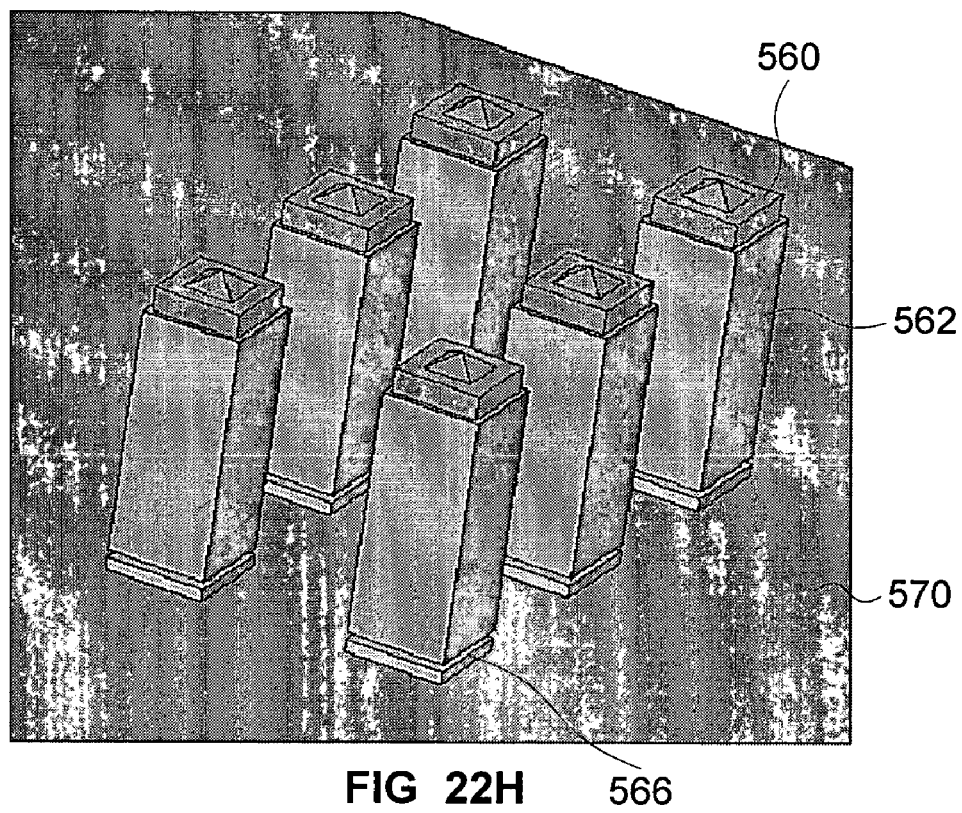

FIG. 22H depicts the state of the process after both the silicon substrate and the sacrificial material have been removed leaving behind probe array 772 formed from a plurality of probes each including a tip, formed of tip material 560, and main body portions, formed of structural material 562 and bonded to a permanent substrate 570 via adhesion material 566. As with the other embodiments described herein, various alternatives to the present embodiment exist. In some such alternatives, the order of bonding, release from sacrificial material, and release from the temporary substrate may occur in different orders.

Figure 23A:
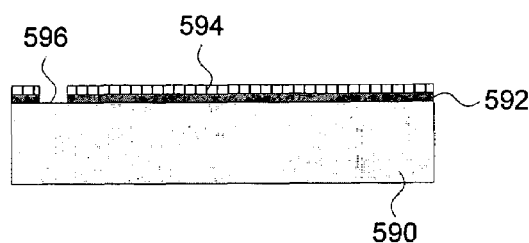
FIGS. 23A-23U schematically depict side views of various stages in an example of a process for fabricating probes of a single height according to a seventeenth embodiment of the invention where mushrooming is used to produce the tips and where an endpoint detection pad is maintained on the substrate during fabrication.
Figure 23B:
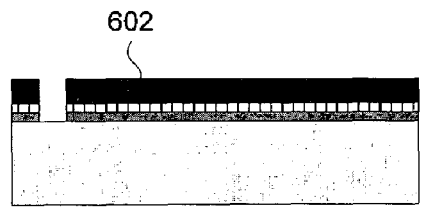
Figure 23C:
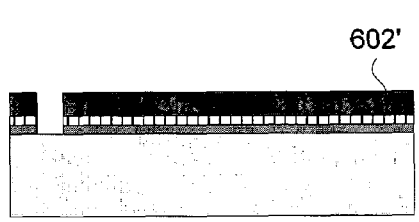
Figure 23D:
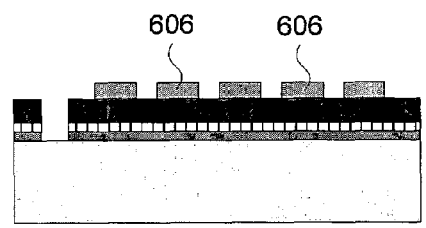
Figure 23E:
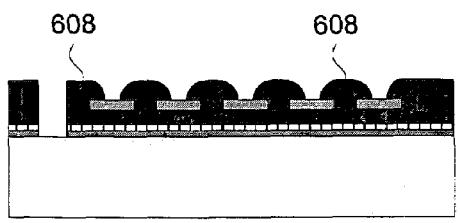
Figure 23F:
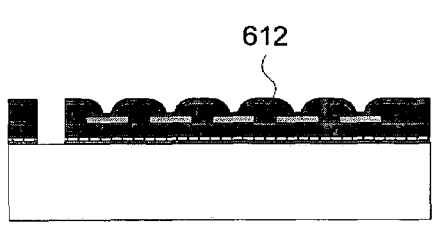
Figure 23G:
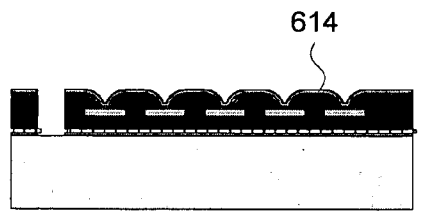
Figure 23H:
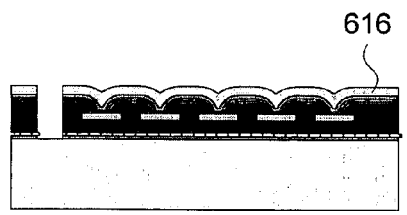
Figure 23I:
Figure 23J:
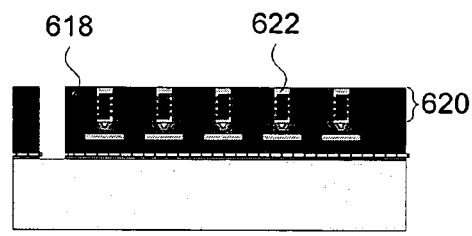
Figure 23K:
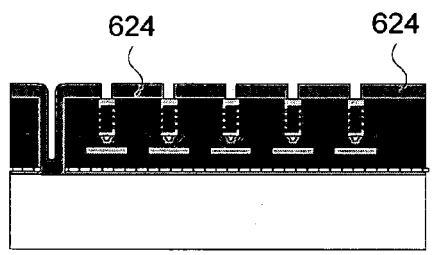
Figure 23L:
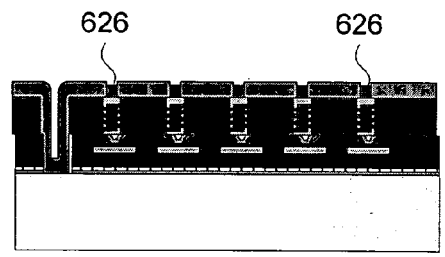
Figure 23M:
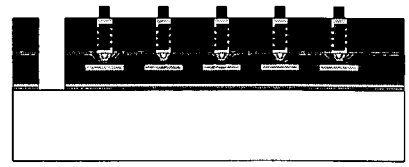
Figure 23N:
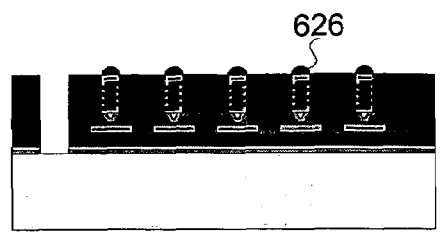
Figure 23O:
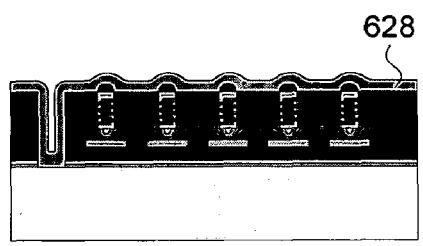
Figure 23P:
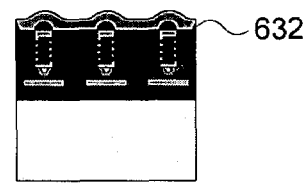
Figure 23Q:
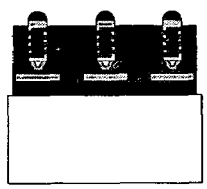
Figure 23R:
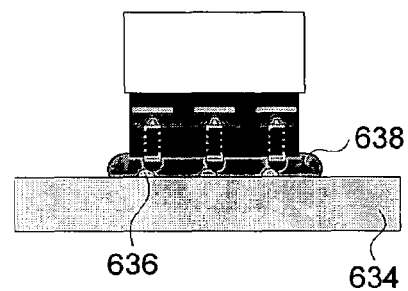
Figure 23S:
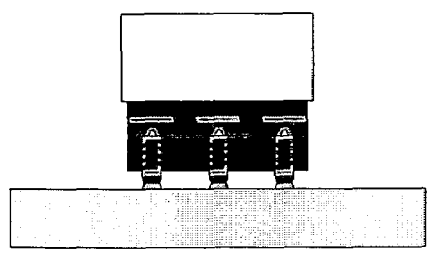
Figure 23T:
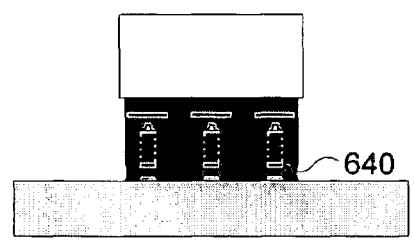
Figure 23U:

FIGS. 23A-23U schematically depict side views of various stages in an example of a process for fabricating probes of a single height according to a seventeenth embodiment of the invention where mushrooming is used to produce the tips and where an endpoint detection pad is maintained on the substrate during fabrication. Endpoint detection pads are useful in establishing planarization heights of the various layers which make up desired structures. More detail concerning use of endpoint detection pads is set forth in U.S. patent application Ser. No. 11/029,220, filed Jan. 3, 2005, by Frodis, and entitled "Method and Apparatus for Maintaining Parallelism of Layers and/or Achieving Desired Thicknesses of Layers During the Electrochemical Fabrication of Structures".

FIGS. 23A-23U depict various stages in an example of a process for fabricating probes of a single height using mushrooming to produce the tips.

In FIG. 23A a temporary wafer 590 (e.g. alumina) coated with a seed layer 592 and an adhesion layer 594 is shown. A blank region 596 on the wafer surface is maintained to allow direct access to end-pointing probes which are used in setting planarization levels and maintaining parallel orientation of successive layers; this can be produced by locally etching the seed and adhesion layers. Other than mushrooming in from the edges of this end-pointing 'pad' region (this mushrooming is not shown in the figures), the pad will not be plated. Either the width of the pad may be set so that mushrooming will not impact usability of the pad, or periodic etching of deposited material may be performed to ensure unencumbered access to the pad, and/or covering of the pad prior to some or all deposition operations may be used to inhibit deposition.

In FIG. 23B a thick layer of sacrificial material 602 (e.g. Cu) is shown as having been applied (e.g. via plating).

In FIG. 23C, it is shown after it has been planarized, if required, to form a release layer 602' of the desired thickness and uniformity.

In FIG. 23D, a thin layer of photoresist has is shown as having been applied and patterned to form insulating structures 606 over which sacrificial metal can mushroom to form molds in which probe tips can be formed.

In FIG. 23E, a sacrificial material 608 (e.g. Cu), which may be the same as or different from sacrificial material 602, has been mushroomed over these insulating structures by plating for a controlled time.

FIG. 23F depicts the state of the process after a sacrificial material 612 (e.g. Cu) has been deposited (e.g. by PVD such as sputtering) over the wafer so that there is a continuous metal film for plating the tip material in a subsequent operation. The sacrificial material 612 may be the same as one or both of sacrificial materials 602 and 608. In some embodiments, if the gap over the photoresist pads is small enough, the deposition of sacrificial material 612 may be skipped. FIG. 23F also shows that any sacrificial material 612 deposited to the end-pointing pad area has been removed (e.g., by etching).

FIG. 23G depicts the state of the process after tip coating material 614 (e.g., Re) has been applied, for example, by plating. If the tip coating material is applied by other than an electrodeposition operation, e.g. PVD, then the previous step of applying Cu by PVD may be bypassed.

FIG. 23H depicts the state of the process after a tip backing material 616 (e.g., Ni) has been plated or otherwise deposited. In some alternatives to this embodiment, tips can be fabricated entirely of the tip coating material 614 thereby eliminating the need for a backing material 616. However, for tip coatings that are too soft (e.g., Au) or for which excess thickness may generate too much residual stress (e.g., possibly with thick Re or Rh), a thin coating is preferred which is backed by another material.

FIG. 23I depicts the state of the process where the wafer has been planarized, resulting in the final form of the tips.

In FIG. 23J the main bodies of the probes (including a base for eventual solder deposition) are shown as having been fabricated from a plurality of deposited layers 620 of at least one structural material 620 and at least one sacrificial material 618.

In FIG. 23K, a thick resist 624 is shown as having been deposited and patterned while in FIG. 23L, a solder or other adhesion material is shown as having been plated or otherwise deposited into openings in the patterned resist.

In FIG. 23M the state of the process is shown after photoresist 624 has been stripped.

In FIG. 23N, the solder 626 is shown has having been reflowed.

FIG. 23O depicts the state of the process after a protective coating has been added to protect the build prior to dicing. This coating, if somewhat hard, can also minimize the degree to which burrs on the top (eventually, the bottom) surface of the die will be produced during dicing. In some alternative embodiments, it may be possible to bypass this coating operation.

In FIG. 23P, the structure or wafer is shown after having been diced, yielding a single probe die holding a plurality of probes (3 probes are shown in this example). Also shown in FIG. 23P is burr 632.

In FIG. 23Q, the die has been partially released (i.e. the protective coating 628 and part of sacrificial material 618 has been removed) in order to remove the burr and recess the sacrificial material 618 surface below that of the adhesion material 626. Recessing of the sacrificial material may help to eliminate the risk of solder wicking out across the sacrificial material and possibly shorting together neighboring probes and may help to separate the adhesion material 626 from the sacrificial material 618 which be useful in allowing an underfill material 640 (see FIG. 23T) to shield the adhesion material (e.g. solder) from sacrificial material etchant that might attack it during release of the probes from the sacrificial material (e.g. during Cu release). A third possible reason for the partial release is to facilitate and reduce the time required for the full release later; in this regard, the release may be continued much further than shown here. The earlier release from sacrificial material is limited only by potential desires to (a) hold all the probes in good alignment until bonded; (b) minimize the risk of damage to the probes prior to bonding); and/or (c) prevent the underfill polymer (if used) from enveloping the probes and interfering with their compliance. In some alternative embodiments, depending on how underfill material is inserted, if the gap is allowed to be too large the underfill may not properly wick in due to reduced capillary pressure.

FIG. 23R depicts the state of the process after the probe die has been flipped and aligned roughly to the bumps 636 on a permanent substrate 634 (e.g. space transformer) and a flux 638 has been applied to either one or both of the probe die and space transformer with the potential benefits of (a) adhering the two together well enough to retain alignment until bonding is completed, and/or (b) minimizing the formation of oxides which can interfere with good bonding.

FIG. 23S depicts the state of the process after the solder has been reflowed, potential performance of self-alignment between the die and the substrate, bonding completed, and the flux removed.

In FIG. 23T the state of the process is shown after an optional underfill material 640 (e.g. curable polymer) has been wicked in, or otherwise drawing in, to fill the space between the probe die and the permanent substrate.

FIG. 23U depicts the state of the process after the bonded die has been fully released from the sacrificial materials 602, 608, and 618. During this process, the sacrificial material-enveloped photoresist features patterned earlier typically fall away or become dissolved and the temporary substrate 590 is removed. If desired, the release process can be stopped and a photoresist stripper used once the resist is exposed, then the release continued. Of course in alternative embodiments, the order of any two or more of bonding, removal of sacrificial material and removal of the temporary substrate may occur in any desired order.

In the next embodiment (embodiment eighteen) a similar approach to that of embodiment seventeen is used but probes of different heights are produced using mushrooming that occurs at different layers or levels in the build process.

When tip-equipped probes of multiple heights are produced with EFAB™, the tips at intermediate heights (i.e., not adjacent to the release layer on the temporary wafer) must typically be formed at the same height as normal layer features that form part of other probes whose tips are at different heights than these (e.g., adjacent to the release layer). A challenge in producing tips at intermediate heights using mushrooming occurs if the tip is taller than the thickness of single layer at the height of the tip, as is often the case unless one is willing to distort the layer thicknesses in this region (undesirable) to accommodate the tip height. Embodiment eighteen provides a process for fabricating tips of intermediate height in which (a) the tip height can be greater than the height of the corresponding layer and (b) the corresponding layer height need not be altered in any way to accommodate the tip.

Figure 24A:
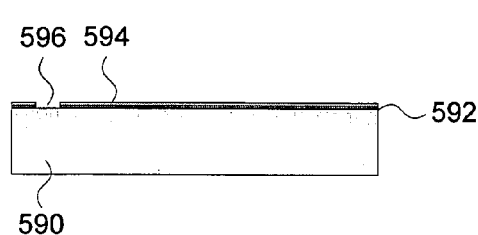
FIGS. 24A-24CC schematically depict side views of various states of an example in a process for fabricating probes of varying height and having tips at different levels during the formation according to an eighteenth embodiment of the invention in which photoresist patterns are used to define the tips through a mushrooming process.
Figure 24B:
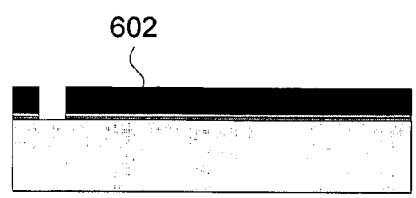
Figure 24C:
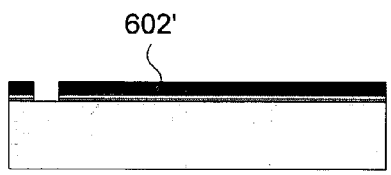
Figure 24D:
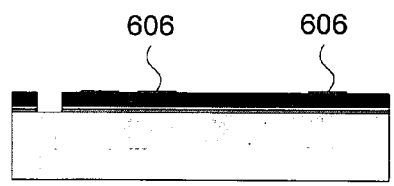

FIGS. 24A-24CC schematically depict side views of various states of an example in a process for fabricating probes of varying height and having tips at different levels during the formation according to an eighteenth embodiment of the invention in which photoresist patterns are used to define the tips through a mushrooming process. In this embodiment the photoresist patterns needed to define the tips through mushrooming are formed at the appropriate layer (i.e. adjacent to where the tips are to be located) but the mushrooming deposition of sacrificial material is deferred until layers are built to a sufficient height to allow the full tip height to be formed. This deferment is accomplished by means of coating the resist with a dielectric film after patterning. Alternative coatings (e.g., with a metal) are also possible, but if such coatings are capable of being platable on, more effort will be required to remove the coatings later as it will first be necessary to remove the metal itself.

Figure 24E:
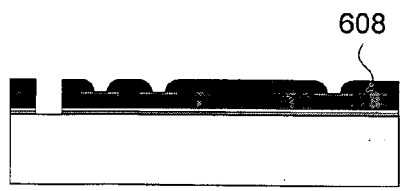
Figure 24F:
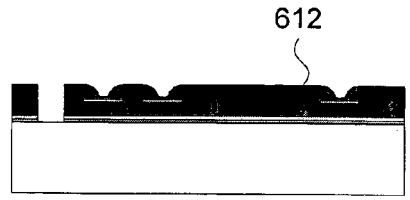
Figure 24G:
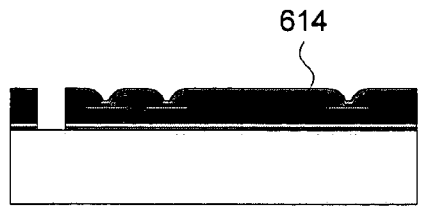
Figure 24H:
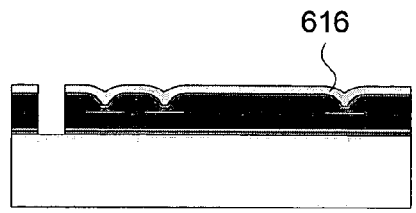
Figure 24I:

In an alternative to the present embodiment (not shown), the mushrooming may be performed in an incremental fashion (e.g., plating of sacrificial material on each layer, which will partially mushroom, or plating extra-thick sacrificial material which may fully mushroom where after the mushroomed shape is planarized (along with the entire layer) to the layer thickness (which truncates the mushroomed shape). These operations are then repeated for several layers, gradually building up the mushroomed 'mold' for the tip. This is expected to result in a tip shape that is not identical to that produced by the mushrooming process shown in FIG. 24E, but this may be acceptable. Indeed, this alternative process may produce more uniform tips than the process of FIGS. 24A-24CC.

FIGS. 24A-24I are equivalent to FIGS. 23A-23I, but in the case of FIGS. 24A-24CC not all probes will be produced full height. In this example, only three are shown with their tips being formed adjacent to the release layer.

Figure 24J:
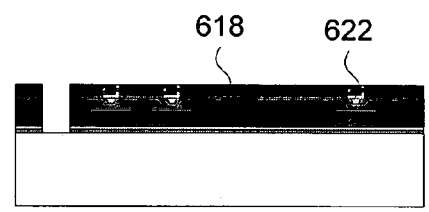

FIG. 24J depicts the state of the process after one or more additional layers of the main bodies of the probes have been formed. The build up stops at the layer which needs to be patterned with photoresist to define the mushrooming of the tips.

Figure 24K:
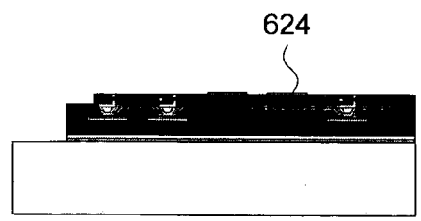

FIG. 24K depicts the state of the process after a thin photoresist 624 has been patterned to form insulating structures over which sacrificial metal can mushroom to form tip geometries.

Figure 24L:
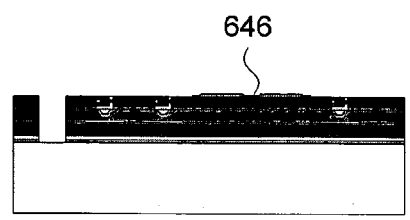

In FIG. 24L the state of the process is shown after the photoresist has been coated with a thin protective dielectric coating 646. The combined thickness of the resist and this dielectric coating should not exceed the layer thickness of the present layer, else the dielectric coating (and possibly the resist) will be damaged by the subsequent planarization of this layer. Depending on the nature of the coating 646 and the type of planarization performed, it may be acceptable to remove a portion of the dielectric coating, so long as enough remains to prevent plating over photoresist pads 624 until an appropriate point in the process is reached.

FIG. 24M depicts the state of the process after a second photoresist 648 for patterning a next layer has been applied while FIG. 24N depicts the state of the process after the second photoresist 648 is patterned to become photoresist 648'.

In FIG. 24O the state of the process is shown after a sacrificial material 618 has been plated. In this embodiment, it is assumed that the probes are fabricated by first pattern-plating sacrificial material on each layer and thereafter blanket depositing structural material. In alternative embodiments, a reversed process may be used. During the plating of sacrificial material 618, there is no plating (other than some sideways mushrooming not shown) over the dielectric coating 646.

FIG. 24P depicts the state of the process after the second photoresist 648' has been stripped leaving voids where structural material is to be deposited.

FIG. 24Q depicts the state of the process after a structural material 622 (i.e. probe material) has been plated.

FIG. 24R depicts the state of the process after the structural material 622 and sacrificial material 618 have been planarized.

Figure 24S:

FIG. 24S depicts the state of the process the operations leading to the states shown in FIGS. 24M-24R have been repeated a desired number of times so that there is sufficient height available to build the entire tip mold by single-step mushrooming operation.

Figure 24T:

FIG. 24T depicts the state of the process after coating 646 has been removed.

Figure 24U:
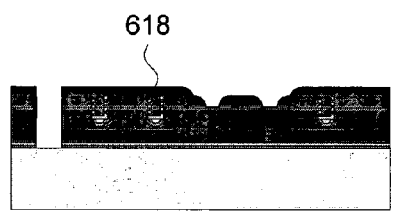

FIG. 24U depicts the state of the process after sacrificial material 618 (e.g. Cu) has been mushroomed over the resist features by plating for a controlled time.

Figure 24V:
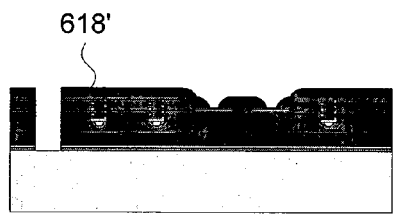

FIG. 24V depicts the state of the process after a thin layer of additional sacrificial material 618' (e.g. Cu) has been deposited in a non-electrolytic manner (e.g. by PVD, such as sputtering).

Figure 24W:
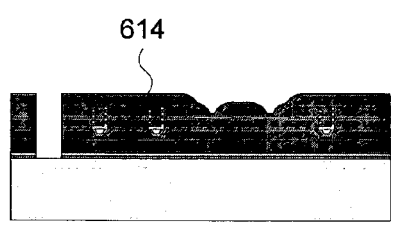

FIG. 24W depicts the state of the process after a tip coating material 614 (e.g. Re) has been applied, for example, by plating. If the tip coating material 614 is applied by PVD, then the previous step of applying Cu by PVD can be bypassed.

Figure 24X:
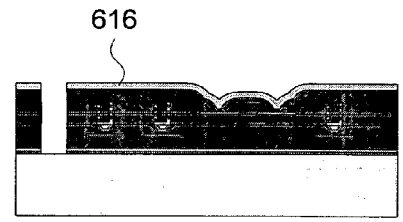

FIG. 24X depicts the state of the process after a tip backing material (e.g. Ni) has been deposited (e.g. via electroplating or electroless plating).

Figure 24Y:

FIG. 24Y, depicts the state of the process after the deposited materials have been planarized, resulting in the final form of the tips.

Figure 24Z:
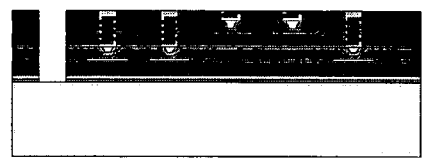
Figure 24A:
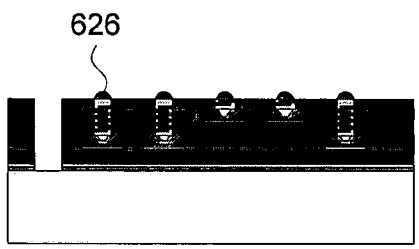
Figure 24B:
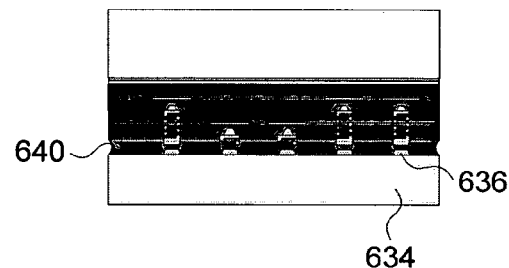
Figure 24C:

FIG. 24Z depicts the state of the process after the remaining layers of the probes (including a base for the solder) have been fabricated.

FIG. 24AA depicts the state of the process after solder has been pattern-deposited and then reflowed.

FIG. 24BB depicts the state of the process after dicing produces probe die and a die has been flipped and the solder reflowed (e.g. in the presence of flux), potentially resulting in self-alignment of the die, bonding of the probes of die to bumps 636 on permanent substrate 634, removal of the flux, and wicking of an underfill 640 (e.g. curable polymer) in to the space under the unreleased probe die.

FIG. 24CC depicts the state of the process after the probe die has been fully released from sacrificial material and from the temporary substrate, resulting in probes with tips at different heights from the surface of the permanent substrate. In alternative embodiments, different numbers of probes may be formed at each level, more than two probe tip levels may be created, compliant portions of probe elements may start at different levels relative to the substrate (e.g. so that all probes have the same compliant length regardless of their starting level), various probes may take on various different geometries, and the like. In still other alternative embodiments, the order of performing various operations may be reversed.

In the above embodiment a single sacrificial material (e.g. Cu) and a single structural material (e.g. Ni) have been focused on but in alternative embodiments more than one sacrificial material and/or more than one structural material may be used.

FIGS. 25A-25D schematically depict side views at various stages of an example process according to a nineteenth embodiment of the invention where a process for forming an undercut dielectric pattern, similar to that of the embodiment of FIGS. 7A-7F, is used and where multiple deposits of photoresist are used in combination with multiple exposures.

Figure 25A:
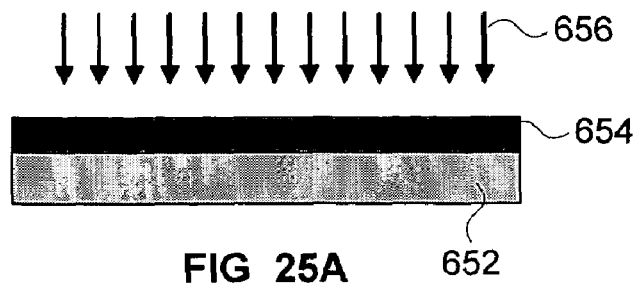
FIGS. 25A-25D schematically depict side views at various stages of an example process according to a nineteenth embodiment of the invention where a process for forming an undercut dielectric pattern, similar to that of the embodiment of FIGS. 7A-7F, is used and where multiple deposits of photoresist are used in combination with multiple exposures.

FIG. 25A depicts the state of the process where a substrate 652 is coated with a positive photoresist material 654 and then is given a relatively small blanket exposure of radiation 656.

Figure 25B:
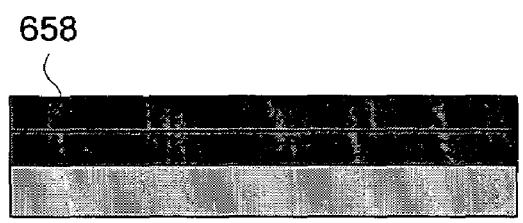

FIG. 25B depicts the state of the process after the first exposed coating of photoresist is over-coated with a second coating of photoresist 658, which may be the same or different from photoresist 654.

Figure 25C:
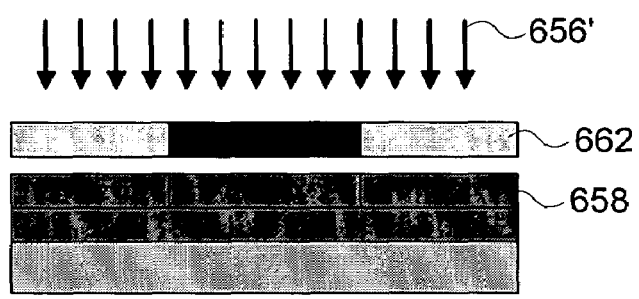

FIG. 25C depicts the state of the process after a photomask 662 is located over or adjacent to coating 658 and a relatively large exposure of radiation 656' is applied to regions where probe tips are to be formed.

Figure 25D:
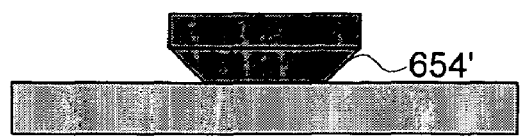

FIG. 25D depicts the state of the process after a development operation causes undercutting of the initial coating 654 of photoresist to form reshaped coating 654'. In subsequent operations (not shown) this mask may by used to deposit a sacrificial material, thereafter it is removed, and a structure tip material is deposited into the void in the sacrificial material. In some alternative embodiments, additional layers of photoresist may be used to define other tip patterns.

A twentieth embodiment of the invention relates to a method of forming tapered tips for microprobes or other applications. It makes use of a contact mask having tapered sidewalls in order to create a deposits of sacrificial material (e.g. Cu) having tapered (i.e. non-normal or non-perpendicular to the surface of a substrate), vs. straight sidewalls (i.e. sidewalls which extend substantially perpendicular to the surface of a substrate). Another unique (though optional) aspect of the contact mask is that it is partly transparent so as to allow alignment to targets on a build substrate or formed on layers themselves. This may be useful (e.g. even for contact masks with straight sidewalls) in that it's a contact mask more like a photomask in terms of alignment requirements (i.e. allowing alignment between contact mask and wafer without having to view each with opposite-facing cameras using special alignment equipment, or the like). A partly-transparent contact mask may be useful for forming tips when it is desired to form tips partway through a build (e.g. to create probes with tips at different heights) in which case alignment to existing geometry (vs. the largely-unpatterned wafer surface) may be useful.

FIGS. 26A-26M schematically depict side views at various stages in an example of a process for making a contact mask and then for using the contact mask in forming tips during a build according to the twentieth embodiment of the invention.

Figure 26A:
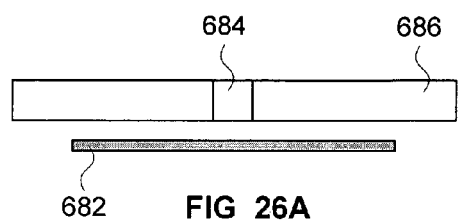
FIGS. 26A-26M schematically depict side views at various stages in an example of a process for making a contact mask and then for using the contact mask in forming tips during a build according to the twentieth embodiment of the invention.
Figure 26B:
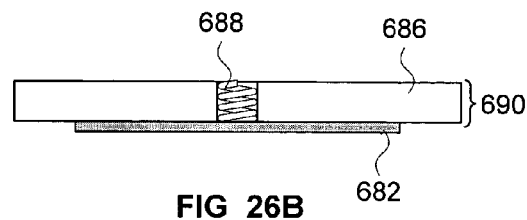

FIGS. 26A-26B depict the two states of a process for forming a contact mask substrate. In FIG. 26A, substrate 682 (e.g. a low-resistivity, i.e. heavily-doped, Si wafer) is shown adjacent to a rigid glass plate 686, larger in diameter than the wafer, having at least one aperture 684 to accommodate a spring contact. In FIG. 26B, the wafer and glass have been bonded (e.g., by anodic bonding) and a spring 688 inserted so as to extend electrical contact from the wafer to the opposite side of the glass. The large diameter, or width of the glass plate allows one to see through the composite contact mask substrate 690 around the edges of the Si wafer. This optical transparency may be useful for purposes of alignment. In some alternative embodiments composite contact mask substrates may include holes drilled, or otherwise bored through, the silicon wafer to allow visual inspection. In other alternative embodiments, a glass ring surrounding the Si wafer may be bonded to the wafer (e.g. via a press fit).

Figure 26C:
Figure 26D:
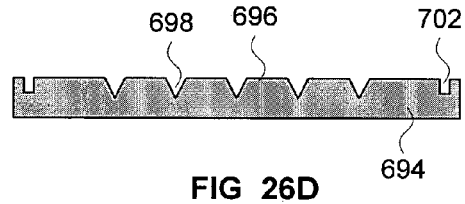
Figure 26E:
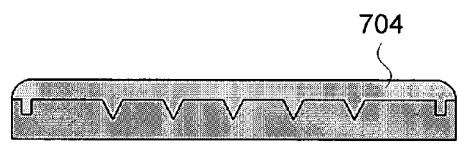

FIGS. 26C-26E depict three states of a process for preparing a mold for shaping contact mask material. In FIG. 26C, a Si wafer 692 is shown.

In FIG. 26D the wafer is shown after it has been anisotropically etched (e.g., using KOH) to form a mold 694 having voids 698 (e.g. pyramids or elongated pyramids with smooth sidewalls having the characteristic angle of about 55° to the surface assuming the Si surface is the 100 crystal plane of Si) located on a patterning surface 696. The mold also may contain alignment targets such as that indicated by reference 702. The patterning surface 696 may also treated be treated in order to provide a non-adherent surface with respect to a comformable masking material (e.g. PDMS) that will be shaped using the mold 694. The treatment may take the form, for example, of a silane treatment or a parylene coating.

FIG. 26E depicts the state of the process after a coating of conformable masking material (e.g. PDMS) has been applied to the patterning surface 696 of mold 694.

Figure 26F:
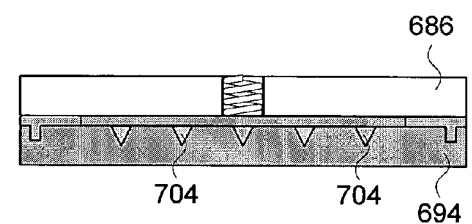

FIG. 26F depicts the state of the process after the silicon side of the contact mask substrate 690 of FIG. 26B has been pressed against the patterning surface 696 of the mold sandwiching masking material 704 between the respective surfaces. The pressing of the surfaces together squeezes out excess conformable masking material 704 leaving behind masking material filling voids 698 and alignment target features 702. The masking material 704 is then cured.

Figure 26G:
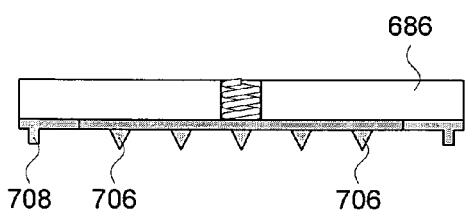

FIG. 26G depicts the state of the process after the contact mask substrate and attached conformable contact material 704, having contact tip region protrusions 706 and alignment mark protrusions 708, have been separated from mold 694 and etching (e.g. RIE) has been performed to remove any excess conformable masking material 704 (e.g. thin sections of material known as flash) from in-between features 706 and 708. The etching process leaves behind bare Si except for those regions 706 and 708 where it is intended that conformable contact material exist.

Figure 26H:
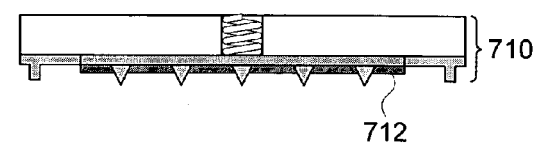

FIG. 26H depicts the state of the process after electrical contact to the Si wafer of the contact mask has been made through the spring and a sacrificial material 712 (e.g. Cu) is plated on the silicon. In some embodiments, a thin layer of an adhesion material, e.g. Ni, may be plated on the silicon prior to plating the sacrificial material to aid the contact mask in holding the sacrificial material. The sacrificial material is added to the contact mask so it may serve as feedstock for the deposition of the sacrificial material when the contact mask is used in subsequent operations. Further details about alternative methods of forming contact masks may be found in above referenced U.S. Pat. No. 6,027,630.

Figure 26I:
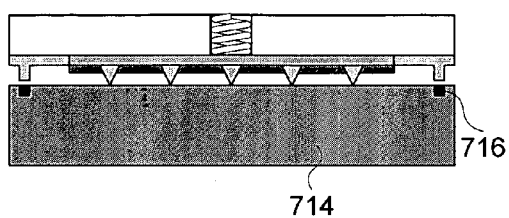

FIG. 26I depicts the state of the process after the contact mask 710 (of FIG. 26H) and a substrate 714 (e.g. an alumina wafer coated with a Ti/Au adhesion/seed layer) have been aligned using the alignment targets 716 on substrate 714 and alignment mark protrusions 708 on contact mask 710 have been mated. In this embodiment, mating is performed using a well-controlled pressure so that conformable contact mask tip regions 708 are not excessively distorted maybe so that flash plating under the tips is minimized or avoided (this is not a particular issue in this embodiment but may be in others). In fact, it may be desirable to form a relatively thick layer of release material between the substrate 714 and probe tips anyway.

Figure 26J:
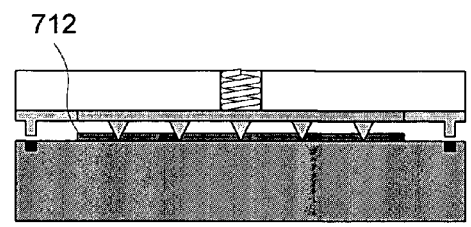

FIG. 26J depicts the state of the process after sacrificial material 712 has been plated to the substrate. The source of the sacrificial material may that material that was initially plated on the mask (when the mask acts as an anode) but additional sacrificial material may be transported from the plating bath or form a secondary anode (not shown). The plating of sacrificial material is blocked and patterned by tips 708.

Figure 26K:

FIG. 26K depicts the state of the process after the contact mask has been de-mated, leaving behind sacrificial material deposits having trenches having a geometry complementary to that of the conformable contact mask material and thus a geometric matching that of the original mold 694.

Figure 26L:
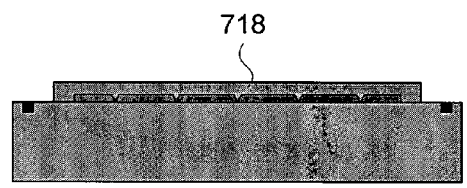

FIG. 26L depicts the state of the process after a tip material 718 has been deposited. In some variations of this embodiment, it may be two materials: (1) a thin film of a contact material, such as Rh, and (2) a thicker film of backing material, such as Ni).

Figure 26M:
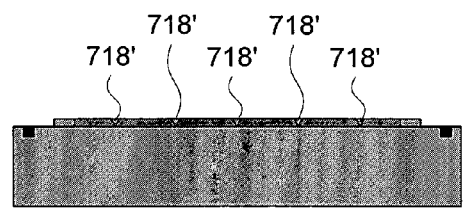

FIG. 26M depicts the state of the process after the layer of tip material 718 has been planarized, producing an array of tips 718'. In subsequent operations, standard EFAB processing, or other processing, may be performed to fabricate the main bodies of probes in alignment with the fabricated tips. In some variations of the embodiment, analogous processes may be used to fabrication tips at different heights when forming probes having different contact levels.

Figure 27A:
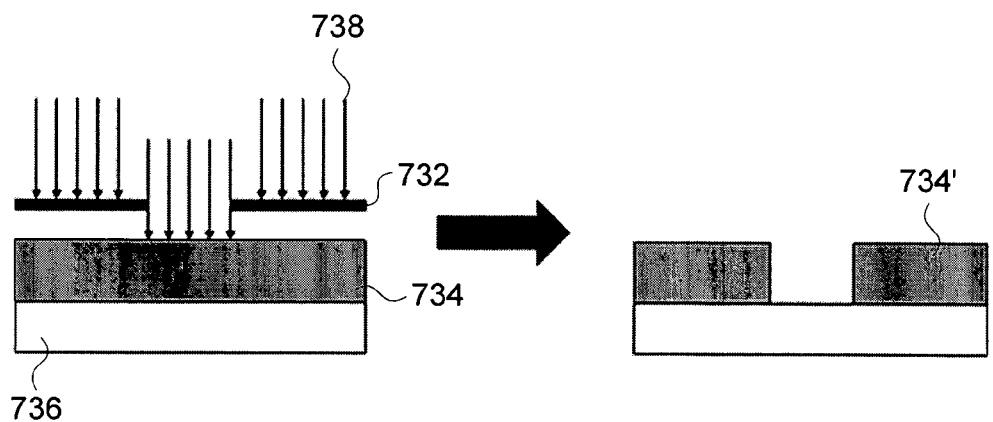
FIGS. 27A-27B help illustrate a twenty-first embodiment of the invention where probes tips are formed using a photoresist as a masking material for receiving probe tip material where the photoresist is patterned to have tapered or sloped sidewalls.
Figure 27B:
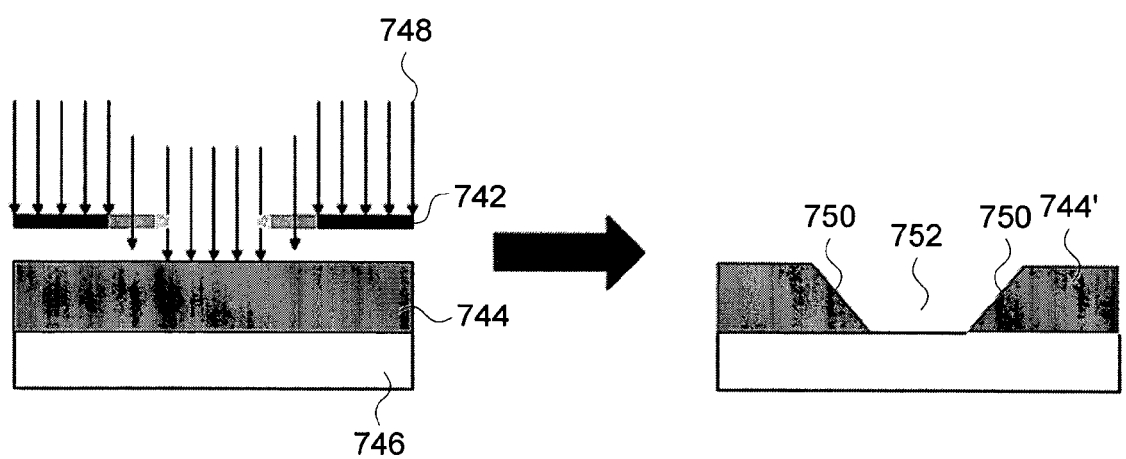

FIGS. 27A and 27B depict another embodiment for making probes tips where a photoresist is used as a masking material into which probe tip material may be deposited and where the photoresist is patterned to have tapered or sloped sidewalls. In particular, FIG. 27B illustrates part of a twenty first embodiment of the invention. For contrast purposes, FIG. 27A is provided and depicts a standard photomask 732 being used to selectively apply ultraviolet radiation 738 to a photoresist 734 located on a substrate 736. After exposure and development, a stair stepped photoresist pattern 734' (i.e. a pattern with vertical sidewalls) is obtained. FIG. 27B depicts the use of a gray scale photomask 742 that allows varying exposure of a photoresist 744 located on a substrate 746 to ultraviolet light 748. After development, if the exposure is applied in an appropriately controlled manner and if the development is also applied in an appropriately controlled manner, sloped sidewalls 750 of an opening 752 in photoresist 744 is obtained. Probe tips may be fabricated by plating a suitable metal into the mold. If necessary, prior to plating, a seed layer and/or a release layer may be deposited in the opening. In other embodiments, a release layer may exist on substrate 746. In some specific embodiments the photoresist may be, for example, AZ 4620.

Figure 28A:
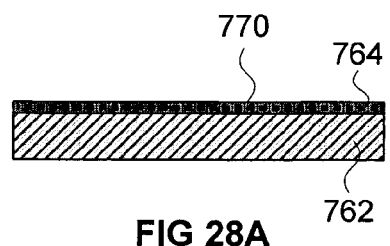
FIGS. 28A-28S schematically depict side views at various stages in an example of a process according to a twenty-second embodiment of the invention where probes are formed right side up on a first substrate with tips formed last and where after formation, the probes may be transferred to a permanent substrate.
Figure 28B:
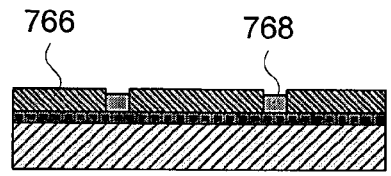
Figure 28C:
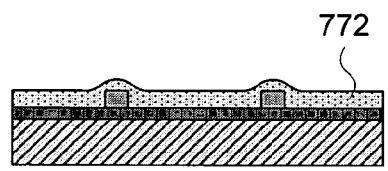
Figure 28D:
Figure 28E:
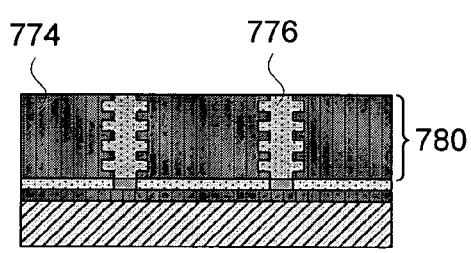
Figure 28F:
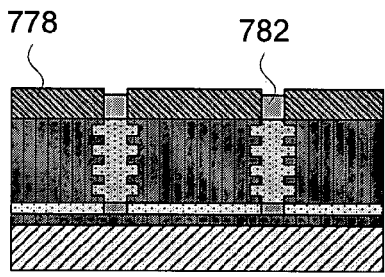
Figure 28G:
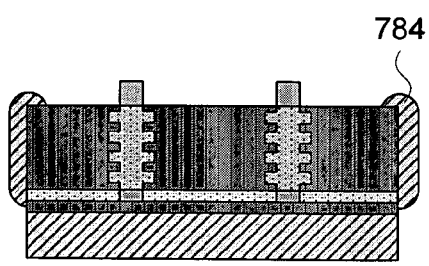
Figure 28H:
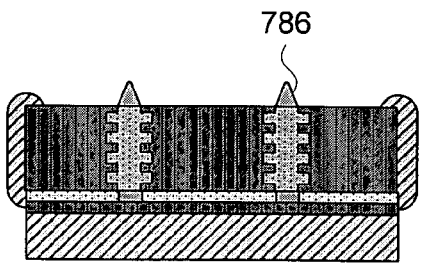
Figure 28I:
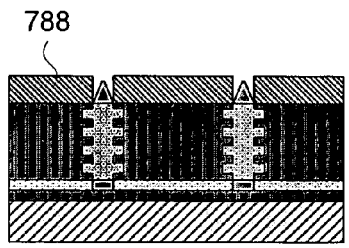
Figure 28J:
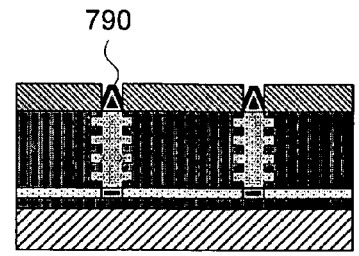
Figure 28K:
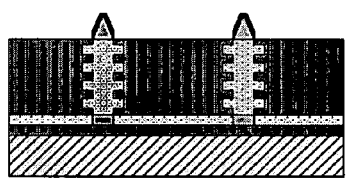
Figure 28L:
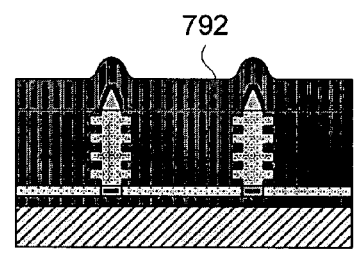
Figure 28M:
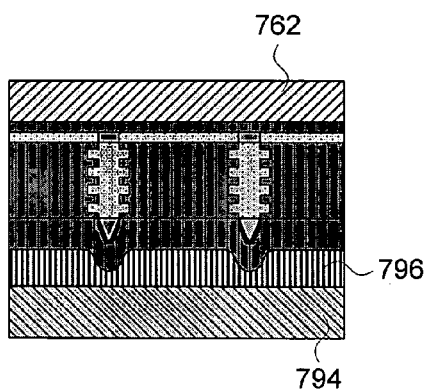
Figure 28N:
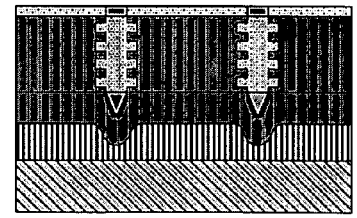
Figure 28O:
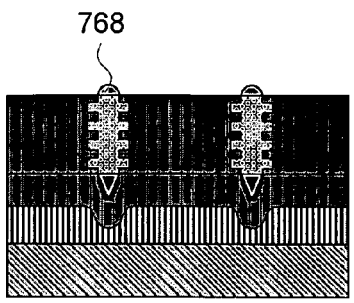
Figure 28P:
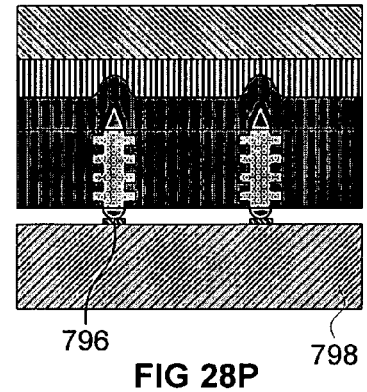
Figure 28Q:
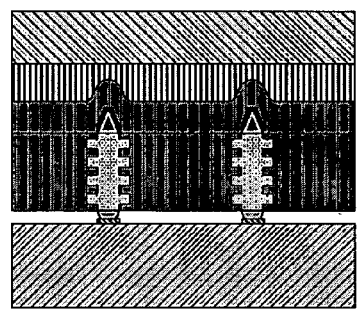
Figure 28R:
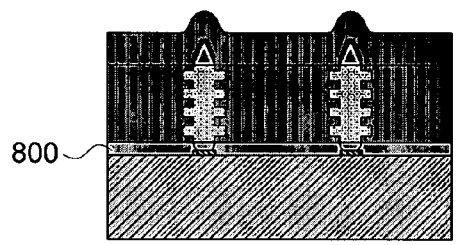
Figure 28S:
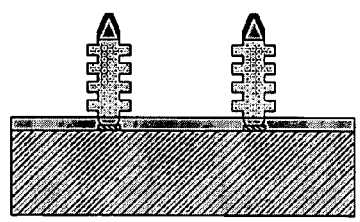

FIGS. 28A-28S schematically depict side views at various stages in an example of a process according to a twenty-second embodiment of the invention where probes are formed right side up on a first substrate with tips formed last and where after formation, the probes may be transferred to a permanent substrate.

FIG. 28A depicts the state of the process after a first substrate 762 (e.g., alumina) with a thick seed layer 764 of sacrificial material 770 (e.g., Cu). An adhesion layer (e.g., Ti—W, not shown) may be used underneath the seed layer if needed.

FIG. 28B depicts the state of the process after a photoresist 766 has been patterned and a solder or other adhesion material 768 has been plated into the apertures in the patterned photoresist.

FIG. 28C depicts the state of the process after the photoresist 766 has been stripped and a removable material 772 has been applied (e.g. a sacrificial material such as a material that can be melted at a lower temperature than solder or etched without damage to the solder).

FIG. 28D depicts the state of the process after the layer of removable material 772 has been planarized. This material is assumed here to be conductive and capable of being plated with a second sacrificial material 774 with good adhesion. If it lacks such properties, a suitable seed layer and possibly adhesion layer may be applied.

FIG. 28E depicts the state of the process after the main bodies of probe structures have been fabricated from multiple layers 780 of at least one structural material 776 and at least one sacrificial material 774.

FIG. 28F depicts the state of the process after, photoresist 778 has been applied and patterned on the last layer of the multiple layers 780 and a relatively tall deposit of material of probe tip core material 782 (e.g., Ni) has been plated or otherwise deposited.

FIG. 28G depicts the state of the process after, stripping of photoresist 778 has occurred and after the edges of the wafer have been coated with a protective material 784 (e.g. a lacquer or a wax).

FIG. 28H depicts the state of the process after electrochemical, or chemical, etching has been performed under conditions that result in a sharpening of the protruding deposited metal structures. Such controlled etching may be implemented via shielding material that is made to coat portions o the tip core material. Alternatively, such etching may occur by progressively immersing the tip core material into an etchant. In still other embodiments adequate shaping may be obtained from a simple electrochemical etch that preferentially attacks sharp corners. In other alternative embodiments, other methods may be used to ensure appropriate shaping of the tip core material 782 is obtained so that tips 786 are formed. Some etching of the sacrificial material surrounding the probes may also occur during tip shaping. If excess attack of the sacrificial material occurs it may be protected (e.g., by application and patterning of a resist) prior to the etching.

FIG. 28I depicts the state of the process after a resist 788 has been patterned so as to expose the sharpened tips.

FIG. 28J depicts the state of the process after a tip coating material 790 (e.g., Rh or Re) has been deposited over the tips 786.

FIG. 28K depicts the state of the process after, the resist 788 has been stripped.

FIG. 28L depicts the state of the process after a sacrificial material 792 has been deposited, which may be the same or different from sacrificial material 774 so as to envelop the tips, although this step can be eliminated, for example, if the adhesive 796 as shown in FIG. 28M is sufficiently thick to accommodate the tip height.

In FIG. 28M depicts the state of the process after, the structure shown in FIG. 28L has been flipped and attached to a second substrate 794 using an adhesive 796 that is capable of tolerating the temperatures and materials associated with subsequent processing. If desired, the sacrificial material applied as shown in In some alternative embodiments, prior to performing the flipping and bonding that lead to the state shown in FIG. 28M, the sacrificial material 792 may be planarized. Such planarization may allow a thinner coating of adhesive 796 to be applied.

FIG. 28N depicts the state of the process after the first substrate 762 and seed layer 764 have been removed (e.g., by dissolution of the seed layer).

FIG. 28O depicts the state of the process after, the removable material 772 is removed and after the solder 768 is reflowed. In some variations of the this embodiment, it may be desirable to minimize heating of the adhesive and in such cases heating to remove the removable material and/or to reflow the solder may occur via localized IR heating or a localized flow of hot air.

FIG. 28P depicts the state of the process after, the structure shown in FIG. 28O has been flipped over and placed onto a third substrate 798 (e.g. a space transformer, or other electronic device) that is provided with bonding pads 796.

FIG. 28Q depicts the state of the process after the solder 768 has been reflowed and the probes bonded to the third substrate.

In FIG. 28R depicts the state of the process after the second substrate 794 has been removed (e.g., by removing the adhesive coating) and after an underfill 800 (e.g. a permanent underfill) has been drawn into the gap between the main bodies of the probes and the third substrate (e.g. via wicking or evacuation, coating, and repressurization). The underfill may be used to improve bonding between the probes and the substrate and/or to protect the solder from the etchant that will be used to release the probes from the sacrificial material.

In FIG. 28S depicts the state of the process after the sacrificial material 774 has been etched, leaving behind probes bonded to the third substrate.

In various alternatives to the above embodiments other techniques may be used to get desired probe tip configurations. For example probe tip cores may be created and then sharpened after transfer and release (e.g. via chemical or electrochemical etching. In other alternatives, the main bodies of the probes may be treated to preferentially enhance their resistance to etching that may occur during sharpening, for example, via oxidation or an appropriate CVD reaction.

Figure 29A:
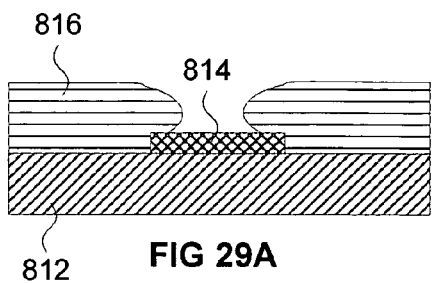
FIGS. 29A-29D depict schematic side views of various states of a process where trumpet-like flares of probe tips are generated when using some sacrificial material mushrooming embodiments as presented herein above.
Figure 29B:
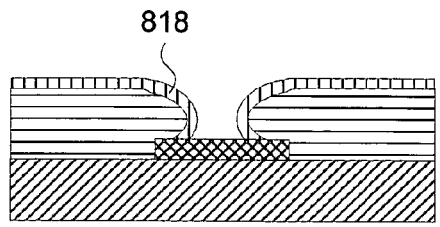
Figure 29C:
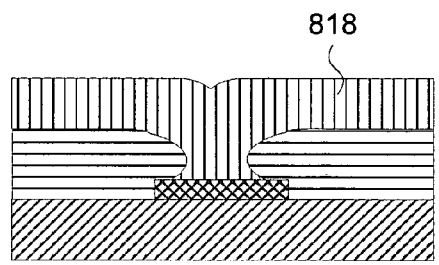
Figure 29D:
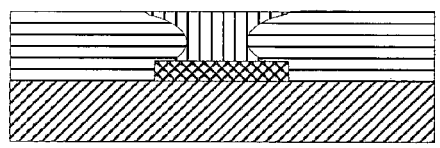

In various embodiments set forth herein tip formation occurs via a process that makes use of an electroplating mushrooming effect where overplating and horizontal spreading of a sacrificial metal over a patterned photoresist layer forms a sacrificial mold that is used to shape the tips. In some implementations of such techniques, it has been noticed that overplating (i.e. mushrooming) may produce a bulge in the mushroomed sidewalls of the sacrificial metal which in turn can result in trumpet shaped flaring of probe tips when tip material is deposited into such openings. This effect is depicted in FIGS. 29A-29D. FIG. 29D depicts the state of the process after sacrificial material 816 mushrooms over photoresist 814 that is located on a substrate 812. As can be seen the side walls of the sacrificial material extend inward further when some distance from the photoresist than when the sacrificial material is adjacent to the photoresist. FIGS. 29B and 29C depict states of the process after deposition of tip material 818 starts (FIG. 29B) and is completed (FIG. 29C). FIG. 29D depicts the state of the process after planarization trims off excess tip material. As can be seen, the tip material 818 in contact with the photoresist has a greater horizontal width than it does some distance above the photoresist. If such flaring is undesired and is likely to occur, an enhanced tip formation process may be implemented according to a twenty-third embodiment of the invention. An example of such a process is illustrated in FIGS. 30A-30D.

Figure 30A:
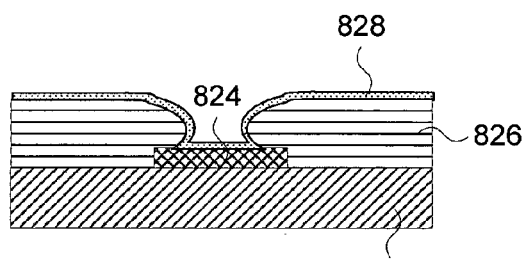
FIGS. 30A-30D depict schematic side views of various states in an example of a process according to a twenty-third embodiment of the invention which can be used to control or eliminate flaring of probe tip material.
Figure 30B:
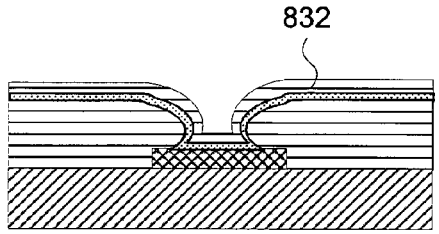
Figure 30C:
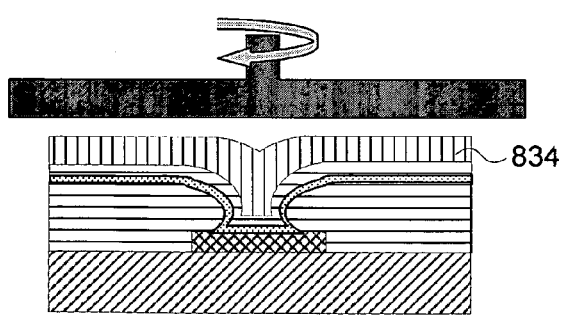
Figure 30D:
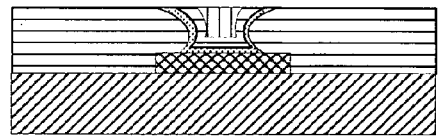

FIG. 30A depicts the state of the process after (1) a conductive substrate (e.g. a metallic substrate or a dielectric substrate with a deposited seed layer) receives a thin layer of photoresist (e.g. via spin coating) that is patterned with an appropriate geometry (as shown) or geometries (not shown) for a desired tip shape and size and (2) plating of a sacrificial material is performed as per the previously discussed fabrication methods but using a very low current density which may lead to a bulge in the side walls of the sacrificial material, and (3) a non-electroplating deposition of a secondary seed layer material 828 and possibly adhesion layer material occurs (e.g. via a PVD deposition, such as sputtering of a TiW/Cu) that will conformably coat all available surfaces. The secondary seed layer will coat all surfaces including the space underneath the bulge in the photoresist. FIG. 30B depicts the state of the process after a thin layer of sacrificial material 832 (e.g. Cu) is electroplated over the secondary seed layer 828. It is believed that the low plating current density will reduce the amount of bulging that will occur. FIG. 30C depicts the state of the process after tip material 834 is blanket plated to fill in the hole. FIG. 30D depicts the state of the process after planarization (e.g. lapping and possibly polishing) trims excess material away. This process results in the formation of tips with less or no flaring and subsequent operations may thereafter be performed in pursuit of completing fabrication of probes or the like. By using a secondary seed layer and a subsequent electroplated sacrificial material (e.g. copper) layer, any region under a bulge is filled in prior to deposition of tip material. Thus when the tip material is electroplated, it will not form a flared lip at it leading surface.

In variations of the above embodiment, one or more additional structural materials may be deposited after a thin layer of tip material is deposited. This may allow a thin layer of tip material to be backed by a thicker layer of structural material as discussed herein previously. In some variations of the above embodiment, a polymer may be used to fill in the space underneath the bulge created by the mushroomed sacrificial material (e.g. copper). First the polymer may be made to fill the entire hole and then it may be preferentially removed from the central portion of the hole and a seed layer deposited in preparation for depositing tip material. This preferential removal of the polymer may be accomplished by either simply pouring the polymer out of the hole while allowing surface tension to keep the polymer in the region underneath-the-bulge. After removal of excess polymer, the remaining polymer may be cured. In embodiments of this type, the polymer may be made very thin liquid to allow flow to occur in reasonable time periods and in opening of relatively small size. A second alternative may be to allow the polymer to set, then use directional plasma etch to remove the polymer from the surface of the mushroomed sacrificial material and the bottom of the hole, but letting it remain behind in the undercut regions.

FIGS. 31A-31D depict schematic side views of various states in an example of a process according to a twenty-fourth embodiment where a liquid polymer is made to fill openings in mushroomed sacrificial material, excess polymer is removed and residual polymer remains to fill shadowed regions beneath bulges in the sacrificial material.

Figure 31A:
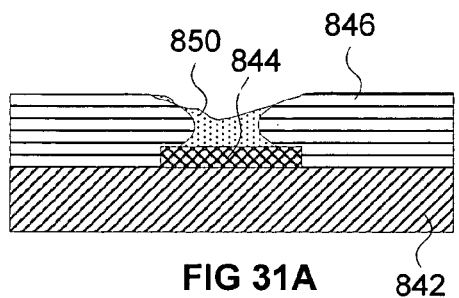
FIGS. 31A-31D depict schematic side views of various states in an example of a process according to a twenty-fourth embodiment where a liquid polymer is made to fill openings in mushroomed sacrificial material, excess polymer is removed and residual polymer remains to fill shadowed regions beneath bulges in the sacrificial material.
Figure 31B:
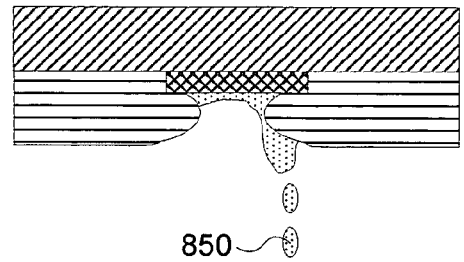
Figure 31C:
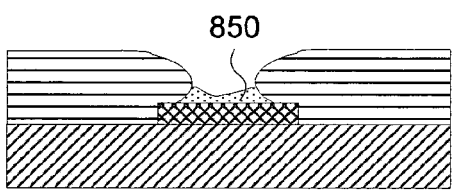
Figure 31D:
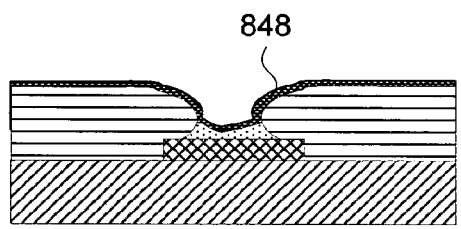

FIG. 31A depicts the state of the process after formation of sacrificial material 846 that has mushroomed over a photoresist 844 which is located on a substrate 842 with a polymer 850 filling an opening over the photoresist 844. FIG. 31B depicts the state of the process during removal of a portion of the liquid polymer by pouring it out. FIG. 31C depicts residual polymer remaining in the bottom of the hole and filling the region underneath the bulge. FIG. 31D depicts the state of the process after deposition of a seed layer 848 over the entire topology occurs in preparation for depositing tip material. In subsequent operations tip material may be deposited and formation of remaining portions of probes can occur.

Figure 32A:
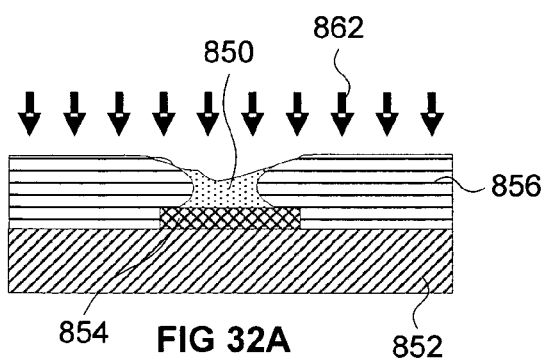
FIGS. 32A-32B depict schematic side views of various states in an example of a process according to a twenty-fifth embodiment where a directional plasma etch is used to remove a selected polymer that fills openings in mushroomed sacrificial material while leaving behind the polymer to fill shadowed regions beneath bulges in the sacrificial material.
Figure 32B:
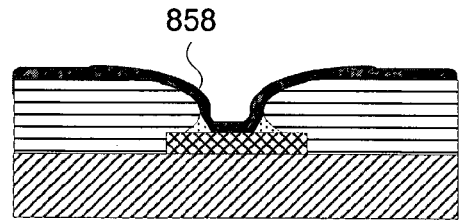

FIGS. 32A-32B depict schematic side views of various states in an example of a process according to a twenty-fifth embodiment where a directional plasma etch is used to remove a selected polymer that fills openings in mushroomed sacrificial material while leaving behind the polymer to fill shadowed regions beneath bulges in the sacrificial material.

FIG. 32A depicts plasma 860 bombarding a polymer 860 filling an opening within sacrificial material 856 that has mushroomed over photoresist or other dielectric material 854 which is located on substrate 852. The plasma is applied in a directional manner and preferentially removes exposed up-facing surfaces of the polymer while leaving polymer to fill shadowed regions under any bulging of the sacrificial material 856. FIG. 32B depicts the state of the process after etching has removed a substantial amount of the polymer leaving only that polymer which is shadowed by the sacrificial material and after deposition of a seed layer has occurred in preparation for depositing tip material. In subsequent operations, tip material may be deposited and probe elements formed and released and/or transferred to a permanent substrate.

In some other alternative embodiments, it may be possible to perform an etch of the mushroomed sacrificial material (e.g. copper) to try to reduce the size of the bulge. This may be especially useful in bulges that are particularly pronounced. This alternative may take advantage of the tendency for electrochemical etching to preferentially remove extended geometries.

In some other alternative embodiments, it may be possible to minimize or eliminate the bulge with alternative plating baths and plating conditions. Possible baths include, for example, variations on acid-Cu plating baths, pyrophosphate baths, and electroless baths. Plating bath additives may also aid in regulating the growth. Plating conditions may also be varied. For example variations in plating current density may be used, pulse plating may be used, a combination of alternating reverse and forward plating may be used, and/or continuously varying plating rates may be used. It is within the level of skill in the art to perform experiments empirically optimize processes to reduce negative effects associated with excess bulging of mushroomed sacrificial material.

Further alternative embodiments may use different mushrooming materials. For example, Ni or another structural material may be used for the initial part of the mushrooming operation after which it may be overcoated with a seed layer material and/or sacrificial material such as copper, tin, silver, or the like.

FIGS. 33A-33D depict schematic side views of various states in an example of a process according to a twenty-sixth embodiment where mushrooming of a conductive material over a dielectric material to form a mold for depositing tip material includes the deposition of a structural material over coated with a sacrificial material.

Figure 33A:
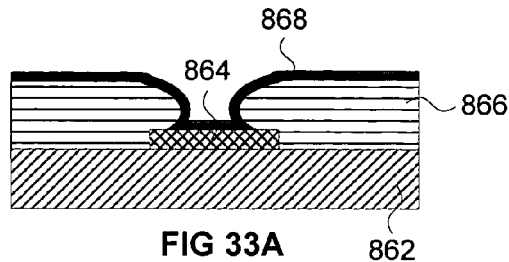
FIGS. 33A-33D depict schematic side views of various states in an example of a process according to a twenty-sixth embodiment where mushrooming of a conductive material over a dielectric material to form a mold for depositing tip material includes the deposition of a structural material over coated with a sacrificial material.

FIG. 33A depicts a seed layer 868 over coating a structural material 866 (e.g. nickel) which is mushroomed over a dielectric material 864 which in turn is located on a substrate 862.

Figure 33B:
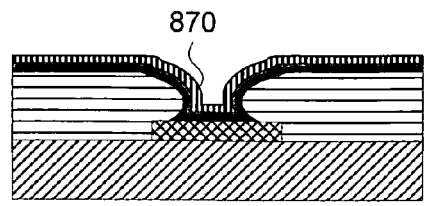

FIG. 33B depicts the state of the process after a sacrificial material 870 (e.g. Cu) is plated seed layer 868. This deposition form a release layer over the photoresist as well as filling in any remaining skirting under any bulge in material 866.

Figure 33C:
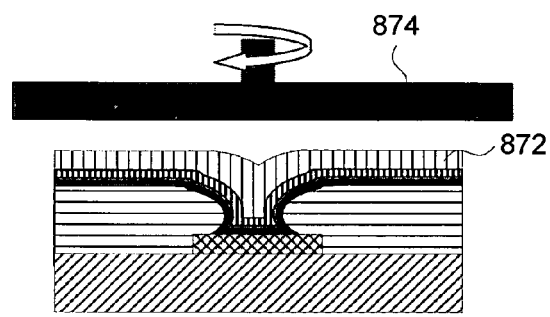
Figure 33D:
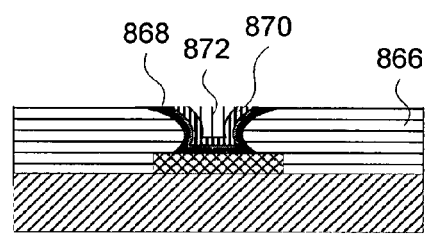

FIG. 33C depicts the beginning of a planarization process using planarizer 874 (e.g. lapping plate) after depositing tip material 872 while FIG. 33D depicts the result of planarization which sets the stage for proceeding with the remaining build operations. The existence of seed layer 870 of sacrificial material ensures the ability of tip material 872 to be released from material 866 even if material 866 is not a sacrificial material that can be readily etched away.

In some other alternative embodiments, it may be possible to use modified patterns of the photoresist to preferentially shape the mushroomed overgrowth. For example, a two step pyramid may be made using a first wider photoresist patterned overlaid by a second narrower pattern of photoresist. In some variations of this alternative and in variations of other embodiments presented herein, photoresist which is to be mushroomed over by an electrodepositable material may be replaced by a different dielectric material. When the mushrooming reaches the 2nd layer, the plating stops and the top surface of the 2nd layer is then taken as the bottom of the tip mold. Any crevice underneath a bulging mid-section of a mushroomed material never receives deposition of a tip material since the second layer of photoresist fits into that crevice and acts as a base onto which tip material will be deposited.

In still other alternative embodiments, a 1st layer of photoresist can be patterned, a sacrificial material deposited and mushroomed with a bulge allowed to form, thereafter a second photoresist/photolithography step may be performed to allow the photoresist to fill in the opening, it may then be patterned so that the second layer of photoresist fills in the bottom of the tip mold. This second level of photoresist polymer can fill in the crevice underneath the bulge. Finally, a seed layer may be deposited and the rest of the tip built.

In still further alternative embodiments, patterns of photoresist may take on different forms, for example, a ring of photoresist may be used instead of a circular disk.

FIGS. 34A-34D depict schematic side views of various states in an example of a process according to a twenty-seventh embodiment where mushrooming of a conductive material over a dielectric material to form a mold for depositing tip material includes a two step dielectric material.

Figure 34A:
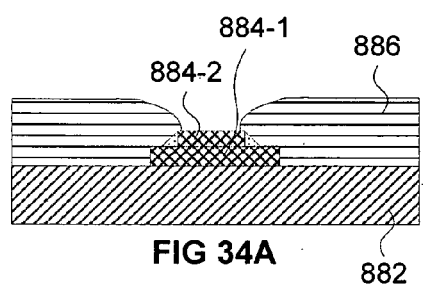
FIGS. 34A-34D depict schematic side views of various states in an example of a process according to a twenty-seventh embodiment where mushrooming of a conductive material over a dielectric material to form a mold for depositing tip material includes a two step dielectric material.

FIG. 34A depicts the state of the process after a two-tiered pattern of photoresist 884-1 and 884-2, or other dielectric material, is formed on a substrate 882 and material 886 is made to mushroom over at least a portion of the patterned photoresist.

Figure 34B:
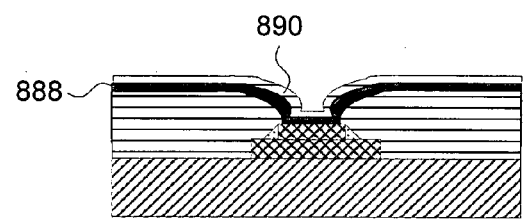

FIG. 34B depicts the state of the process after deposition of a seed layer 888 occurs and deposition of a thin layer of electroplated sacrificial material 890 occurs over the deposited seed layer.

Figure 34C:
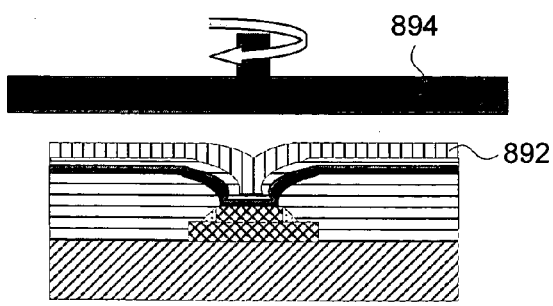
Figure 34D:
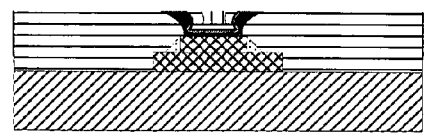

FIG. 34C depicts the state of the process after a tip material 892 is deposited and planarization operations, using planarizer 894, begins while FIG. 34D depicts the result of planarization which sets the stage for performance of remaining build operations (e.g. formation of main bodies of probes, deposition of adhesion material, transfer of probe arrays to a permanent substrate, and the like). In an some variations of this embodiment, deposition of sacrificial material 890 may not be necessary and even deposition of seed layer 888 may not be necessary particularly if the width of dielectric 884-2 is small.

Figure 35A:
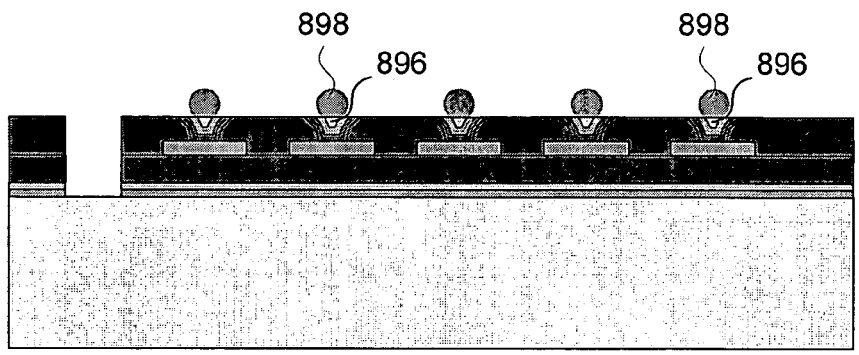
FIGS. 35A-35B depict schematic side views of two states in an example of a process according to a twenty-eighth embodiment where probe tips are formed along with an attachment material and thereafter the tips are joined to prefabricated probe structures or to other devices.
Figure 35B:
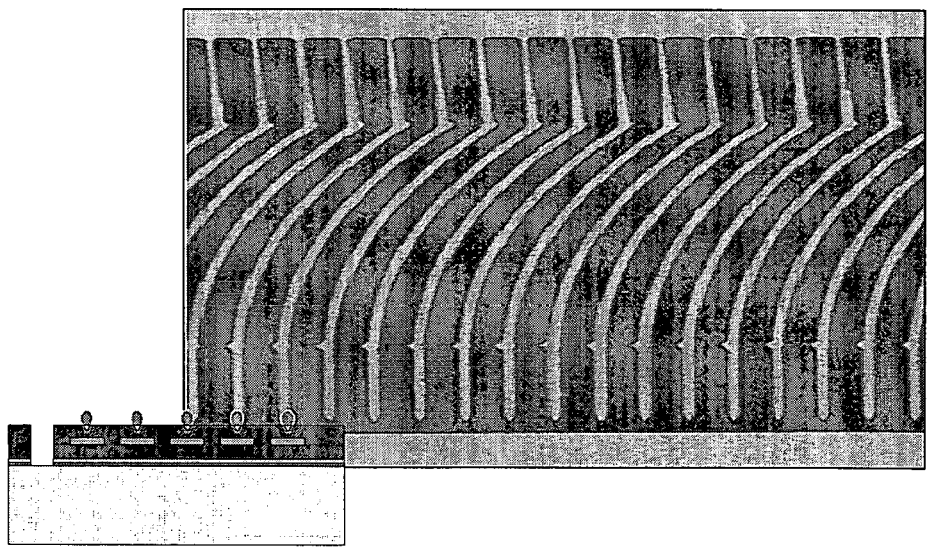

In some alternative embodiments, probe tips as made by one or more of the various processes described herein may have solder or other bonding material located on their back sides (i.e. the side away from the tip) and then the tips may be bonded to any desired prefabricated metal target. An example of such probe tips are shown in FIGS. 35A-35B. FIGS. 35A-35B depict schematic side views of two states in an example of a process according to a twenty-eighth embodiment where probe tips are formed along with an attachment material and thereafter the tips are joined to prefabricated probe structures or to other devices. FIG. 35A depicts a plurality of probe tips 896 having attachment or adhesion material 898 located thereon while FIG. 35B shows those tips being bonded to a set of COBRA probes. Of course in other embodiments, the tips may be bonded to other things, bonding may occur simultaneously with a smaller number of tips or with a larger number of tips, and/or something other than tips may be transferred. In variations of this embodiment, the attachment material may not initially be placed on the tips but may instead be located on the probes (which are to be bonded to the tips) and thereafter tips and probes may be bonded together.

Figure 36A:
FIGS. 36A-36BB depict schematic side views of various states in an example of a process according to a twenty-ninth embodiment where probe tip formation occurs via a mushrooming process and via a coating process that occurs after all layers are formed, additionally a conductivity enhancing coating is applied to the main bodies of the probes.
Figure 36B:
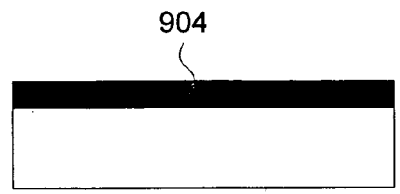

FIGS. 36A-36BB depict schematic side views of various states in an example of a process according to a twenty-ninth embodiment where probe tip formation occurs via a mushrooming process and via a coating process that occurs after all layers are formed, additionally a conductivity enhancing coating is applied to the main bodies of the probes.

FIG. 36A depicts the state of the process after a temporary substrate 902 is supplied (e.g. a ceramic material coated with adhesion and seed layers such as Ti and Au).

Figure 36C:
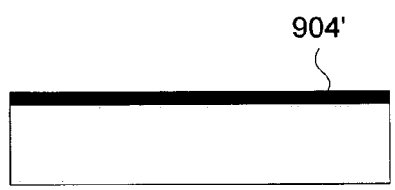

FIG. 36B depicts the state of the process after a thick sacrificial material 904 (e.g., Cu) has been plated FIG. 36C depicts the state of the process after the sacrificial material 904 is planarized to become 'release' layer 904.

Figure 36D:
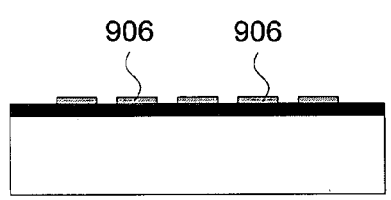

FIG. 36D depicts the state of the process after a thin photoresist or other dielectric 906 has been applied and patterned to form insulating structures over which sacrificial metal can mushroom to form tip geometries. The application of the dielectric may take the form of a blanket or spin deposit which is then exposed and developed. Alternatively it may be selectively deposited (e.g. via ink jet, extrusion, or the like).

Figure 36E:
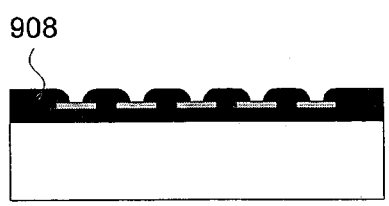

FIG. 36E depicts the state of the process after a sacrificial material 908 (e.g. Cu) has been mushroomed over dielectric pads by plating for a controlled time to form molds having desired tip geometries.

Figure 36F:
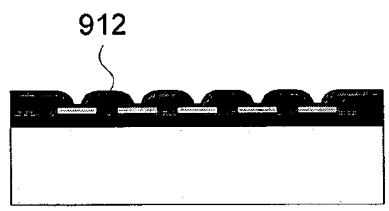

FIG. 36F depicts the state of the process after a sacrificial seed layer 912 (e.g. Cu) is deposited by sputtering or evaporation in order to make the exposed upper surfaces of the dielectric material 906 conductive. In some embodiments, the seed layer may be formed over a previously deposited adhesion layer (e.g. Ti—W). The existence of the seed layer may help ensure that tip material is not unduly adhered or linked to the dielectric material. It may also help in avoiding the bulging of mushroomed material as discussed above. In some alternative embodiments other operations may be performed to help ensure that bulging does not cause problems with tip formation. In some alternative embodiments, the formation of the seed layer may be skipped.

Figure 36G:
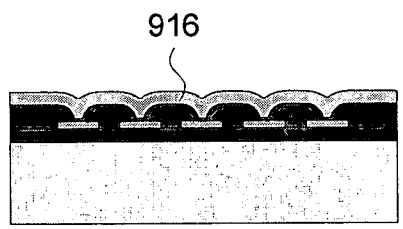

FIG. 36G depicts the state of the process after a tip backing material 916 has been plated to form the bulk of the tip structure. In this embodiment, the tips are formed from a single 'backing' material (e.g., Ni) which will later be coated with a contact material such as Rh.

Figure 36H:

FIG. 36H depicts the state of the process after deposited materials are planarized to yield probe tips that are isolated from one another and have a desired configuration.

Figure 36I:
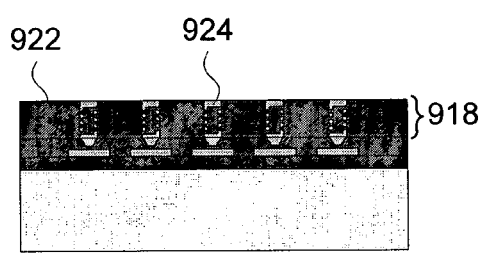

FIG. 36I depicts the state of the process after multiple layers 918 of structural material 924 (e.g., Ni) and sacrificial material 922 have been deposited to the main bodies of the probes. Sacrificial materials 904, 908, 912, and 922 may be identical or different materials. In this embodiment the last layer or layers of the main bodies of the probes formed produces probe bases which may take the form of disks having diameters is similar to that of the probes. In other embodiments (e.g. where cantilever probes are formed), the bases may take on an elongated shapes and/or more than one base may exist per probe.

Figure 36J:
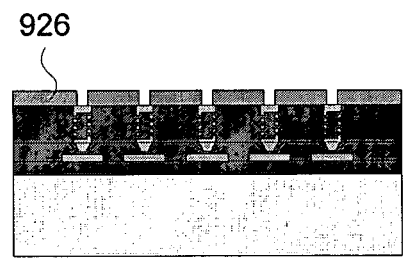

FIG. 36J depicts the state of the process after thick resist 926 is deposited and patterned to have openings where bonding material is to be located.

Figure 36K:
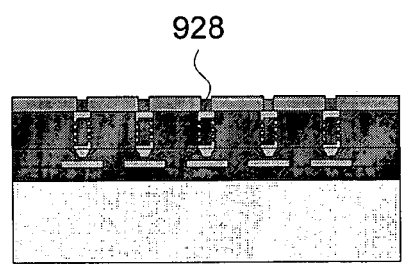

FIG. 36K depicts the state of the process after solder (e.g. Sn or Sn—Pb) or other adhesion material 928 is plated into features of the resist. In some alternative embodiments, where probe bases were not formed previously, they may be formed in the openings prior to deposition of the adhesion material. The base, no matter how it is formed, may provide a wettable pad for the solder and a stable foundation for the probe. In some variations of this embodiment, a planarization operation may be performed to help ensure that a reasonably common quantity of solder forms each bump. This planarization operation may be performed for example by fly cutting or lapping.

Figure 36L:
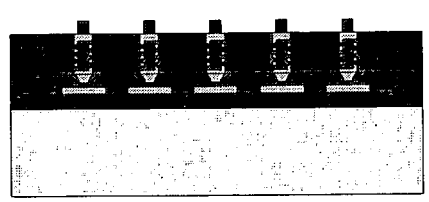

FIG. 36L depicts the state of the process after the resist 926 is stripped.

Figure 36M:
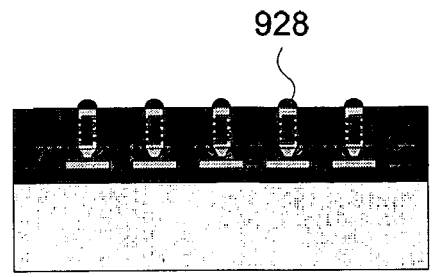

FIG. 36M depicts the state of the process after the solder 928 is reflowed to form rounded bumps. In variations of this embodiment, this reflow operation may be performed later (e.g. once the wafer is singulated). In still other variations, a reflow operation prior to bonding may be skipped. In still other variations, it may be desirable to perform an etchback operation prior to reflow (or alternatively two reflow operations may be performed, one prior to etchback and one after etchback) in order to recess the sacrificial material 922 below the surface of structural material base so as to help inhibit solder from spreading over surface of the sacrificial material.

Figure 36N:
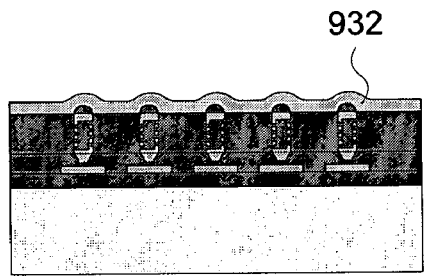

In FIG. 36N depicts the state of the process after a protective coating 932 has been applied to the wafer prior to dicing which may help to limit damage to edges of die.

Figure 36O:
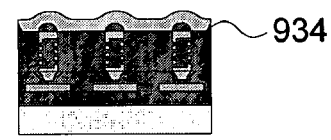

FIG. 36O depicts the state of the process after, the substrate 902 has been sliced to thin it out (preferably before dicing, to facilitate the latter) and then the substrate and formed layers diced into desired probe arrays or die. The dicing operation may leave a burr 934 on the edge of the sacrificial material 922 that can interfere with subsequent bonding. By judicious choice of protective coating material 932 (preferably a hard material such as a soluble wax like Crystalbond 509 made by Aremco Products, Inc. of Valley Cottage, N.Y.), the size of this burr can be kept small.

Figure 36P:
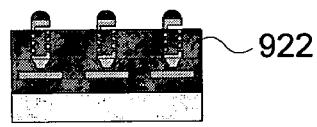

FIG. 36P depicts the state of the process after removal of the protective material 932 and after etchback of the sacrificial material 922 has been performed. This etchback may serve one or more purposes: (1) removing any burrs; (2) recessing the surface of the sacrificial material 922 below that of the solder. The latter may be done for two reasons: (1) as noted above, to minimize or eliminate the risk of solder wicking out across the sacrificial material and shorting neighboring probes together and/or (2) to separate the solder from the sacrificial material, thereby allowing the former to be embedded in an underfill or other sealing material that protects it from a sacrificial material (e.g. Cu) etchant (e.g. C-38 or C-38 modified according to the teachings of U.S. patent application Ser. No. 10/840,998, filed May 7, 2004, by Zhang, and entitled "Electrochemical Fabrication Methods With Enhanced Post Deposition Processing", which is hereby incorporated herein by reference) during release of the probes from the sacrificial material.

If a permanent underfill will be used, the etchback is preferably done, though not required, to an extent that leaves the upper surface of the sacrificial material 122 no lower than the bottom of the probe base, since the sacrificial material surface will define the top of the underfill. If no underfill or only a temporary underfill will be used, the sacrificial material can be etched further, which facilitates and reduces the time required for the full release later; in this regard, the release may be continued much further than shown in FIG. 36P. In lieu of, or in addition to, etchback to remove the burr, electropolishing or mechanical processing (sanding, lapping, polishing, sandblasting) may be employed.

In addition to the etchback leading to the state of the process shown in FIG. 36P, diffusion bonding may be performed (not shown), either before or after etchback or even after complete release but possibly before bonding. One of the latter two options is preferred since there is less sacrificial material Cu and thus less risk of stress due to differences in CTE between sacrificial materials and other materials (e.g. substrate materials, structural material, and the like). Moreover, with the sacrificial material already recessed relative to the Ni due to the etch, the solder bumps on the surface are more likely to remain in place during the reflow that will occur during diffusion bonding. Since bumps may reflow during diffusion bonding (e.g., at 250° C.) an earlier step to reflow them may be bypassed. In some variations of the embodiments set forth herein, it may be possible and desirable to diffusion bond at the wafer level (i.e. before dicing), though the stresses may be too large to allow this unless the deposited layers and or substrate is first 'scored' by partially dicing through one or both of them (e.g., cutting through all deposited layers but only slightly into the temporary wafer). In still other variations of the embodiments herein, if the permanent substrate can tolerate the temperature, it may be possible to do diffusion bonding during or after bonding. More details about diffusion bonding may be found in U.S. patent application Ser. No. 10/841,382, filed May 7, 2004, by Zhang, and entitled "Method of Electrochemically Fabricating Multilayer Structures Having Improved Interlayer Adhesion", which is hereby incorporated herein by reference.

Figure 36Q:
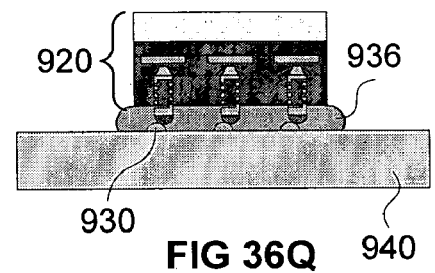

In FIG. 36Q depicts the state of the process after, the probe die 920 has been flipped and aligned roughly (e.g., to +/−5 μm) to the bumps on space transformer, IC package, or other permanent substrate 940 (e.g., a PC board), and a flux 936 inserted between them. Multiple die fabricated in close proximity to each other on the temporary substrate 902 can be dispersed widely across the permanent substrate or even reoriented. In alternative embodiments, e.g. if the probe die do not realign significantly due to meniscus forces or the like, instead of performing a rough alignment a precise alignment may be performed, in some such alternatives, the probe die and substrate may be held in fixed positions X, Y and/or Z positions during bonding to ensure proper positioning. Alignment may be performed by equipment known to the art for die bonding such as that manufactured by Palomar Technologies (e.g., model 6500) or Semiconductor Equipment Corporation (e.g., System 850 with a hot gas heater stage), or the like. Such equipment may, for example, use multiple cameras to image the die and permanent substrate when face-to-face, align them together, and heat them to perform a bond. The permanent substrate 940 is assumed to include bumps or other isolated metallic contacts 930 as shown. If these contacts 930 are composed of solder, it may not be necessary to apply additional solder to the probe base as already described, in that the solder from the permanent substrate can directly bond to the probe bases. A liquid or paste flux 936 may be applied to either one or both of the die and the permanent substrate to (1) temporarily adhere the two together well enough to retain alignment until bonded and/or (2) minimize oxide formation which can interfere with good bonding. To help with the latter, an 'active' flux may be preferable.

Figure 36R:
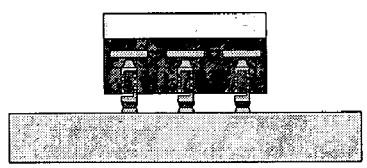

FIG. 36R depicts the state of the process after the solder has been reflowed, self-alignment of the die has occurred, and the flux has been removed (e.g. by an appropriate solvent).

Figure 36S:
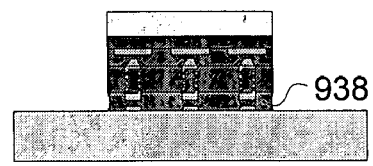
Figure 36T:

FIG. 36S, depicts the state of the process after an underfill material 938 has been made to fill the space under the die. The underfill material 938 may be an epoxy or flip-chip underfill if a permanent underfill is desired to provide additional strength to the final device. Or if a temporary underfill is desired, the material may, for example, be a wax (e.g., Crystalbond 509), lacquer, or the like which is removed after release of the probes from the sacrificial material. In either case, the use of an underfill may be useful in allowing the sacrificial material (e.g. Cu) to be etched without damaging the solder which may tend to be attacked by the sacrificial material etchant.

In some variations of the embodiment, the etchback operation resulting in the state of the process shown in FIG. 36P may be difficult to accomplish due to a tendency for the exposed solder to etch instead of or in addition to the sacrificial material. In some alternative embodiments, this may be handled by (1) temporarily coating the solder with a protective material (e.g., by dipping the solder into a thin layer of polymer spin coated onto a flat plate) or (2) by coating the solder with Au (e.g., immersion Au through dipping). In still other alternative embodiments, etch back of the sacrificial material may occur between the states of the process shown in FIGS. 36O and 36J after which the photopolymer may be deposit not only above the probe bases but beside them as well.

An alternative to the underfill discussed above is the use of a coating (e.g., electroless or immersion Au) at the stage shown in FIG. 36R, in order to form a protective coating over the solder on the die and/or on the permanent substrate to protect it against etching by the sacrificial material etchant. A thin layer of this coating may also be deposited on the lower surface of the sacrificial material, but since this bridges the probes without any mechanical support once the sacrificial material is etched, it should be easily removed (e.g., by ultrasonic agitation).

Figure 36U:
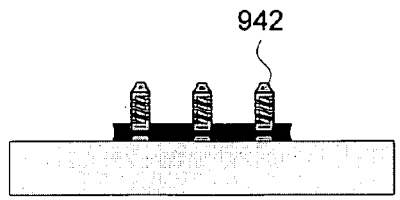

FIG. 36U depicts the state of the process after the die has been fully released from sacrificial material. Keeping the probes embedded at least partially in sacrificial material up until bonding has occurred provides great robustness for handling and keeps all the structures in perfect 6-axis alignment during bonding, etc. In some alternative embodiments, the probes may be bonded to the permanent substrate with sacrificial material in place but with the temporary substrate already removed. During this process, the sacrificial material enveloped photoresist features patterned earlier will typically fall away or become dissolved. If desired, in some variations of the embodiment, the release process can be stopped and a photoresist stripper used once the resist is exposed, then the release may be continued. At this point, if desired, the probes can be etched (e.g. with a Ni etchant, possibly selective to other materials such as tip materials) to remove any extraneous material or to roughen them (perhaps using a dilute 'microetch') to enhance adhesion of a coating that will be applied. Another effect of such etching may be to remove any 'flared' regions formed near the ends of the tips which may have resulted from a mushrooming operation. The etching may also round or blunt the corners of the tips.

In some alternative embodiments, instead of bonding the probe die to the permanent substrate using solder, thermocompression bonding, e.g., of Au to Au, may be used. In the case of gold-gold bonding, Au would have been plated instead of solder in the operations lead to the state of the process shown in FIG. 36L and the permanent substrate contacts 930 would also be Au coated. With the two Au surfaces in contact, heat and pressure may be applied to bond the die to the permanent substrate. In this case, it may not be necessary to use any underfill since there is no solder to be protected during sacrificial material etching (assuming Au is not attacked by the sacrificial material etchant).

As a further extension of the process depicted in FIGS. 36A-36BB, one can fabricate and transfer/bond structures and components other than probes to probe card elements or other interconnection devices. Examples of such components include interconnects (traces, microstrip, pins, coaxial transmission lines), switches, capacitors, resistors, and inductors, integrated circuits, and the like.

FIG. 36U depicts the state of the process after a coating 942 has been applied (e.g. Au, Ag, or Cu to decrease probe resistance) to the entire probe, including the tips. The tips may be protected if desired (e.g., by coating them with photoresist by contact with a thin film of the latter spin-coated onto a flat plate) so they do not become coated, though in this embodiment it is assumed that it is not required. A desirable method of applying the coating is through an electroless plating process, especially if the probes are densely-packed. Electroplating, physical vapor deposition, chemical vapor deposition, ion plating, and other coating methods known to the art may also be used.

Figure 36V:
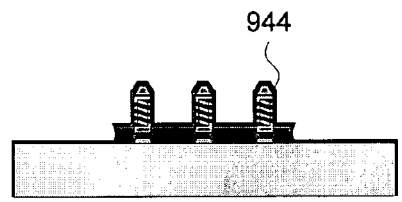

In FIG. 36V depicts the state of the process after a layer of sacrificial material (e.g., Cu), possibly after applying an adhesion layer (e.g. Ti—W), has been applied to the probes and to the permanent substrate to electrically connect all probes together in preparation for a subsequent tip coating process. This process can be skipped if either (1) electrical contact can be made with the probes otherwise (e.g., through the wiring within or on the space transformer itself) or (2) the tip coating will be deposited via a non-electrolytic process (e.g. PVD, CVD, electroless,plating, or the like).

Figure 36W:
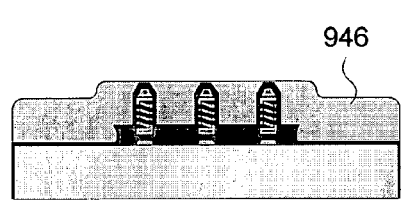

FIG. 36W depicts the state of the process after a temporary coating material 946 (e.g., a polymer such as wax) has been applied.

Figure 36X:

FIG. 36X depicts the state of the process after this coating has been removed (e.g., by reactive ion etching) from the tip portions of the probes.

Figure 36Y:

FIG. 36Y depicts the state of the process after the sacrificial material (if used) has been removed from the tips (e.g. by chemical etching) to expose the tip backing material.

Figure 36Z:
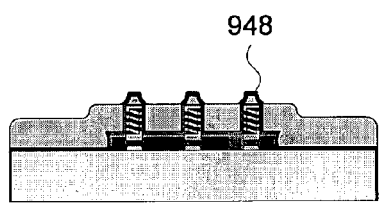
Figure 36A:
Figure 36B:

FIG. 36Z depicts the state of the process after the tip material 948 (e.g. Rh) has been applied.

FIG. 36AA depicts the state of the process after the temporary coating material 946 has been removed (e.g. by melting, plasma etching, and/or chemical etching).

FIG. 36BB depicts the state of the process after the remainder of the sacrificial material 944 has been removed.

FIGS. 37A-37G depict schematic side views of various states in an example of a process according to a thirtieth embodiment where probe tips are formed using a series of sequential sublayers composed of dielectric material and sacrificial material. The general process flow of this embodiment includes the following operations: (1) A substrate is prepared with a base layer of sacrificial material that is made intentionally thick so as to ease later release of probe die; (2) The sacrificial material is planarized; (3) A first sublayer of photoresist (e.g. machinable photoresist such as BPR100 (available from _____ of _____ is put down by spinning on photoresist, exposing, and developing; (4) Sacrificial material (e.g. copper) is electroplated up from the previously deposited material and around sides of the photoresist to a level that is preferably, though not necessarily, at or just above the thickness of the photoresist; (5) If a precisely defined sublayer thickness is desired, this sublayer can be planarized using lapping/polishing or fly cutting; (6) Operations (3)-(5) are repeated one or more times until a desired ultimate thickness of the tip layer is met or exceeded but using photoresist patterns with progressively larger areas on each sublayer; (7) The photoresist is stripped leaving behind a stair-step like structure that has a downward pointing stepped cone shape; (8) A controlled sacrificial material etch (e.g. chemical, electrochemical, single step, multi-step, combination of alternating etchings and depositions, or the like) is performed to smooth out the sharp edges of the steps; (9) A fill-in plating step using a sacrificial material may be performed to complete the smoothing of the sloped sidewalls; (10) Depositing a tip material, e.g. via electroplating or electroless plating depositing a tip coating material (e.g. Rh) or a tip backing material if the tip coating material is to be applied in a later operation; (11) If not already applied a tip backing material (e.g. Ni) may be deposited (i.e. Ni); and (12) The entire structure is planarized, e.g. via lapping and polishing, to yield isolated tips located in copper molds, in preparation for subsequent operations that may include attaching or forming main bodies of probe structures to the tips.

FIG. 36A depicts an example of the state of the process after operations (1)-(5) have been performed to produce a photoresist pattern 968-1, or other dielectric material pattern and surrounding sacrificial material 966-1 on a release layer 964 which is in turn on a substrate 962.

Figure 37A:
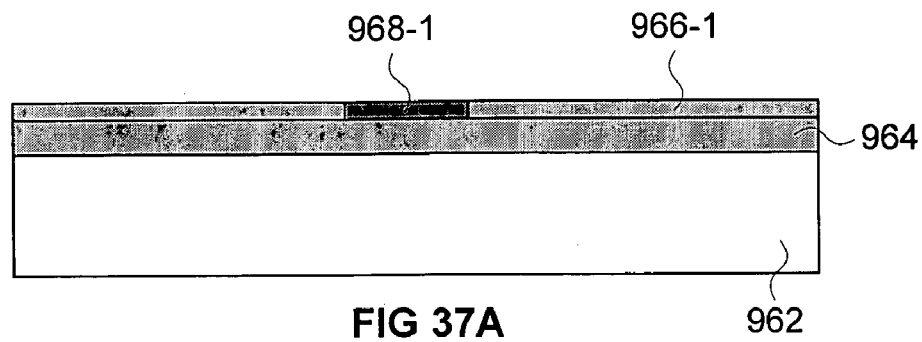
FIGS. 37A-37G depict schematic side views of various states in an example of a process according to a thirtieth embodiment where probe tips are formed using a series of sequential sublayers composed of dielectric material and sacrificial material.
Figure 37B:
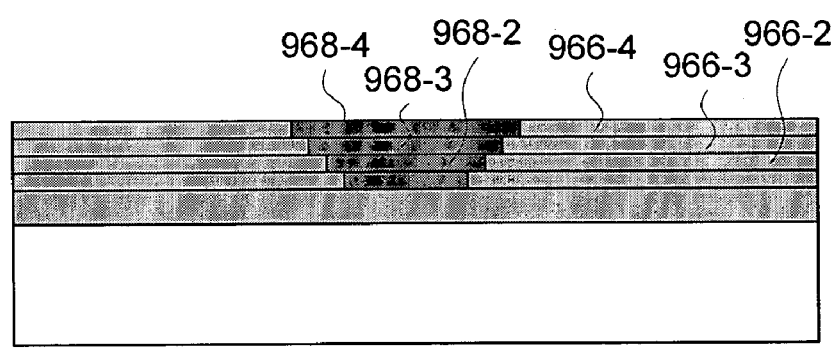

FIG. 37B depicts the state of the process after three more repetitions of operations (1)-(5) have been repeated to stack up photoresist patterns 968-2 to 968-4 along with surround areas of sacrificial material 966-2 to 966-4.

Figure 37C:
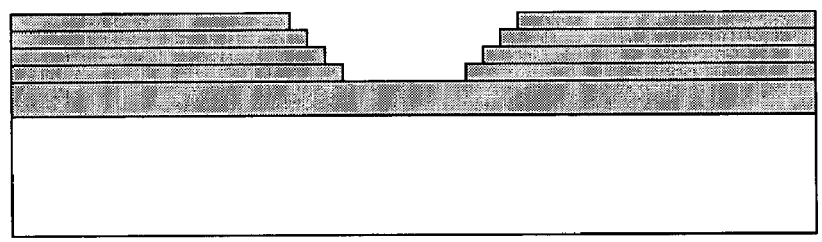

FIG. 37C depicts the state of the process after photoresist patterns 968-1 to 968-4 have been removed according to operation (7).

Figure 37D:
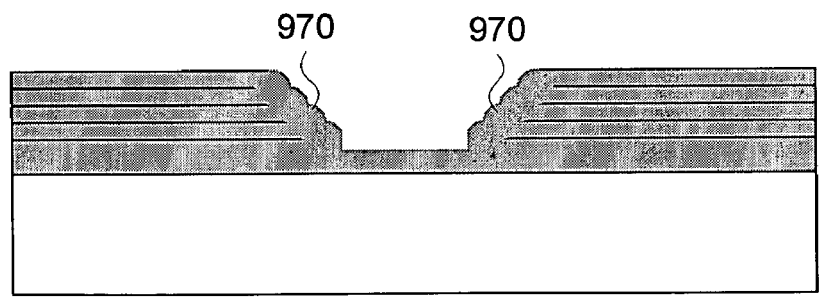

FIG. 37D depicts the state of the process after operation (8) is performed and smoothing of original stair steps between sacrificial material sublayers 966-1 to 966-4 has occurred to yield sloped side walls 970 for each tip mold location.

Figure 37E:
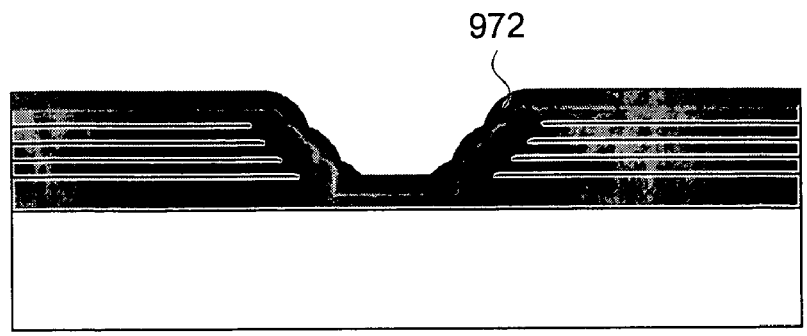

FIG. 37E depicts the state of the process after operation (9) is performed to deposit sacrificial material 972 which helps to further smooth discontinuities between sublayers.

Figure 37F:
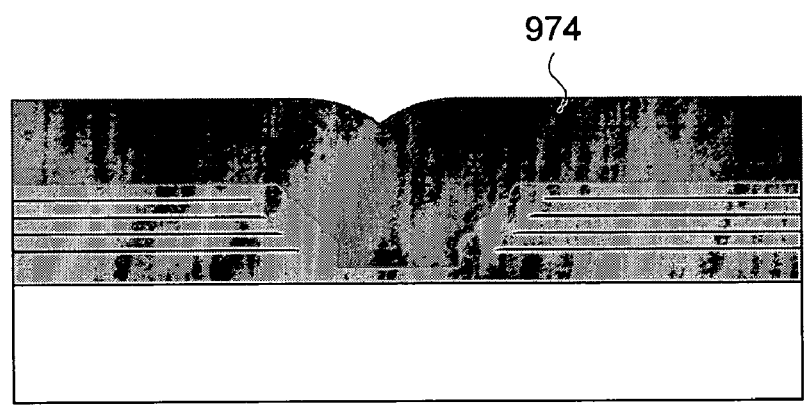

FIG. 37F depicts the state of the process after operations (10) and possibly (11) are performed so that tip material 974 is deposited. This tip material may be composed of a tip coating material and/or a tip backing material.

Figure 37G:
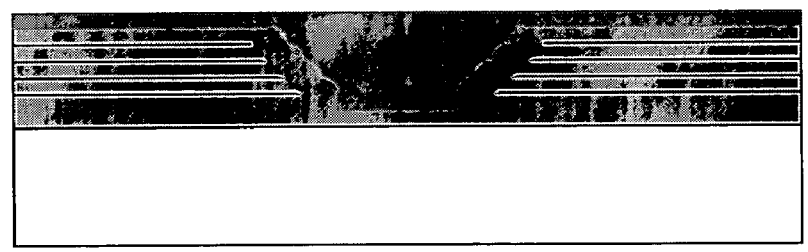

FIG. 37G depicts the state of the process after operation (12) is performed so as to create isolated tips having desired configurations.

In this embodiment, the photoresist width on first sublayer largely determines the ultimate width of the tip plateau while the photoresist width on the last sublayer largely controls the maximum width of the tip. As this process is not dependent on mushrooming over dielectric pads that are larger than tip widths, it is believed that higher tip densities and possibly probe packing densities can be achieved using this approach as compared to the various mushrooming approaches set forth herein.

FIGS. 38A-38F depict schematic side views of various states in an example of a process according to a thirty-first embodiment where a first photoresist structure is used to create a platform for mushrooming and a second is used to create a mushrooming stop. The process of this thirty-first embodiment includes: (1) On a substrate surface, spin and pattern a first photoresist, for example a film of SU8 epoxy or photo-patternable polyimide, which will act as mushrooming pad. It is preferred that this first photoresist should be such that it is resistant to chemical attack by any solvents that may be used to dissolve a second photoresist which may be for example a positive resist such as AZ 4620 which may be easily removed using a solvent such as acetone. (2) The second photoresist is deposited (e.g. via spin coating) and patterned so that it sits inside of the boundaries of the first photoresist and stands preferably at least as tall as one-half the height of final mushroomed structure and more preferably as tall as the mushroomed structure itself. (3) A sacrificial material electroplated and allowed to mushroom over the first photoresist after contacting the second photoresist the inward mushrooming will cease. The existence of the second photoresist effectively serves to prevent any uncontrolled overplating from taking place and making the molded holes (i.e. tip molds) from becoming smaller than desired and providing greater process latitude in the mushrooming process. (4) Electroplating is ceased and the second photoresist is stripped. (5) Next a seed layer (which may or may not include an adhesion layer) is deposited over the entire wafer surface, coating inside of the molded holes and on top of the first photoresist. (6) Next a relatively thin layer of electroplated sacrificial material, e.g. copper, is deposited over the entire surface. (7) Tip material is then plated which may include one or both of a tip contact material (e.g. Rh) and a tip backing material (e.g. Ni or NiCo) is then plated to form the tip structure. (8) Planarization of the deposited materials occurs to yield isolated tips of desired configuration. Subsequent operations may involve the formation of the main bodies of probe elements on the tip materials and the eventual release and transfer of the probes to a permanent substrate. The thin layer of sacrificial material deposited in operation (6) allows release of the probe structures even in alternative embodiments where the material deposited in operation (3) is not a sacrificial material.

Figure 38A:
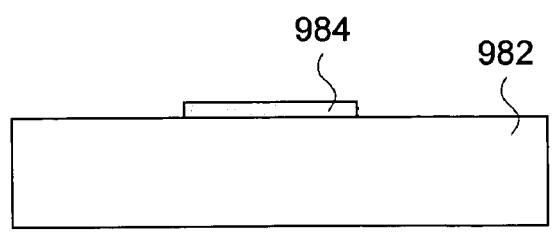
FIGS. 38A-38F depict schematic side views of various states in an example of a process according to a thirty-first embodiment where a first photoresist structure is used to create a platform for mushrooming and a second is used to create a mushrooming stop.

FIG. 38A depicts the state of the process after operation (1) is performed to form a pattern of first photoresist 984 on a substrate 982.

Figure 38B:
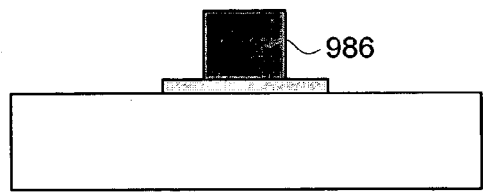

FIG. 38B depicts the state of the process operation (2) is performed to form a pattern of a second photoresist 986 on the first photoresist 984.

Figure 38C:
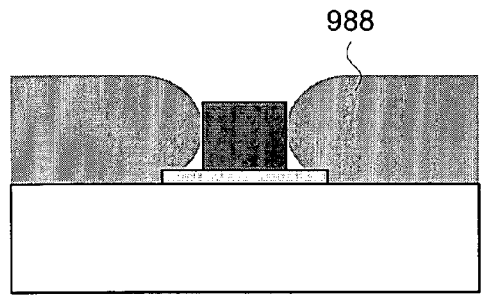

FIG. 38C depicts the state of the process after operation (3) is performed to yield a sacrificial material 988 which has mushroomed over the first photoresist 984 but has not topped the second photoresist 986.

Figure 38D:
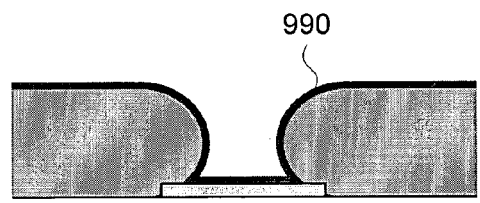

FIG. 38D depicts the state of the process after operations (4) and (5) have been performed yielding a seed layer 990 that overlays photoresist 984 and sacrificial material 988.

Figure 38E:
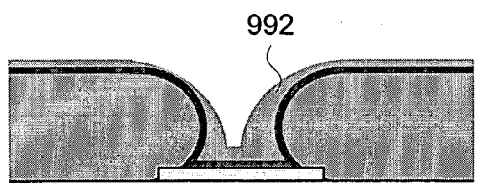

FIG. 38E depicts the state of the process after operation (6) is performed yielding a thin layer of sacrificial material 992, which may be the same as of different from material 988.

Figure 38F:
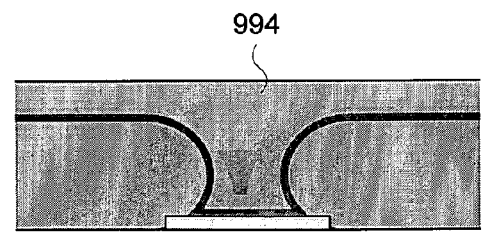

FIG. 38F depicts the state of the process operation (7) is performed to yield a deposition of tip material 994 filling desired tip locations defined by mushroomed sacrificial material 988.

FIGS. 39A-39H depict schematic side views of various states in an example of a process according to a thirty-second embodiment where desired probe tip configurations are obtained using rounding of solder that occurs when the solder is reflowed.

Figure 39A:
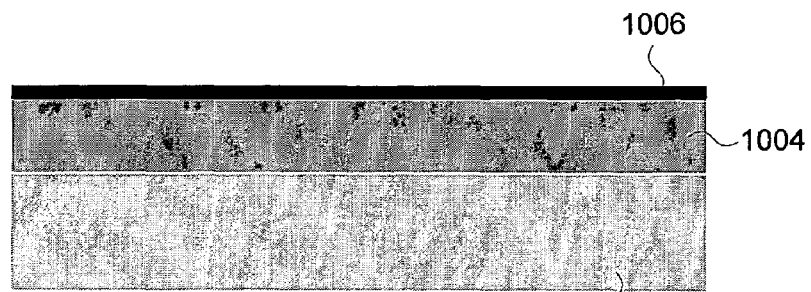
FIGS. 39A-39H depict schematic side views of various states in an example of a process according to a thirty-second embodiment where desired probe tip configurations are obtained using rounding of solder that occurs when the solder is reflowed.

FIG. 39A depicts the state of the process after a substrate 1002 is coated with a thick layer of sacrificial material 1004 (e.g. copper), the sacrificial material is planarized, and a thin film of a solder mask material 106 (e.g. TiW) is applied (e.g. via sputtering).

Figure 39B:
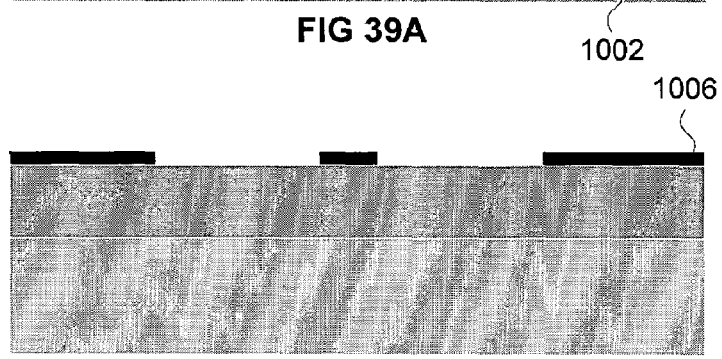

FIG. 39B depicts the state of the process after patterning a ring-like donut shape in the barrier layer 1006 to expose selected portions of the sacrificial material 1004. The shape is designed such that the ring of the donut is as small as possible but large enough to inhibit bridging during reflow of a solder material (e.g. tin).

Figure 39C:
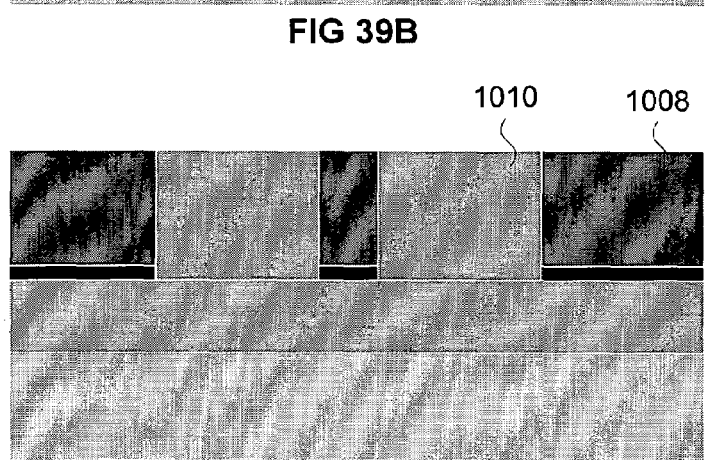

FIG. 39C depicts the state of the process after applying and patterning a thick layer of photoresist 1008 and depositing solder material 1010 (e.g. Sn) into openings in the photoresist. The photoresist is patterned so that it contains an opening or openings that match the opening or openings defined by the ring-like donut patterns in the TiW. In some alternative embodiments, the solder and photoresist may be planarized to ensure a more uniform distribution of solder between a plurality of deposition locations.

Figure 39D:
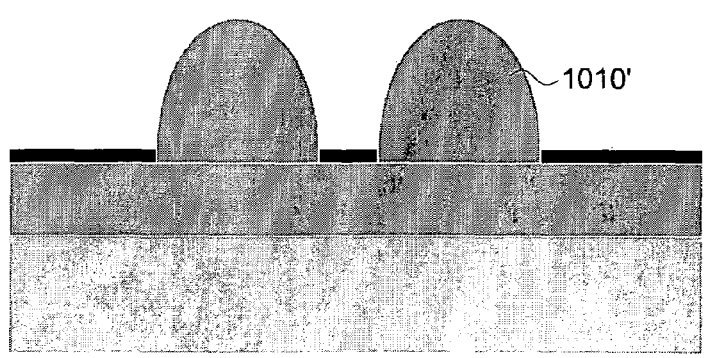

FIG. 39D depicts the state of the process after the photoresist 1008 is removed and the solder mound 1010 reflowed. The TiW will serve as a solder mask and inhibits the solder from wetting out and away from its pre-patterned location. During reflow, the tin softens and "ball up" into a half-egg shape, where the bottom is constrained by the donut pattern in the TiW.

Figure 39E:
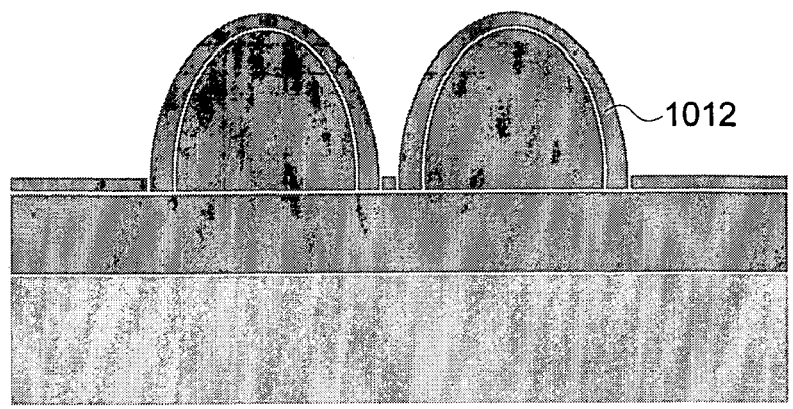

FIG. 39E depicts the state of the process after removal of the solder mask material and the blanket deposition of a thin layer of sacrificial material 1012 (e.g. Cu) In some specific implementations the sacrificial material may have a thickness of about 5 to 10 microns. This will create a conformal coating of Cu everywhere, including over the solder. It will also narrow the space between the opposite sides of the solder donut, in other words, it will shrink the size of the hole in the middle.

Figure 39F:
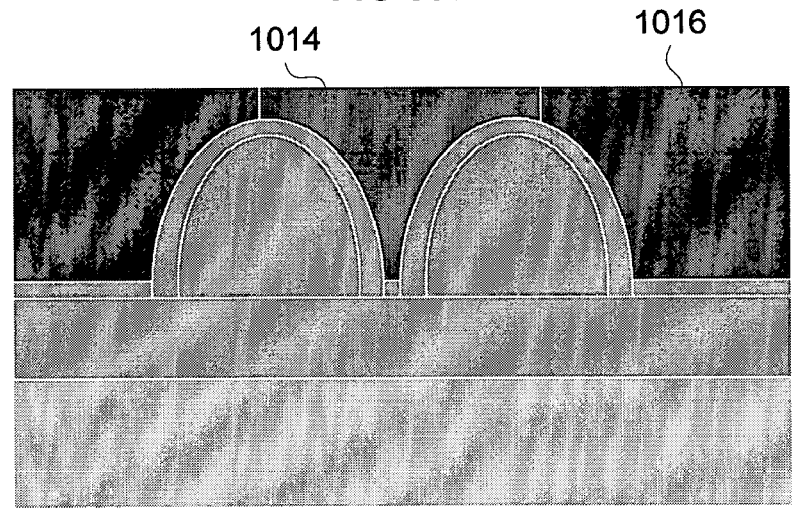

FIG. 39F depicts the state of the process after applying and patterning a thick photoresist 1016 and then depositing tip material 1014 (e.g. Rh and/or Ni) into the openings in the photoresist via an electroplating process.

Figure 39G:
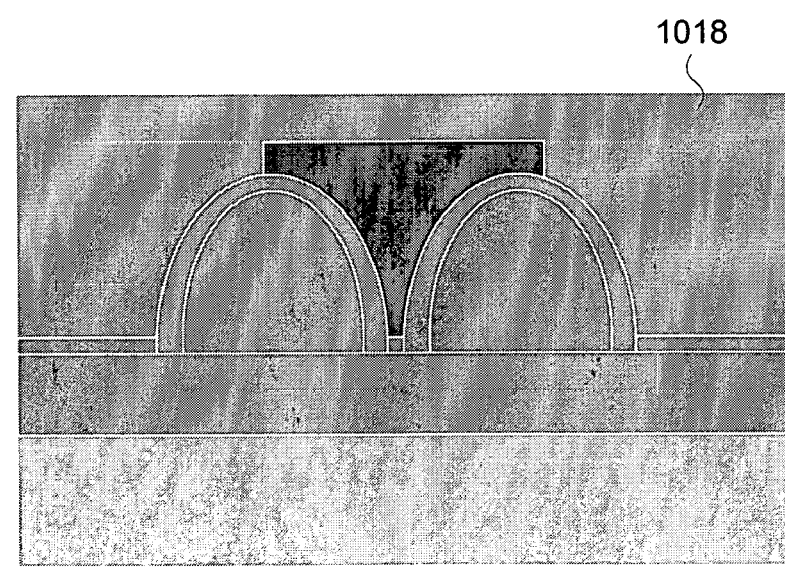

FIG. 39G depicts the state of the process after removal of the photoresist 1016 and blanket deposition of sacrificial material 1018 (e.g. Cu) via electroplating.

Figure 39H:
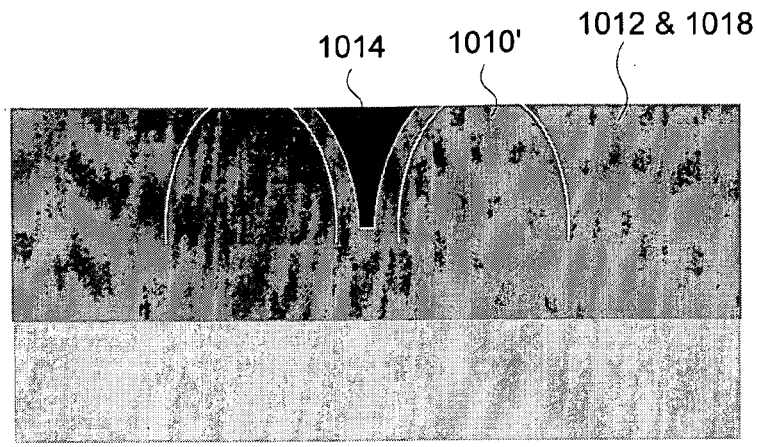

FIG. 39H depicts the state of the process after planarizing (e.g. via lapping and polishing) to trim the tip material and the sacrificial material to a desired height which removes any sacrificial material that covered the tip material and which exposes the top portions of ring of solder material, and which leaves behind a well defined, controllably shaped probe tip formed of material 1014. After formation of tips the process continuation onward, for example, with the formation of the main bodies of probes. After formation of the probes is complete and the probes are released the solder material 1010' will fall away or be etched away along with the sacrificial material.

FIGS. 40A-40E depict schematic side views of various states in an example of a process according to a thirty-third embodiment where the thirty-second embodiment is enhanced by operations that form plating stops within the centers of the donut shaped solder rings.

Figure 40A:
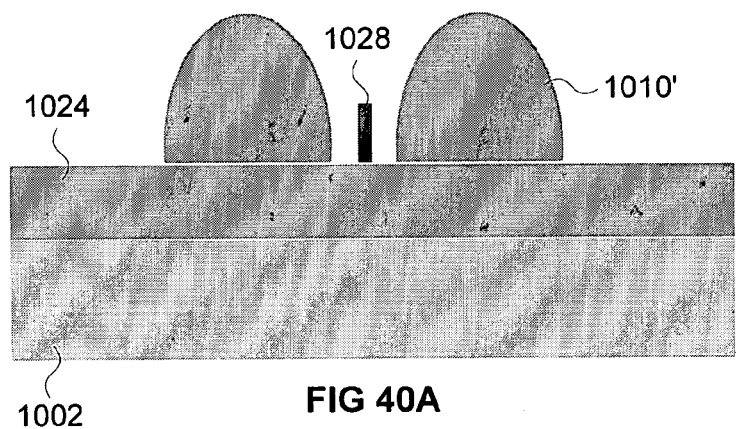
FIGS. 40A-40E depict schematic side views of various states in an example of a process according to a thirty-third embodiment where the thirty-second embodiment is enhanced by operations that form plating stops within the centers of the donut shaped solder rings.

FIG. 40A depicts the state of the process after the solder 1010' shown in FIG. 39D is removed and a photoresist is deposited and patterned to define a photoresist column 1028 in located in the center of the ring defined by the solder material 1010'. It is intended that this column serve as plating stop. In alternative embodiments, similar but oblong rings of solder and walls of photoresist may be used to define elongated probe tips. In still other embodiments, other shapes of solder and patterns of photoresist may be useful in defining other tip shapes. It is intended that the photoresist stop serve as a plating stop.

Figure 40B:
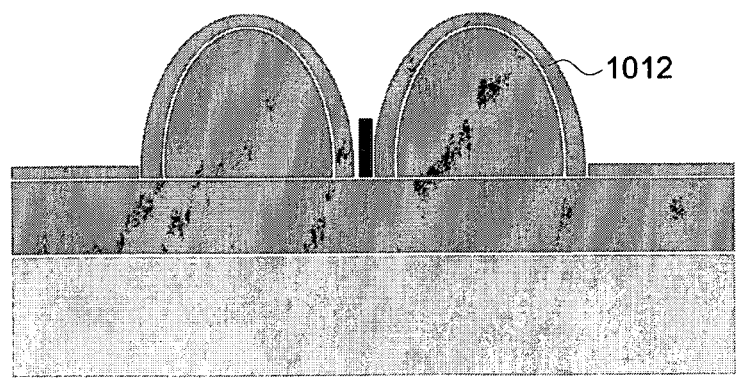

FIG. 40B depicts the state of the process after sacrificial material 1012 is deposited (in a manner analogous to that leading to the state of the process shown in FIG. 39E with the exception that the plating stop inhibits deposition of sacrificial material to the central portion of the ring thus ensuring a well defined size and length of the probe tip when probe tip material is deposited.

Figure 40C:
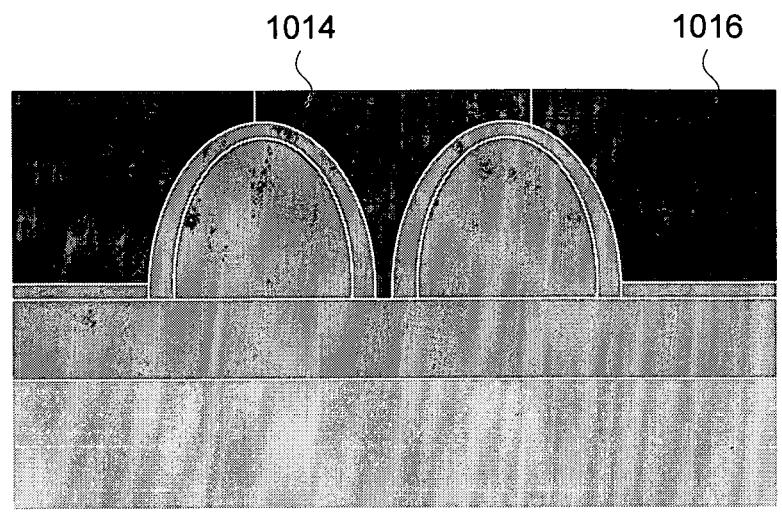

FIG. 40C depicts the state of the process after removal of the photoresist column 1028, the application and patterning of photoresist 1016 as shown in FIG. 3F and the plating of tip material 1014. Due to the controlled spacing and the added depth in the center of the hole provided by the PR plating stop, the tip's contact end will now be longer and sharper with a more controllable geometry.

Figure 40D:
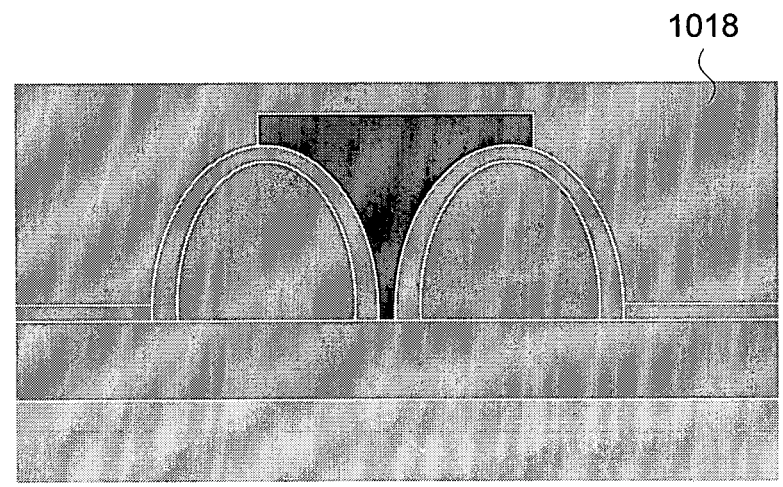
Figure 40E:
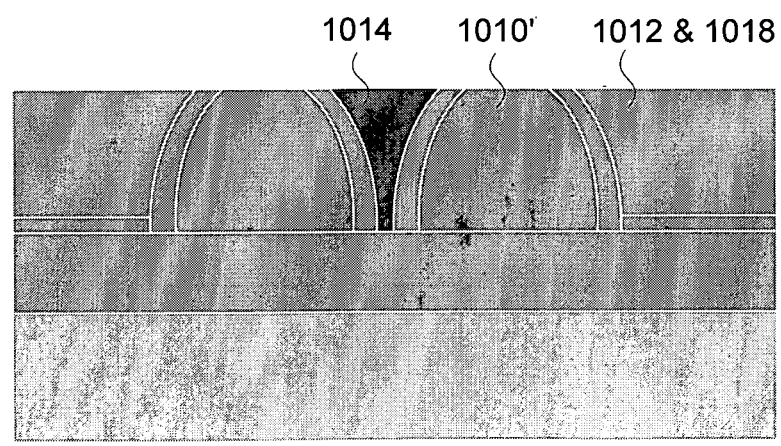

FIGS. 40D-40E depict similar changes to the states of the process as discussed previously with regard to FIGS. 39F and 39G and thus will not be discussed further at this time.

FIG. 41 and FIG. 42 provide thirty-fourth and thirty-fifth embodiments of the invention that provide enhanced alignment methods for ensuring layer-to-layer alignment when using mushrooming to provide molds for forming probe tips.

Figure 41A:
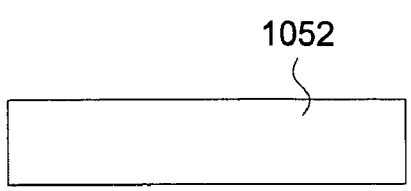
FIGS. 41A-41Q depict schematic side views of various states in an example of a process according to a thirty-fourth embodiment where separate target masks are used including a layer that only has substrate or wafer targets to which a tips mask as well as the first probe mask align.
Figure 41B:
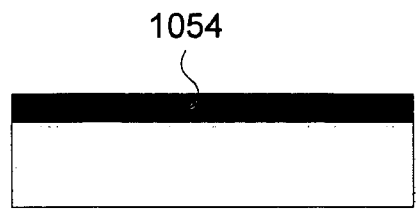
Figure 41C:
Figure 41D:
Figure 41E:
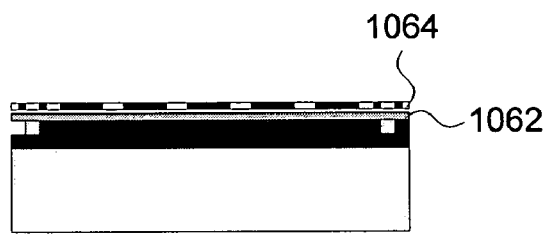
Figure 41F:
Figure 41G:
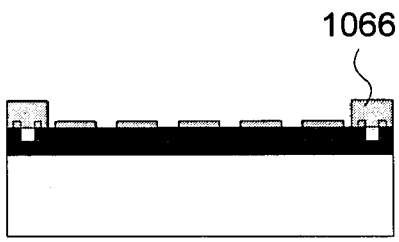
Figure 41H:
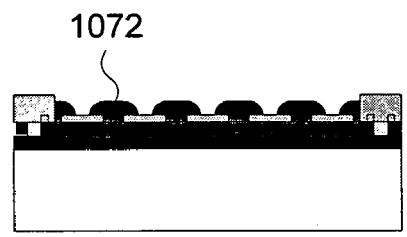
Figure 41I:
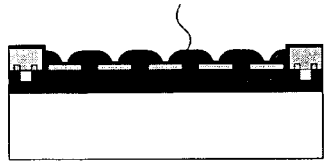
Figure 41J:
Figure 41K:
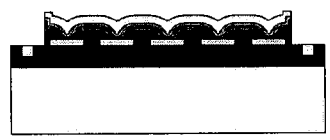
Figure 41L:
Figure 41M:
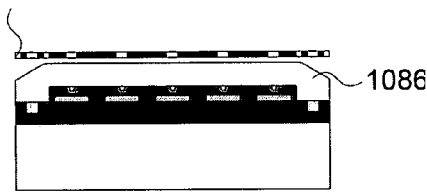
Figure 41N:
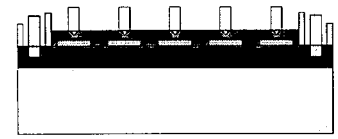
Figure 41O:
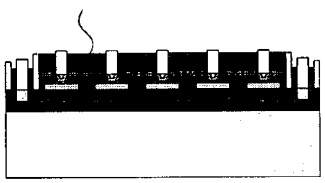
Figure 41P:
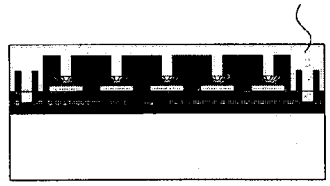
Figure 41Q:

FIGS. 41A-41Q depict schematic side views of various states in an example of a process according to a thirty-fourth embodiment where separate target masks are used including a layer that only has substrate or wafer targets to which a tips mask as well as the first probe mask align. The advantage to this approach is that the wafer targets are created in the usual manner and so provide good images for an aligning camera.

FIG. 41A depicts the state of the process after an alumina substrate 1052 is provided.

FIG. 41B depicts the state of the process after blanket deposition of a sacrificial material (e.g. Cu) release layer 1054.

FIG. 41C depicts the state of the process after planarizing the sacrificial material release layer to obtained smoothed layer 1054'.

FIG. 41D depicts the state of the process after selective deposition of a sacrificial material (e.g. Cu), blanket deposition of a structural material (e.g. Ni) to form targets 1058, and planarization of the deposited materials.

FIG. 41E depicts the state of the process after application of photoresist 1062 (e.g. application of a positive resist via spinning) and alignment of a tips mask 1064 to targets 1058.

FIG. 41F depicts the state of the process after exposure of the photoresist to radiation via mask 1064 and development of the resist.

FIG. 41G depicts the state of the process after taping over the resist which is around the targets 1058 using non-outgassing tape 1066.

FIG. 41H depicts the state of the process after mushrooming of a sacrificial material 1072 occurs over photoresist pads created using mask 1064 to create molds for forming probe tips.

FIG. 41I depicts the state of the process after sputtering of an adhesion layer and a sacrificial seed layer combination 1074 (e.g. Ti—W and Cu).

FIG. 41J depicts the state of the process after blanket plating of a structural material (e.g. Ni or NiCo).

FIG. 41K depicts the state of the process after removal of tape 1066 occurs and resist over or around the targets is stripped.

FIG. 41L depicts the state of the process after a planarization of the deposited materials occurs to create isolated probe tips of desired configuration.

FIG. 41M depicts the state of the process after spinning on a resist 1086, aligning a probe mask 1084 to the same targets 1058 used earlier.

FIG. 41N depicts the state of the process after exposing the resist 1086 using masking 1084 and after development of the resist.

FIG. 41O depicts the state of the process after sacrificial material 1092 (e.g. copper) is plated into openings in the resist.

FIG. 41P depicts the state of the process after blanket plating structural material 1094 (e.g. Ni).

FIG. 41Q depicts the state of the process after planarization of the deposited materials occurs resulting in a planar surface having alignment marks and capable of receiving additional layers of material, e.g. layers of structural and sacrificial materials from which the main bodies of probes will be formed.

Figure 42A:
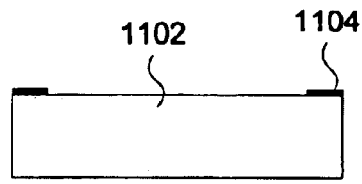
FIGS. 42A-42Q depict schematic side views of various states in an example of a process according to a thirty-fifth embodiment where alignment targets are formed by a structural material (e.g. nickel) background which is overplated with a shallow layer of sacrificial material (e.g. copper).
Figure 42B:
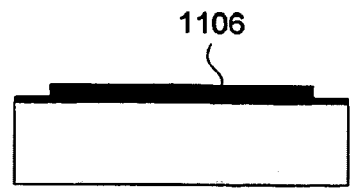
Figure 42C:
Figure 42D:
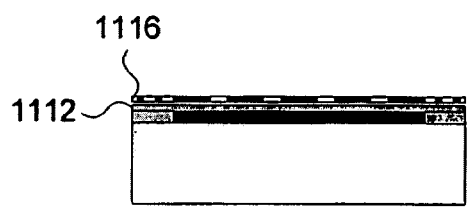
Figure 42E:
Figure 42F:
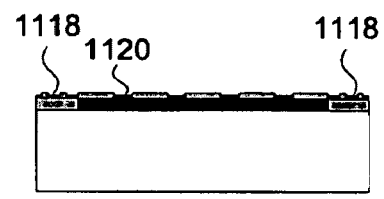
Figure 42G:
Figure 42H:
Figure 42I:
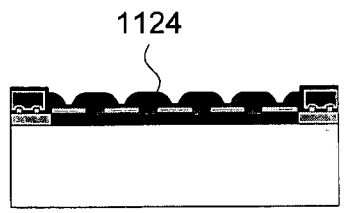
Figure 42J:
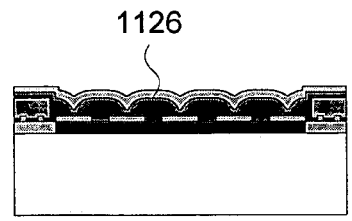
Figure 42K:
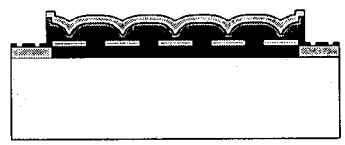
Figure 42L:
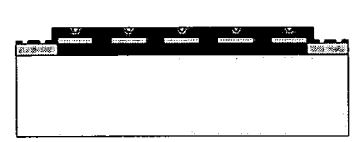
Figure 42M:
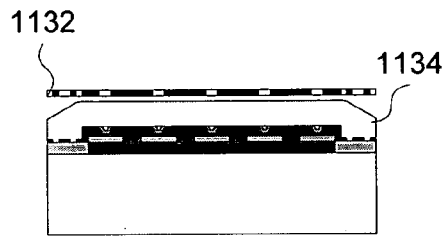
Figure 42N:
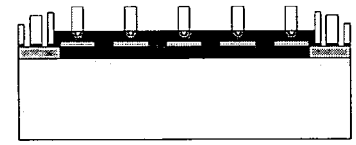
Figure 42O:
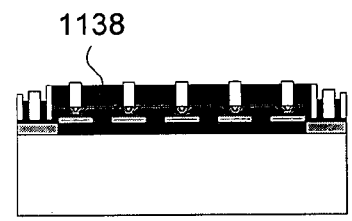
Figure 42P:
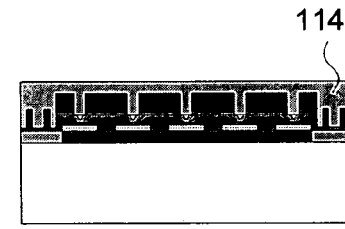
Figure 42Q:

FIGS. 42A-42Q depict schematic side views of various states in an example of a process according to a thirty-fifth embodiment where alignment targets are formed by a structural material (e.g. nickel) background which is overplated with a shallow layer of sacrificial material (e.g. copper).

FIG. 42A depicts the state of the process after a substrate 1102 (e.g. alumina) is provided and plating tape 1104 is located thereon where a Ni background is to be defined.

FIG. 42B depicts the state of the process after blanket plating of sacrificial material (e.g. Cu) is applied as a release layer 1106.

FIG. 42C depicts the state of the process after removal of the plating tape, after blanket deposition of nickel, and planarization has occurred. In some alternative embodiments, the sacrificial material may have been selectively applied within openings in a masking material, the masking material may have been removed and structural material then plated.

FIG. 42D depicts the state of the process after spinning on a resist 1112 and roughly aligning a tips mask 1116.

FIG. 42E depicts the state of the process after expose and development of the photoresist and removal of the mask 1116.

FIG. 42F depicts the state of the process after a shallow plating of sacrificial material 1120 (e.g. about 0.5 microns of Cu) has occurred to form images of alignment targets 1118.

FIG. 42G depicts the state of the process after taping over the targets using a non-outgassing tape 1122.

FIG. 42H depicts the state of the process after depositing a sacrificial material which mushrooms over photoresist pads to define molds for probes that will be formed.

FIG. 42I depicts the state of the process after sputtering of an adhesion layer and a sacrificial seed layer combination 1124 (e.g. Ti—W and Cu).

FIG. 42J depicts the state of the process after blanket plating of a structural material (e.g. Ni or NiCo).

FIG. 42K depicts the state of the process after removal of tape occurs and resist over or around the targets is stripped.

FIG. 42L depicts the state of the process after a planarization of the deposited materials occurs to create isolated probe tips of desired configuration.

FIG. 42M depicts the state of the process after spinning on a resist 1134, aligning a probe mask 1132 to the same targets 1118 used earlier.

FIG. 42N depicts the state of the process after exposing the resist 1134 using masking 1132 and after development of the resist.

FIG. 42O depicts the state of the process after sacrificial material 1138 (e.g. copper) is plated into openings in the resist.

FIG. 42P depicts the state of the process after blanket plating structural material 1142 (e.g. Ni).

FIG. 42Q depicts the state of the process after planarization of the deposited materials occurs resulting in a planar surface having alignment marks and capable of receiving additional layers of material, e.g. layers of structural and sacrificial materials from which the main bodies of probes will be formed.

In alternative embodiments other techniques may be used to get desired probe tip configurations. For example, it may be possible to get undercut photoresists by using a shadowed or grey scaled photomask to expose the photoresist which upon development will yield a sloped surface.

In some embodiments probe tips may be made from the same material as the probe elements themselves (e.g. Ni or Ni—P) while in other embodiments probe tips may be formed from one or more different materials (e.g. palladium (Pd), gold (Au), rhodium (Rh), or rhenium) or coating on the probe tips may be formed from these other materials.

Some embodiments may employ diffusion bonding or the like to enhance adhesion between successive layers of material. Various teachings concerning the use of diffusion bonding in electrochemical fabrication process is set forth in U.S. Patent Application No. 60/534,204 filed Dec. 31, 2003 by Cohen et al. which is entitled "Method for Fabricating Three-Dimensional Structures Including Surface Treatment of a First Material in Preparation for Deposition of a Second Material" and which is hereby incorporated herein by reference as if set forth in full.

Further teaching about microprobes and electrochemical fabrication techniques are set forth in a number of U.S. Patent Applications which are filed on Dec. 31, 2003 herewith. These Filings include: (1) U.S. Patent Application No. 60/533,933 by Arat et al. and which is entitled "Electrochemically Fabricated Microprobes"; (2) U.S. Patent Application No. 60/533,947 by Kumar et al. and which is entitled "Probe Arrays and Method for Making"; (3) U.S. Patent Application No. 60/533,948 by Cohen et al. and which is entitled "Electrochemical Fabrication Method for Co-Fabricating Probes and Space Transformers"; and (4) U.S. Patent Application No. 60/533,897 by Cohen et al. and which is entitled "Electrochemical Fabrication Process for Forming Multilayer Multimaterial Microprobe structures". These patent filings are each hereby incorporated herein by reference as if set forth in full herein.

Further teachings about planarizing layers and setting layers thicknesses and the like are set forth in the following U.S. Patent Applications: (1) U.S. Patent Application No. 60/534,159 filed Dec. 31, 2003 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 filed Dec. 31, 2003 by Cohen et al. and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

Additional teachings concerning the formation of structures on dielectric substrates and/or the formation of structures that incorporate dielectric materials into the formation process and possibility into the final structures as formed are set forth in a number of patent applications. The first of these filings is U.S. Patent Application No. 60/534,184, filed Dec. 31, 2003 which is entitled "Electrochemical Fabrication Methods Incorporating Dielectric Materials and/or Using Dielectric Substrates". The second of these filings is U.S. Patent Application No. 60/533,932, filed Dec. 31, 2003 which is entitled "Electrochemical Fabrication Methods Using Dielectric Substrates". The third of these filings is U.S. Patent Application No. 60/534,157, filed Dec. 31, 2003 which is entitled "Electrochemical Fabrication Methods Incorporating Dielectric Materials". The fourth of these filings is U.S. Patent Application No. 60/533,891, filed Dec. 31, 2003 which is entitled "Methods for Electrochemically Fabricating Structures Incorporating Dielectric Sheets and/or Seed layers That Are Partially Removed Via Planarization". A fifth such filing is U.S. Patent Application No. 60/533,895, filed Dec. 31, 2003 which is entitled "Electrochemical Fabrication Method for Producing Multi-layer Three-Dimensional Structures on a Porous Dielectric" These patent filings are each hereby incorporated herein by reference as if set forth in full herein.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use selective deposition processes or blanket deposition processes on some layers that are not electrodeposition processes. Some embodiments may use nickel as a structural material while other embodiments may use different materials. Some embodiments may use copper as the structural material with or without a sacrificial material. Some embodiments may remove a sacrificial material while other embodiments may not. Some embodiments may employ mask based selective etching operations in conjunction with blanket deposition operations. Some embodiments may form structures on a layer-by-layer base but deviate from a strict planar layer on planar layer build up process in favor of a process that interlacing material between the layers. Such alternating build processes are disclosed in U.S. application Ser. No. 10/434,519, filed on May 7, 2003, entitled Methods of and Apparatus for Electrochemically Fabricating Structures Via Interlaced Layers or Via Selective Etching and Filling of Voids which is herein incorporated by reference as if set forth in full.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A method for creating a contact structure, comprising:
   forming a contact tip having a desired configuration; and
   forming compliant probe structure electrochemically,
      wherein the compliant probe structure is formed on the contact tip or wherein the compliant probe structure and contact tip are bonded to one another, and
   wherein the contact tip has a shape and wherein the shape is derived at least in part from the mushrooming of an electrodeposited sacrificial material over a dielectric material.

2. The method of claim 1 wherein the compliant probe structure is formed on the contact tip.

3. The method of claim 1 wherein the contact tip is bonded to the compliant probe.

4. A method for creating a contact structure, comprising:
   forming a contact tip having a desired configuration; and
   forming compliant probe structure electrochemically,
      wherein the compliant probe structure is formed on the contact tip or wherein the compliant probe structure and contact tip are bonded to one another, and
   wherein the contact tip has a shape and wherein the shape is derived at least in part via isotropic etching of a tip material around etching shields.

5. The method of claim 4 wherein the compliant probe structure is formed on the contact tip.

6. The method of claim 4 wherein the contact tip is adhered to the compliant probe.

* * * * *